US010586015B2

(12) United States Patent
Gardner

(10) Patent No.: US 10,586,015 B2
(45) Date of Patent: *Mar. 10, 2020

(54) SYSTEMS AND METHODS FOR PROCESS DESIGN AND ANALYSIS

(71) Applicant: Riffyn, Inc., Oakland, CA (US)

(72) Inventor: Timothy S. Gardner, Oakland, CA (US)

(73) Assignee: Riffyn, Inc., Oakland, CA (US)

( * ) Notice: Subject to any disclaimer, the term of this patent is extended or adjusted under 35 U.S.C. 154(b) by 371 days.

This patent is subject to a terminal disclaimer.

(21) Appl. No.: 15/690,134

(22) Filed: Aug. 29, 2017

(65) Prior Publication Data

US 2017/0364618 A1  Dec. 21, 2017

Related U.S. Application Data

(63) Continuation-in-part of application No. 14/801,650, filed on Jul. 16, 2015, now Pat. No. 9,910,936.

(Continued)

(51) Int. Cl.
*G06F 17/50* (2006.01)
*G06F 16/732* (2019.01)

(52) U.S. Cl.
CPC ........ *G06F 17/509* (2013.01); *G06F 16/7335* (2019.01); *G06F 17/50* (2013.01)

(58) Field of Classification Search
CPC ..... G06F 17/509; G06F 17/50; G06F 16/7335
(Continued)

(56) References Cited

U.S. PATENT DOCUMENTS 5,343,388 A   8/1994  Wedelin
5,691,895 A  11/1997  Kurtzberg et al.
(Continued)

FOREIGN PATENT DOCUMENTS

EP   1784695 B1   7/2007

OTHER PUBLICATIONS

Dong0Hyuk Im, Nansu Zong, Eung-Hee Kim, Seaokchan Yun, Hong-Gee Kim, "AHypergraph-based Storage Policy for RDF Version Management System", ICUMC'12, Feb. 20-22, 2012, Kuala Lumpur, Malaysia, ACM 978-1-4503-1172-4, 5 pages.*

(Continued)

*Primary Examiner* — Dwin M Craig
(74) *Attorney, Agent, or Firm* — Morgan, Lewis & Bockius LLP

(57) ABSTRACT

Systems and methods for process design and analysis of processes that result in products or analytical information are provided. A hypergraph data store is maintained and comprises versions of each process. A version comprises a hypergraph with nodes, for stages of the process, and edges. Stages have parameterized resource inputs associated with stage input properties, and input specification limits. Stages have resource outputs with output properties and output specification limits. Edges link the outputs of nodes to the inputs of other nodes. A run data store is maintained with a plurality of process runs, each run identifying a process version, values for the inputs of nodes in the corresponding hypergraph, their input properties, resource outputs of the nodes, and obtained values of output properties of the resource outputs. When a query identifies one or more inputs and/or outputs present in the run data store, they are formatted for analysis.

84 Claims, 40 Drawing Sheets

Related U.S. Application Data

(60) Provisional application No. 62/032,217, filed on Aug. 1, 2014, provisional application No. 62/184,556, filed on Jun. 25, 2015.

(58) Field of Classification Search
USPC .......................................................... 703/1
See application file for complete search history.

(56) References Cited

U.S. PATENT DOCUMENTS

| | | | |
|---|---|---|---|
| 5,784,286 | A | 7/1998 | Hirose et al. |
| 5,970,490 | A | 10/1999 | Morgenstern |
| 6,243,614 | B1 | 6/2001 | Anderson |
| 9,910,936 | B2 | 3/2018 | Gardner |
| 2001/0032029 | A1 | 10/2001 | Kauffman |
| 2004/0064465 | A1* | 4/2004 | Yadav .................... H01L 22/20 |
| 2004/0119752 | A1 | 6/2004 | Beringer et al. |
| 2005/0171746 | A1 | 8/2005 | Thalhammer-Reyero |
| 2005/0197875 | A1 | 9/2005 | Kauffman |
| 2008/0275585 | A1 | 11/2008 | Lin et al. |
| 2009/0089031 | A1 | 4/2009 | Sturrock et al. |
| 2010/0318963 | A1 | 12/2010 | Kajiya |
| 2011/0022192 | A1 | 1/2011 | Plache et al. |
| 2011/0066585 | A1 | 3/2011 | Subrahmanyam et al. |
| 2012/0030647 | A1 | 2/2012 | Wang et al. |
| 2012/0036249 | A1* | 2/2012 | Chandrasekaran ... G06F 9/5088 709/224 |
| 2014/0214798 | A1 | 7/2014 | Nica et al. |
| 2015/0039651 | A1 | 2/2015 | Kinsley et al. |
| 2015/0197875 | A1 | 7/2015 | Kim et al. |
| 2016/0034606 | A1 | 2/2016 | Gardner |

OTHER PUBLICATIONS

Barlow and Irony, 1992, "Foundations of statistical quality control" in Ghosh, M. & Pathak, P.K. (eds.) *Current Issues in Statistical Inference: Essays in Honor of D. Basu*, Hayward, California, Institute of Mathematical Statistics, pp. 99-112.

Gardner, 2014, "A swan in the making," Science, Retrieved from the Internet: http://www.sciencemag.org, accessed Aug. 21, 2014.

Saeys et al., 2007, "A review of feature selection techniques in bioinformatics," Bioinformatics 23, 2507-2517.

Schiettecat, Filip; SIMATIC IT R&D Suite; Driving Innovation Efficiency (PowerPoint); Apr. 2009.

Tibshirani, 1996, "Regression and Shrinkage and Selection via the Lasso," J. R. Statist. Soc B, pp. 267-288.

International Search Report for International Patent Application No. PCT/US2015/042999, dated Nov. 25, 2015, 14 pages.

International Search Report for International Patent Application No. PCT/US2016/039227, dated Oct. 27, 2016, 4 pages.

International Search Report for International Patent Application No. PCT/US2016/064830, dated Apr. 6, 2017, 13 pages.

Manufacturing Information Portal (MIP) Product Data Sheet; http://www2.emersonprocess.com/siteadmincenter/PM%20Syncade%20Documents/PDS_Syncade_Portal.pdf; Dec. 2008.

Process Miner [PM] Syncade Product Data Sheet; http://www2.emersonprocess.com/siteadmincenter/PM%20Syncade%20Documents/PDS_Syncade_PM.pdf; Sep. 2013.

Recipe Authoring (RA) Product Data Sheet; http://www2.emersonprocess.com/siteadmincenter/PM%20Syncade%20Documents/PDS_Syncade_RA.pdf; Feb. 2014.

Robust and flexible processes with paperless manufacturing; http://www.industry.siemens.com/verticals/global/en/pharma-industries/Documents/neue-version/paperless/VRPH-B10002-00-7600_WS_Pharma_paperless_manufacturing_EN.pdf; 2015.

SIMATIC IT R&D Suite (Brochure); http://w3.siemens.com/mcms/mes/en/mes_suites/rdsuite/Documents/brochure_simaticit_rd_suite_en.pdf, last accessed Jan. 6, 2016.

SIMATIC IT R&D Suite (Flyer); http://w3.siemens.com/mcms/mes/en/mes_suites/rdsuite/Documents/Flyer_RnD.pdf.

SIMITIC IT Unilab: Your Next Generation LIMS; http://w3.siemens.com/mcms/mes/en/mescomponents/simaticitlims/Documents/brochure_simaticit_unilab_en.pdf; 2015.

Syncade™ Smart Operations Management Suite Product Data Sheet; http://www2.emersonprocess.com/siteadmincenter/PM%20Syncade%20Documents/PDS_Syncade_SmartOpsSte.pdf; Mar. 2010.

International Search Report for International Patent Application No. PCT/US2018/048179, dated Dec. 23, 2018, 9 pages.

Michelena, N.F. et al., "A hypergraph Framework for Optimal Model-Based Decomposition of Design Problems", Computational Optimization and Applications 8 (1997): 173-196. Retrieved from the Internet: <https://core.ac.uk/download/pdf/22876372.pdf>.

Paolo, F.B. et al., "Hypercharts: Extended Statecharts to Support Hypermedia Specification," IEEE Transactions on Software Engineering, vol. 25, No. 1, 1999, pp. 33-49.

Campagna, D., "Product and Production Process Modeling and Configuration," Universia Degli Studi Perugia, Dissertation, Feb. 2012.

Kumar, A. et al., "Design and management of flexible process variants using templates and rules," Computers in Industry, Jan. 20, 2012, vol. 63, pp. 112-130.

U.S. Appl. No. 15/690,128, filed Aug. 29, 2017.
U.S. Appl. No. 15/739,561, filed Dec. 22, 2017.
U.S. Appl. No. 15/774,399, filed May 8, 2018.
U.S. Appl. No. 14/801,650, filed Jul. 16, 2017.

* cited by examiner

| Process version 1-1 | 208-1-1 |
| --- | --- |

| Hypergraph 1-1 | 302-1-1 |
| Edge 1-1-1 | 304-1-1-1 |
| Process stage label for edge 1-1-1 | 306-1-1-1 |
| Set of parameterized resource inputs for node 1-1-1 | 308-1-1-1 |
| Parameterized resource input 1-1-1-1 | 310-1-1-1-1 |
| Input property 1-1-1-1-1 | 312-1-1-1-1 |
| Input specification limit 1-1-1-1-1 | 314-1-1-1-1 |
| Input property 1-1-1-1-2 | 312-1-1-1-2 |
| Input specification limit 1-1-1-1-2 | 314-1-1-1-2 |
| ⋮ | |
| Input property 1-1-1-1-W | 312-1-1-1-W |
| Input specification limit 1-1-1-1-W | 314-1-1-1-W |
| Parameterized resource input 1-1-1-2 | 310-1-1-1-2 |
| ⋮ | |
| Parameterized resource input 1-1-1-Z | 310-1-1-1-Z |
| Set of parameterized resource outputs for node 1-1-1 | 314-1-1-1 |
| Parameterized resource output 1-1-1-1 | 316-1-1-1-1 |
| Output property 1-1-1-1-1 | 318-1-1-1-1-1 |
| Output specification limit 1-1-1-1-1 | 320-1-1-1-1-1 |
| Output property 1-1-1-1-2 | 318-1-1-1-1-2 |
| Output specification limit 1-1-1-1-2 | 320-1-1-1-1-2 |
| ⋮ | |
| Output property 1-1-1-1-W | 318-1-1-1-1-W |
| Ouput specification limit 1-1-1-1-W | 320-1-1-1-1-W |
| Parameterized resource output 1-1-1-2 | 316-1-1-1-2 |
| ⋮ | |
| Parameterized resource output 1-1-1-Z | 316-1-1-1-Z |
| Edge 1-1-2 | 304-1-1-2 |
| ⋮ | |
| Edge 1-1-Q | 304-1-1-Q |
| Node 1-1-1 | 322-1-1-1 |
| Source node | 324-1-1-1 |
| Destination node 1 | 326-1-1-1-1 |
| ⋮ | |
| Destination node N | 326-1-1-1-N |
| ⋮ | |
| Node 1-1-K | 322-1-1-K |

Maintain a hypergraph data store 204 comprising, for each respective process 206 of one or more processes, a respective plurality of versions of the respective process. Each respective version 208 comprises a hypergraph 302 comprises a plurality of nodes 322 connected by edges 304 in a plurality of edges.

Each respective edge in the plurality of edges comprises a process stage label representing a respective stage in the corresponding process, and is associated with:
    (i) a set of parameterized resource inputs to the respective stage in the corresponding process, where at least one parameterized resource input in the set of parameterized resource inputs is associated with one or more input properties, the one or more input properties including an input specification limit, and
    (ii) a set of parameterized resource outputs to the respective stage in the corresponding process, where at least one parameterized resource output in the set of parameterized resource outputs is associated with one or more output properties, the one or more output properties including a corresponding output specification limit.

Each respective node in the plurality of nodes specifies that the set of parameterized resource outputs of an edge in the plurality of edges is included in the set of parameterized resource inputs of at least one other edge in the plurality of edges.

604

A first version and a second version in a respective plurality of versions for a process in the one or more processes differ from each other in a number of nodes, a number of edges, a process stage label of an edge, a parameterized resource input in a set of parameterized resource inputs, or a parameterized resource output in a set of parameterized resource outputs.

606

The set of parameterized resource inputs for an edge in the plurality of edges of a hypergraph for a process version in the respective plurality of process versions comprises a first and second parameterized resource input, the first parameterized resource input specifying a first resource and is associated with a first input property, and the second parameterized resource input specifying a second resource and is associated with a second input property.

608

The first input property is a viscosity value, a purity value, composition value, a temperature value, a weight value, a mass value, a volume value, or a batch identifier of the first resource.

610

The first resource is a single resource or a composite resource.

- 612 — The set of parameterized resource inputs for a first edge in the plurality of edges of a hypergraph of a process version in the respective plurality of process versions comprises a first parameterized resource input, the first parameterized resource input specifying a process condition associated with the corresponding stage of the process associated with the first edge.

- 614 — The process condition comprises a temperature, an exposure time, a mixing time, a type of equipment, or a batch identifier.

- 616 — The corresponding output specification limit comprises an upper limit and a lower limit for the corresponding parameterized resource output.

- 618 — The corresponding output specification limit comprises an enumerated list of allowable types.

- 620 — The one or more processes is a plurality of processes and a first process in the plurality of processes results in a first product and a second process in the plurality of processes results in a second product. The first product is different than the second product.

- 622 — Maintain a run data store 210. The run data store 210 comprises a plurality of process runs. Each process run comprises (i) an identification of a version in the plurality of versions for a process in the one or more processes, (ii) values for the respective set of parameterized resource inputs of an edge in the hypergraph of the respective version and their associated input properties, (iii) the respective set of parameterized resource outputs of the first edge, and (iv) obtained values of at least one output property of a parameterized resource output in the respective set of parameterized resource outputs of the first edge in the respect set of parameterized resource outputs of the first edge in the hypergraph of the respective version.

- 624 — The run data store further comprises a genealogical graph 420 showing a relationship between (i) versions of a single process in the plurality of versions of a process or (ii) versions of two or more processes in the respective plurality of versions of two or more processes.

640 — The statistics module further provides suggested values for the one or more second parameterized inputs for an additional process run of a first process in the one or more processes, not present in the run data store, based on a prediction that the suggested values for the one or more second parameterized inputs will alter a numerical attribute of the one or more process runs.

642 — The numerical attribute is a reduction in variance in the one or more first parameterized inputs.

644 — The query identifies one or more third parameterized inputs and/or parameterized outputs present in runs in the run data store 210, and the numerical attribute is a confidence in a correlation between the first parameterized inputs and/or outputs and the third parameterized inputs and/or outputs.

646 — The one or more processes is a plurality of processes and the query further identifies a single process in the plurality of processes whose process runs are to be formatted by the statistics module.

648 — The query further identifies a subset of process runs in the one or more processes.

650 — The statistics module further identifies a correlation between (i) a first set comprising one or more process runs in the run data store 210 and (ii) a second set comprising one or more process runs in the run data store, where process runs in the second set are not in the first set.

652 — The correlation is computed across a plurality of parameterized inputs and/or parameterized outputs present in the first and second sets.

Maintain a hypergraph data store 204 comprising, for each respective process 206 of one or more processes, a respective plurality of versions of the respective process. Each respective version 208 comprises a hypergraph 302 comprising a plurality of nodes 322 connected by edges 304 in a plurality of edges.

Each respective edge in the plurality of edges comprises a process stage label representing a respective stage in the corresponding process, and is associated with one or more inputs and at least one output.

Each respective node in the plurality of edges is associated with a corresponding set of parameterized resources and the corresponding set of parameterized resources form a first output of the at least one output of a first edge in the plurality of edges and also forms a first input of the one or more inputs of at least one other edge in the plurality of edges. At least one parameterized resource in the set of parameterized resources is associated with one or more properties, the one or more properties including one or more corresponding specification limits.

2704

A first version and a second version in a respective plurality of versions for a process in the one or more processes differ from each other in a number of nodes, a number of edges, a process stage label of an edge, or a parameterized resource in a set of parameterized resources.

2706

The set of parameterized resources for a node in the plurality of nodes of a hypergraph for a process version in the respective plurality of process versions comprises a first and second parameterized resource, the first parameterized resource specifying a first resource and is associated with a first property, and the second parameterized resource specifying a second resource and is associated with a second property.

2708

The first property is a viscosity value, a purity value, composition value, a temperature value, a weight value, a mass value, a volume value, or a batch identifier of the first resource.

2710

The first resource is a single resource or a composite resource.

2740 — The statistics module further provides suggested values for the one or more second parameterized resources for an additional process run of a first process in the one or more processes, not present in the run data store, based on a prediction that the suggested values for the one or more second resources will alter a numerical attribute of the one or more process runs.

2742 — The numerical attribute is a reduction in variance in the one or more first parameterized resources.

2744 — The query identifies one or more third parameterized resources present in runs in the run data store 210, and the numerical attribute is a confidence in a correlation between the one or more first parameterized resources and the one or more third parameterized resources.

2746 — The one or more processes is a plurality of processes and the query further identifies a single process in the plurality of processes whose process runs are to be formatted by the statistics module.

2748 — The query further identifies a subset of process runs in the one or more processes.

2750 — The statistics module further identifies a correlation between (i) a first set comprising one or more process runs in the run data store 210 and (ii) a second set comprising one or more process runs in the run data store, where process runs in the second set are not in the first set.

2752 — The correlation is computed across a plurality of parameterized resources present in the first and second sets.

Fig. 27D

```
┌─────────────────────────────────────────────────────────────┐ ╭─ 2802
│ Maintain a hypergraph data store 204 comprising, for each respective process 206 │
│ of one or more processes, a respective plurality of versions of the respective │
│ process. Each respective version 208 comprises a hypergraph 302 comprising a │
│ plurality of edges 304 connected by nodes 322 in a plurality of nodes. Each │
│ respective edge in the plurality of nodes comprises a process stage label │
│ representing a respective stage in the corresponding process, and is associated with │
│ one or more inputs and at least one output. Each respective node in the plurality of │
│ nodes forms an output of the at least one output of a first edge in the plurality of │
│ edges and also forms an input of the one or more inputs of at least one other edge │
│ in the plurality of nodes. │
└─────────────────────────────────────────────────────────────┘
                              ▼                                    ╭─ 2804
┌─────────────────────────────────────────────────────────────┐
│ Maintain a run data store 210. The run data store 210 comprises a plurality of │
│ process runs. Each process run comprises an identification of a version in the │
│ plurality of versions for a process in the one or more processes.                │
│                                                               ╭─ 2806
│   ┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐
│   │ Associate each respective node in the plurality of nodes with a           │
│   │ corresponding set of parameterized resources. The corresponding set of    │
│   │ parameterized resources form a first output of the at least one output of a│
│   │ first edge in the plurality of edges and also forms a first input of the one│
│   │ or more inputs of at least one other edge in the plurality of edges. At   │
│   │ least one parameterized resource in the set of parameterized resources is │
│   │ associated with one or more properties. The one or more properties       │
│   │ include one or more corresponding specification limits. The run data     │
│   │ store further comprises, for each respective process run in the plurality │
│   │ of process runs, values for the respective set of parameterized resources │
│   │ corresponding to at least one of the first output of the first edge or the│
│   │ first input of the at least one other edge associated with a first node in│
│   │ the hypergraph of the respective version and their associated one or     │
│   │ more properties.                                                    ╭─ 2808
│   │   ┌ ─ ─ ─ ─ ─ ─ ─ ─ ─ ─ ─ ─ ─ ─ ─ ─ ─ ─ ─ ─ ─ ─ ─ ─ ─ ┐ │
│   │   │ A first version and a second version in a respective plurality of │ │
│   │   │ versions for a process in the one or more processes differ from each│ │
│   │   │ other in a number of nodes or edges, a process stage label of an edge,│ │
│   │   │ or a parameterized resource in a set of parameterized resources.  │ │
│   │   └ ─ ─ ─ ─ ─ ─ ─ ─ ─ ─ ─ ─ ─ ─ ─ ─ ─ ─ ─ ─ ─ ─ ─ ─ ─ ┘ │
│   │                                                            ╭─ 2810
│   │   ┌ ─ ─ ─ ─ ─ ─ ─ ─ ─ ─ ─ ─ ─ ─ ─ ─ ─ ─ ─ ─ ─ ─ ─ ─ ─ ┐ │
│   │   │ The set of parameterized resources for a node in the plurality of │ │
│   │   │ nodes of a hypergraph for a process version in the respective plurality│ │
│   │   │ of process versions comprises a first and second parameterized    │ │
│   │   │ resource, the first parameterized resource specifying a first resource│ │
│   │   │ and is associated with a first property, and the second parameterized│ │
│   │   │ resource specifying a second resource and is associated with a second│ │
│   │   │ property.                                                      │ │
│   │   │                                                           ╭─ 2812
│   │   │   ┌ ─ ─ ─ ─ ─ ─ ─ ─ ─ ─ ─ ─ ─ ─ ─ ─ ─ ─ ─ ─ ─ ─ ┐ │ │
│   │   │   │ The first property is a viscosity value, a purity value, │ │ │
│   │   │   │ composition value, a temperature value, a weight value, a mass│ │ │
│   │   │   │ value, a volume value, or a batch identifier of the first resource.│ │ │
│   │   │   └ ─ ─ ─ ─ ─ ─ ─ ─ ─ ─ ─ ─ ─ ─ ─ ─ ─ ─ ─ ─ ─ ─ ┘ │ │
│   │   │                                                      ╭─ 2814
│   │   │   ┌ ─ ─ ─ ─ ─ ─ ─ ─ ─ ─ ─ ─ ─ ─ ─ ─ ─ ─ ─ ─ ─ ─ ┐ │ │
│   │   │   │ The first resource is a single resource or a composite resource. │ │ │
│   │   │   └ ─ ─ ─ ─ ─ ─ ─ ─ ─ ─ ─ ─ ─ ─ ─ ─ ─ ─ ─ ─ ─ ─ ┘ │ │
│   │   └ ─ ─ ─ ─ ─ ─ ─ ─ ─ ─ ─ ─ ─ ─ ─ ─ ─ ─ ─ ─ ─ ─ ─ ─ ─ ┘ │
│   └ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘
└─────────────────────────────────────────────────────────────┘
```

2816
The set of parameterized resources for a first node in the plurality of nodes of a hypergraph of a process version in the respective plurality of process versions comprises a first parameterized resource, the first parameterized resource specifying a process condition.

2818
The process condition comprises a temperature, an exposure time, a mixing time, a type of equipment, a batch identifier.

2820
The corresponding specification limit comprises an upper limit and a lower limit for the corresponding parameterized resource.

2822
The corresponding output specification limit comprises an enumerated list of allowable types.

2824
The one or more processes is a plurality of processes and a first process in the plurality of processes results in a first product and a second process in the plurality of processes results in a second product, where the first product is different than the second product.

2826
The run data store further comprises a genealogical graph 420 showing a relationship between (i) versions of a single process in the plurality of versions of a process or (ii) versions of two or more processes in the respective plurality of versions of two or more processes.

The statistics module further provides suggested values for the one or more second parameterized resources for an additional process run of a first process in the one or more processes, not present in the run data store, based on a prediction that the suggested values for the one or more second resources will alter a numerical attribute of the one or more process runs.

— 2842

The numerical attribute is a reduction in variance in the one or more first parameterized resources exhibited across the plurality of runs.

— 2844

The query identifies one or more third parameterized resources present in runs in the run data store 210, and the numerical attribute is a confidence in a correlation between the one or more first parameterized resources and the one or more third parameterized resources.

— 2846

The one or more processes is a plurality of processes and the query further identifies a single process in the plurality of processes whose process runs are to be formatted by the statistics module.

— 2848

The query further identifies a subset of process runs in the one or more processes.

— 2850

The statistics module further identifies a correlation between (i) a first set comprising one or more process runs in the run data store 210 and (ii) a second set comprising one or more process runs in the run data store, where process runs in the second set are not in the first set.

— 2752

The correlation is computed across a plurality of parameterized resources present in the first and second sets.

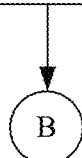

Fig. 28D

SYSTEMS AND METHODS FOR PROCESS DESIGN AND ANALYSIS

CROSS REFERENCE TO RELATED APPLICATIONS

This application claims priority to U.S. patent application Ser. No. 14/801,650, filed Jul. 16, 2015, entitled "Systems and Methods for Process Design and Analysis," which claims priority to U.S. Provisional Application No. 62/032,217, filed Aug. 1, 2014, entitled "Computer-Implemented Method for Recording and Analyzing Scientific Test Procedures and Data," and U.S. Provisional Application No. 62/184,556, filed Jun. 25, 2015, entitled "Computer-Implemented Method for Recording and Analyzing Scientific Test Procedures and Data," each of which is hereby incorporated by reference.

TECHNICAL FIELD

The present disclosure relates generally to systems and methods for process design and analysis of processes that result in analytical information or products.

BACKGROUND

Multi-stage processes are relied upon in the research and manufacture of a wide range of products including biologics, pharmaceuticals, mechanical devices, electrical devices, and food, to name a few examples. Unfortunately, such processes typically have many sources of variation. While most of these sources are minor and may be ignored, the dominant sources of variation may adversely affect the efficiency or even viability of such processes. If identified, however, resources to remove these dominant sources of variation can be engaged and, potentially, such dominant sources of variation can be removed, minimized or contained. Once these dominant sources of variation are addressed, a process may be considered stabilized. When a process is stable, its variation should remain within a known set of limits. That is, at least, until another assignable source of variation occurs. For example, a laundry soap packaging line may be designed to fill each laundry soap box with fourteen ounces of laundry soap. Some boxes will have slightly more than fourteen ounces, and some will have slightly less. When the package weights are measured, the data will demonstrate a distribution of net weights. If the production process, its inputs, or its environment (for example, the machines on the line) change, the distribution of the data will change. For example, as the cams and pulleys of the machinery wear, the laundry soap filling machine may put more than the specified amount of soap into each box. Although this might benefit the customer, from the manufacturer's point of view, this is wasteful and increases the cost of production. If the manufacturer finds the change and its source in a timely manner, the change can be corrected (for example, the cams and pulleys replaced).

While identification of variation of processes is nice in theory, in practice there are many barriers to finding such variation. Most processes combine many different functional components each with their own data forms and types of errors. For instance, a process for manufacturing a synthetic compound using a cell culture combines chemical components, biological components, fermentation components, and industrial equipment components. Each of these components involves different units of quantification, measurement, and error. As such, the rate-limiting step for developing and stabilizing processes is not development of the algorithms that are used in such processes; it is the acquisition and contextualizing of the data in such processes. This requires data aggregation and reproducibility assessment across many disparate systems and functionalities so that scientific reasoning is based on reproducible data rather than on artifacts of noise and uncertainty. Conventional systems fail to deliver adequate capabilities for such analysis. They focus on storing files and data without providing the structure, context or flexibility to enable real-time analytics and feedback to the user.

For instance, electronic lab notebooks (ELNs) are basically "paper on glass" and have inadequate ability to streamline longitudinal analytics across studies. Lab information management systems (LIMS) focus on sample data collection, but don't provide the protocol or study context to facilitate analytics, nor the flexibility to adapt to changing workflows "on-the-fly" and the many disparate functionalities that are often found in processes. Thus the relationship between protocol and outcome remains unclear or even inaccessible and information systems become "dead" archives of old work mandated by institutional policies rather than assets that drive process stabilization.

As a result, billions of dollars are lost each year on material and life science research that are not stabilized and thus have unsatisfactory reproducibility rates. Moreover, the incidence of multi-million dollar failures during process transfer to manufacturing remains high. Thus, given the above background, what is needed in the art are improved systems and methods for process design and analysis of processes that result in their stabilization.

SUMMARY

The disclosed embodiments address the need in the art for improved systems and methods for stabilization of processes that result in analytical information or products. As used herein the term "product" refers to, for example, tangible products such as materials, compositions, ingredients, medicines, bulk materials, and the like; and the term "analytical information" refers to, for example, categorical or quantitative data describing measurements of materials, equipment, or process settings. The disclosed systems and methods advantageously and uniquely reduce experimental noise and collaborative friction from research and development to manufacturing. The disclosed systems and methods facilitate visualization of data against evolving maps of experimental processes to highlight quality issues and opportunities, expose trends and causal relationships across time, experiments and teams, stimulate collaborative improvement of experimental and process quality, and stabilize processes.

The disclosed systems and methods maintain a hypergraph data store which has one or more versions on one or more processes. A version of a process comprises a hypergraph with nodes, for stages of the process, and edges. Stages have parameterized resource inputs associated with stage input properties, and input specification limits. Stages have resource outputs with output properties and output specification limits. Edges link the outputs of nodes to the inputs of other nodes, representing the intended or actual transfer of resources from output to input.

The disclosed systems and methods also maintain a run data store having a plurality of process runs. Each process run identifies a process version, values for the inputs of a first node in the hypergraph of the corresponding process, their input properties, the resource outputs of the first node, and obtained values of output properties of the resource outputs. When a query identifies one or more inputs and/or outputs present in the run data store, they are formatted for analysis.

Now that a general summary of the disclosed systems and methods has been outlined, more specific embodiments of the disclosed systems and methods will be presented.

Embodiment 1—Steps (Edges) Connecting Resources (Nodes)

One aspect of the present disclosure provides a non-transitory computer readable storage medium for providing process design and analysis of one or more processes. Each process in the one or more processes results in a respective product or analytical information. The non-transitory computer readable storage medium stores instructions, which when executed by a first device, cause the first device to maintain a hypergraph data store comprising, for each respective process in the one or more processes, a respective plurality of versions of the respective process. Each respective version comprises a hypergraph comprising a plurality of nodes connected by edges in a plurality of edges. Each respective edge in the plurality of edges comprises a process stage label representing a respective stage in the corresponding process, and is associated with (i) a set of parameterized resource inputs to the respective stage in the corresponding process, wherein at least one parameterized resource input in the set of parameterized resource inputs is associated with one or more input properties, the one or more input properties including one or more input specification limits, and (ii) a set of parameterized resource outputs to the respective stage in the corresponding process, wherein at least one parameterized resource output in the set of parameterized resource outputs is associated with one or more output properties, the one or more output properties including one or more corresponding output specification limits. Each respective node in the plurality of nodes specifies that the set of parameterized resource outputs of an edge in the plurality of nodes is included in the set of parameterized resource inputs of at least one other edge in the plurality of edges.

The first device further maintains a run data store. The run data store comprises a plurality of process runs. Each process run comprises (i) an identification of a version in the plurality of versions for a process in the one or more processes, (ii) values for the respective set of parameterized resource inputs of a first edge in the hypergraph of the respective version and their associated input properties, (iii) the respective set of parameterized resource outputs of the first edge in the hypergraph of the respective version, and (iv) obtained values of at least one output property of a parameterized resource output in the respective set of parameterized resource outputs of the first edge in the hypergraph of the respective version.

The first device further maintains a statistics module that, responsive to receiving a query that identifies one or more first parameterized resource inputs and/or parameterized resource outputs present in one or more process runs in the run data store, formats the one or more first parameterized resource inputs and/or parameterized resource outputs for analysis.

In some embodiments, the query further identifies one or more second parameterized resource inputs and/or parameterized resource outputs present in one or more runs in the run data store. The instructions, which when executed by the first device, further cause the first device to: correlate the one or more first parameterized resource inputs and/or parameterized resource outputs and the one or more second parameterized resource inputs and/or parameterized resource outputs; and format, for presentation, a numerical measure of the correlation.

In some embodiments, the instructions, which when executed by the first device, further cause the first device to: export the one or more first parameterized resource inputs and/or parameterized resource outputs for analysis to a second device.

In some embodiments, the instructions, which when executed by the first device, further cause the first device to: maintain a process evaluation module that generates an alert in the form of a computer data transmission when an obtained value for an output property of a parameterized resource output in a set of parameterized resource outputs for a process run in the plurality of process runs is outside the output specification limit.

In some embodiments, a first version and a second version in a respective plurality of versions for a process in the one or more processes differ from each other in a number of nodes, a process stage label of an edge, a parameterized resource input in a set of parameterized resource inputs, or a parameterized resource output in a set of parameterized resource outputs.

In some embodiments, the query further identifies one or more second parameterized resource inputs and/or parameterized resource outputs present in one or more runs in the run data store. Further, the statistics module further identifies a correlation between (i) the one or more first parameterized resource inputs and/or parameterized resource outputs and (ii) the one or more second parameterized resource inputs and/or parameterized resource outputs present in one or more process runs in the run data store from among all the parameterized resource inputs and/or parameterized resource outputs present in the run data store using a multivariate analysis technique. In some embodiments, the multivariate analysis comprises a feature selection technique (e.g., least angle regression, stepwise regression, etc.)

In some embodiments, the statistics module further provides suggested values for the one or more second parameterized resource inputs for an additional process run of a first process in the one or more processes, not present in the run data store, based on a prediction that the suggested values for the one or more second parameterized resource inputs will alter a numerical attribute of the one or more process runs. In some such embodiments, the numerical attribute is a reduction in variance in the one or more first parameterized resource inputs. In some embodiments, the query further identifies one or more third parameterized resource inputs and/or parameterized resource outputs present in one or more runs in the run data store, and the numerical attribute is a confidence in a correlation between the one or more first parameterized resource inputs and/or parameterized resource outputs and the one or more third parameterized resource inputs and/or parameterized resource outputs.

In some embodiments, the one or more processes is a plurality of processes and the correlation is identified from process runs in a subset of the plurality of processes. In some embodiments, the one or more processes is a plurality of processes and the correlation is identified from process runs in a single process in the plurality of processes. In some embodiments, the one or more processes is a plurality of processes and the query further identifies a subset of the plurality of processes whose process runs are to be formatted by the statistics module.

In some embodiments, the one or more processes is a plurality of processes and the query further identifies a single process in the plurality of processes whose process runs are to be formatted by the statistics module.

In some embodiments, the query further identifies a subset of process runs in the one or more processes.

In some embodiments, the statistics module further identifies a correlation between (i) a first set comprising one or more process runs in the run data store and (ii) a second set comprising one or more process runs in the run data store, wherein process runs in the second set are not in the first set. In some such embodiments, the correlation is computed across a plurality of parameterized resource inputs and/or parameterized resource outputs present in the first and second sets.

In some embodiments, the set of parameterized resource inputs for an edge in the plurality of edges of a hypergraph for a process version in the respective plurality of process versions comprises a first and second parameterized resource input, the first parameterized resource input specifying a first resource and is associated with a first input property, and the second parameterized resource input specifying a second resource and is associated with a second input property, where the first input property is different than the second input property. In some such embodiments, the first input property is a viscosity value, a purity value, composition value, a temperature value, a weight value, a mass value, a volume value, or a batch identifier of the first resource. In some such embodiments, the first resource is a single resource or a composite resource.

In some embodiments, the set of parameterized resource inputs for a first edge in the plurality of nodes of a hypergraph of a process version in the respective plurality of process versions comprises a first parameterized resource input, and the first parameterized resource input specifies a process condition associated with the corresponding stage of the process associated with the first edge. In some such embodiments, the process condition comprises a temperature, an exposure time, a mixing time, a type of equipment, or a batch identifier.

In some embodiments, the instructions further cause the first device to execute a data driver for a respective process in the one or more processes, the data driver including: instructions for receiving a dataset for the respective process, instructions for parsing the dataset to thereby obtain (i) an identification of a process run in the run data store and (ii) output property values associated with the respective set of parameterized resource outputs of a first edge in the hypergraph of the respective process for the process run, and instructions for populating the output property values of parameterized resource outputs of the first edge in the run data store with the parsed values.

In some embodiments, the corresponding output specification limit comprises an upper limit and a lower limit for the corresponding parameterized resource output.

In some embodiments, the corresponding output specification limit comprises an enumerated list of allowable types.

In some embodiments, the one or more processes is a plurality of processes and a first process in the plurality of processes results in a first product and a second process in the plurality of processes results in a second product, where the first product is different than the second product.

In some embodiments, the run data store further comprises a genealogical graph showing a relationship between (i) versions of a single process in the plurality of versions of a process or (ii) versions of two or more processes in the respective plurality of versions of two or more processes.

Another aspect of the present disclosure provides a computer system, comprising: one or more processors, memory, and one or more programs stored in the memory for execution by the one or more processors. The one or more programs comprise instructions for maintaining a hypergraph data store comprising, for each respective process in a set of one or more processes, each process in the set of one or more processes resulting in a respective product or analytical information, a respective plurality of versions of the respective process. Each respective version comprises a hypergraph comprising a plurality of nodes connected by edges in a plurality of edges. Each respective edge in the plurality of edges comprising a process stage label representing a respective stage in the corresponding process, and associated with (i) a set of parameterized resource inputs to the respective stage in the corresponding process, where at least one parameterized resource input in the set of parameterized resource inputs is associated with one or more input properties, the one or more input properties including one or more input specification limits, and (ii) a set of parameterized resource outputs to the respective stage in the corresponding process, where at least one parameterized resource output in the set of parameterized resource outputs is associated with one or more output properties, the one or more output properties including one or more corresponding output specification limits. Each respective node in the plurality of nodes specifies that the set of parameterized resource outputs of an edge in the plurality of edges is included in the set of parameterized resource inputs of at least one other edge in the plurality of edges. A run data store is maintained. The run data store comprises a plurality of process runs, each process run comprising (i) an identification of a version in the plurality of versions for a process in the one or more processes, (ii) values for the respective set of parameterized resource inputs of a first edge in the hypergraph of the respective version and their associated input properties, (iii) the respective set of parameterized resource outputs of the first edge in the hypergraph of the respective version, and (iv) obtained values of at least one output property of a parameterized resource output in the respective set of parameterized resource outputs of each edge in the hypergraph of the respective version. A statistics module is maintained that, responsive to receiving a query that identifies one or more first parameterized resource inputs and/or parameterized resource outputs present in one or more process runs in the run data store, formats the one or more first parameterized inputs and/or parameterized outputs for analysis.

Embodiment 2—Steps (Edges) Connecting by
Generic Entities (Nodes) with Resource Lists
Associated with Those Nodes Another aspect of the present disclosure provides a non-transitory computer readable storage medium for providing process design and analysis of one or more processes. Each process in the one or more processes results in a respective product or analytical information. the non-transitory computer readable storage medium stores instructions, which when executed by a first device, cause the first device to maintain a hypergraph data store comprising, for each respective process in the one or more processes, a respective plurality of versions of the respective process. Each respective version comprises a hypergraph comprising a plurality of edges connected by nodes in a plurality of nodes. Each respective edge in the plurality of edges comprises a process stage label representing a respective stage in the corresponding process, and is associated with one or more inputs and at least one output. Each respective node in the plurality of nodes is associated with a corresponding set of parameterized resources and specifies that the corresponding set of parameterized resources form an output of the at least one output of a first edge in the plurality of edges and also forms an input of the one or more inputs of at least one other edge in the plurality of edges. At least one parameterized resource in the set of parameterized resources is associated with one or more properties. The one or more properties include one or more corresponding specification limits. A run data store is maintained in such embodiments. The run data store comprises a plurality of process runs. Each process run comprises (i) an identification of a version in the plurality of versions for a process in the one or more processes, and (ii) values for the respective set of parameterized resources corresponding to at least one of the first output of the first node or the first input of the at least one other node of a first node in the hypergraph of the respective version and their associated one or more properties. The values of a resource associated with the output side of an edge may be different than the values of a resource associated with the input side of the same edge. A statistics module is maintained in such embodiments that, responsive to receiving a query that identifies one or more first parameterized resources present in one or more process runs in the run data store, formats the one or more first parameterized resources for analysis.

In some embodiments, the query further identifies one or more second parameterized resources present in one or more runs in the run data store. The instructions, which when executed by the first device, further cause the first device to: correlate the one or more first parameterized resources and the one or more second parameterized resources and format, for presentation, a numerical measure of the correlation.

In some embodiments, the instructions, which when executed by the first device, further cause the first device to export the one or more first parameterized resources for analysis to a second device.

In some embodiments, the instructions, which when executed by the first device, further cause the first device to: maintain a process evaluation module that generates an alert in the form of a computer data transmission when an obtained value for a property of a parameterized resource in a set of parameterized resources for a process run in the plurality of process runs is outside the corresponding specification limit.

In some embodiments, a first version and a second version in a respective plurality of versions for a process in the one or more processes differ from each other in a number of nodes, a process stage label of a node, or a parameterized resource in a set of parameterized resources.

In some embodiments, the query further identifies one or more second parameterized resources present in one or more runs in the run data store, and the statistics module further identifies a correlation between (i) the one or more first parameterized resources and (ii) the one or more second parameterized resources present in one or more process runs in the run data store from among all the parameterized resources present in the run data store using a multivariate analysis technique (e.g., using a feature selection technique such as least angle regression, stepwise regression, etc.). In some embodiments, the statistics module further provides suggested values for one or more second parameterized resources for an additional process run of a first process in the one or more processes, not present in the run data store, based on a prediction that the suggested values for the one or more second parameterized resources will alter a numerical attribute of the one or more process runs.

In some embodiments, the numerical attribute is a reduction in a variance in the one or more first parameterized resources exhibited across the one or more process runs. In some embodiments, the query further identifies one or more third parameterized resources present in one or more runs in the run data store, and the numerical attribute is a confidence in a correlation between the one or more first parameterized inputs resources and the one or more third parameterized resources. In some embodiments, the one or more processes is a plurality of processes and the correlation is identified from process runs in a subset of the plurality of processes. In some embodiments, the one or more processes is a plurality of processes and the correlation is identified from process runs in a single process in the plurality of processes.

In some embodiments, the one or more processes is a plurality of processes and the query further identifies a subset of the plurality of processes whose process runs are to be formatted by the statistics module. In some embodiments, the one or more processes is a plurality of processes and the query further identifies a single process in the plurality of processes whose process runs are to be formatted by the statistics module. In some embodiments, the query further identifies a subset of process runs in the one or more processes. In some embodiments, the statistics module further identifies a correlation between (i) a first set comprising one or more process runs in the run data store and (ii) a second set comprising one or more process runs in the run data store, wherein process runs in the second set are not in the first set.

In some embodiments, the correlation is computed across a plurality of parameterized resources present in the first and second sets. In some embodiments, the set of parameterized resources for a node in the plurality of nodes of a hypergraph for a process version in the respective plurality of process versions comprises a first and second parameterized resource, the first parameterized resource specifies a first resource and is associated with a first property, and the second parameterized resource specifies a second resource and is associated with a second property, where the first property is different than the second property. In some embodiments, the first property is a viscosity value, a purity value, a composition value, a temperature value, a weight value, a mass value, a volume value, or a batch identifier of the first resource. In some embodiments, the first resource is a single resource or a composite resource.

In some embodiments, the set of parameterized resources for a first node in the plurality of nodes of a hypergraph of a process version in the respective plurality of process versions comprises a first parameterized resource, and the first parameterized resource specifies a process condition associated with the corresponding stage of the process associated with the corresponding first edge. In some such embodiments, the process condition comprises a temperature, an exposure time, a mixing time, a type of equipment, or a batch identifier.

In some embodiments, the instructions further cause the first device to execute a data driver for a respective process in the one or more processes. The data driver includes instructions for receiving a dataset for the respective process, instructions for parsing the dataset to thereby obtain (i) an identification of a process run in the run data store and (ii) property values associated with the respective set of parameterized resources of a first node in the hypergraph of the respective process for the process run, and instructions for populating the property values of parameterized resources of the corresponding first node in the run data store with the parsed values.

In some embodiments, the corresponding specification limit comprises an upper limit and a lower limit for the corresponding parameterized resource.

In some embodiments, the corresponding specification limit comprises an enumerated list of allowable types.

In some embodiments, the one or more processes is a plurality of processes and a first process in the plurality of processes results in a first product and a second process in the plurality of processes results in a second product, wherein the first product is different than the second product.

In some embodiments, the run data store further comprises a genealogical graph showing a relationship between (i) versions of a single process in the plurality of versions of a process or (ii) versions of two or more processes in the respective plurality of versions of two or more processes.

Another aspect of the present disclosure provides a computer system comprising: one or more processors, memory, and one or more programs stored in the memory for execution by the one or more processors. The one or more programs comprise instructions for maintaining a hypergraph data store. The hypergraph data store comprises, for each respective process in a set of one or more processes, each process in the set of one or more processes resulting in a respective product or analytical information, a respective plurality of versions of the respective process. Each such respective version comprise a hypergraph comprising a plurality of nodes connected by edges in a plurality of edges, each respective edge in the plurality of edges comprising a process stage label representing a respective stage in the corresponding process, and associated with one or more inputs and at least one output, and each respective node in the plurality of nodes is associated with a corresponding set of parameterized resources and specifies that the corresponding set of parametrized resources form an output of the at least one output of a first edge in the plurality of edges and also forms an input of the one or more inputs of at least one other edge in the plurality of edges, and wherein at least one parameterized resource in the set of parameterized resources is associated with one or more properties, the one or more properties including one or more corresponding specification limits. A run data store, is further maintained. The run data store comprises a plurality of process runs. Each process run comprises (i) an identification of a version in the plurality of versions for a process in the one or more processes, and (ii) values for the respective set of parameterized resources corresponding to at least one of the first output of the first node or the first input of the at least one other node of a first node in the hypergraph of the respective version and their associated one or more properties. The values of a resource associated with the output side of an edge may be different than the values of a resource associated with the input side of the same edge. A statistics module is maintained that, responsive to receiving a query that identifies one or more first parameterized resources present in one or more process runs in the run data store, formats the one or more first parameterized resources for analysis.

Embodiment 3—Steps (Edges) Connected by Generic Entities (Nodes) with No Associated Lists Another aspect of the present disclosure provides a non-transitory computer readable storage medium for providing process design and analysis of one or more processes. Each process in the one or more processes results in a respective product or analytical information. The non-transitory computer readable storage medium stores instructions, which when executed by a first device, cause the first device to maintain a hypergraph data store comprising, for each respective process in the one or more processes, a respective plurality of versions of the respective process. Each respective version comprises a hypergraph comprising a plurality of edges connected by nodes in a plurality of nodes. Each respective edge in the plurality of edges comprises a process stage label representing a respective stage in the corresponding process, and is associated with one or more inputs and at least one output. Each respective node in the plurality of nodes forms an output of the at least one output of a first edge in the plurality of edges and also forms an input of the one or more inputs of at least one other edge in the plurality of edges.

A run data store is maintained. The run data store comprises a plurality of process runs. Each process run comprises an identification of a version in the plurality of versions for a process in the one or more processes.

A statistics module is maintained that, responsive to receiving a query that identifies one or more first parameterized resources present in one or more process runs in the run data store, formats the one or more first parameterized resources for analysis.

In some embodiments, the method further comprises associating each respective node in the plurality of nodes with a corresponding set of parameterized resources and specifying that the corresponding set of parameterized resources form an output of the at least one output of a first edge in the plurality of edges and also forms an input of the one or more inputs of at least one other edge in the plurality of edges. At least one parameterized resource in the set of parameterized resources is associated with one or more properties, the one or more properties including one or more corresponding specification limits. Further, the run data store also comprises, for each respective process run in the plurality of process runs, values for the respective set of parameterized resources corresponding to at least one of the first output of the first node or the first input of the at least one other node of a first node in the hypergraph of the respective version and their associated one or more properties.

In some embodiments, the query further identifies one or more second parameterized resources present in one or more runs in the run data store. The instructions, which when executed by the first device, further cause the first device to: correlate the one or more first parameterized resources and the one or more second parameterized resources and format, for presentation, a numerical measure of the correlation.

In some embodiments, the instructions, which when executed by the first device, further cause the first device to export the one or more first parameterized resources for analysis to a second device.

In some embodiments, the instructions, which when executed by the first device, further cause the first device to maintain a process evaluation module that generates an alert in the form of a computer data transmission when an obtained value for a property of a parameterized resource in a set of parameterized resource outputs for a process run in the plurality of process runs is outside the output specification limit.

In some embodiments, a first version and a second version in a respective plurality of versions for a process in the one or more processes differ from each other in a number of nodes, a process stage label of a node, or a parameterized resource in a set of parameterized resources inputs.

In some embodiments, the query further identifies one or more second parameterized resources present in one or more runs in the run data store. The statistics module further identifies a correlation between (i) the one or more first parameterized resources and (ii) the one or more second parameterized resources present in one or more process runs in the run data store from among all the parameterized resources present in the run data store using a multivariate analysis technique. In some embodiments, the multivariate analysis comprises a feature selection technique, such as least angle regression, or stepwise regression.

In some embodiments, the statistics module further provides suggested values for one or more second resources for an additional process run of a first process in the one or more processes, not present in the run data store, based on a prediction that the suggested values for the one or more second resources will alter a numerical attribute of the one or more process runs. In some such embodiments, the numerical attribute is a reduction in a variance in the one or more first parameterized resources exhibited across the one or more process runs. In some such embodiments, the query further identifies one or more third parameterized resources present in one or more runs in the run data store, and the numerical attribute is a confidence in a correlation between the one or more first resources and the one or more third resources.

In some embodiments, the one or more processes is a plurality of processes and the correlation is identified from process runs in a subset of the plurality of processes. In some embodiments, the one or more processes is a plurality of processes and the correlation is identified from process runs in a single process in the plurality of processes. In some embodiments, the one or more processes is a plurality of processes and the query further identifies a subset of the plurality of processes whose process runs are to be formatted by the statistics module. In some embodiments, the one or more processes is a plurality of processes and the query further identifies a single process in the plurality of processes whose process runs are to be formatted by the statistics module.

In some embodiments, the query further identifies a subset of process runs in the one or more processes. In some embodiments, the statistics module further identifies a correlation between (i) a first set comprising one or more process runs in the run data store and (ii) a second set comprising one or more process runs in the run data store, wherein process runs in the second set are not in the first set. In some embodiments, the correlation is computed across a plurality of parameterized resources present in the first and second sets.

In some embodiments, the set of resources for a node in the plurality of nodes of a hypergraph for a process version in the respective plurality of process versions comprises a first and second parameterized resource, the first parameterized resource specifying a first resource and is associated with a first property, and the second parameterized resource specifying a second resource and is associated with a second property, where the first property is different than the input property. In some such embodiments, the first property is a viscosity value, a purity value, composition value, a temperature value, a weight value, a mass value, a volume value, or a batch identifier of the first resource. In some such embodiments, the first resource is a single resource or a composite resource.

In some embodiments, the set of parameterized resources for a first node in the plurality of nodes of a hypergraph of a process version in the respective plurality of process versions comprises a first parameterized resource, the first parameterized resource specifying a process condition. In some such embodiments, the process condition comprises a temperature, an exposure time, a mixing time, a type of equipment, or a batch identifier.

In some embodiments, the instructions further cause the first device to execute a data driver for a respective process in the one or more processes. The data driver includes instructions for receiving a dataset for the respective process, instructions for parsing the dataset to thereby obtain (i) an identification of a process run in the run data store and (ii) property values associated with the respective set of parameterized resources of a first node in the hypergraph of the respective process for the process run, and instructions for populating the property values of parameterized resources of the first node in the run data store with the parsed values.

In some embodiments, the corresponding specification limit comprises an upper limit and a lower limit for the corresponding parameterized resource. In some embodiments, the corresponding output specification limit comprises an enumerated list of allowable types.

In some embodiments, the one or more processes is a plurality of processes and a first process in the plurality of processes results in a first product and a second process in the plurality of processes results in a second product, wherein the first product is different than the second product.

In some embodiments, the run data store further comprises a genealogical graph showing a relationship between (i) versions of a single process in the plurality of versions of a process or (ii) versions of two or more processes in the respective plurality of versions of two or more processes.

Another aspect of the present disclosure provides a computer system, comprising one or more processors, memory, and one or more programs stored in the memory for execution by the one or more processors. The one or more programs comprise instructions for maintaining a hypergraph data store comprising, for each respective process in a set of one or more processes, each process in the set of one or more processes resulting in a respective product or analytical information, a respective plurality of versions of the respective process. Each such respective version comprises a hypergraph comprising a plurality of edges connected by nodes in a plurality of nodes. Each respective edge in the plurality of edges comprises a process stage label representing a respective stage in the corresponding process, and is associated with one or more inputs and at least one output. Each respective node in the plurality of nodes forms an output of the at least one output of a first edge in the plurality of edges and also forms an input of the one or more inputs of at least one other edge in the plurality of edges. A run data store is maintained. The run data store comprises a plurality of process runs. Each process run comprises an identification of a version in the plurality of versions for a process in the one or more processes. A statistics module is maintained that, responsive to receiving a query that identifies one or more first parameterized resources present in one or more process runs in the run data store, formats the one or more resources for analysis.

BRIEF DESCRIPTION OF THE DRAWINGS

FIG. 3 illustrates a process version in accordance with an embodiment of the present disclosure.

FIGS. 6A, 6B, 6C, 6D, and 6E collectively illustrate a flow chart providing process design and analysis of one or more processes in which steps (edges) connect resources (nodes) in accordance with an embodiment of the present disclosure.

FIG. 20 illustrates setting up process runs using the new group of stages defined in the hypergraph of FIGS. 13 and 14 in accordance with an embodiment of the present disclosure.

FIGS. 27A, 27B, 27C, 27D, and 27E collectively illustrate a flow chart providing process design and analysis of one or more processes in which steps (edges) are connected by generic entities (nodes) with resource lists associated with those nodes in accordance with another embodiment of the present disclosure.

FIGS. 28A, 28B, 28C, 28D, and 28E collectively illustrate a flow chart providing process design and analysis of one or more processes in which steps (edges) are connected by generic entities (nodes) with no associated lists in accordance with another embodiment of the present disclosure.

Like reference numerals refer to corresponding parts throughout the several views of the drawings.

DETAILED DESCRIPTION

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first subject could be termed a second subject, and, similarly, a second subject could be termed a first subject, without departing from the scope of the present disclosure. The first subject and the second subject are both subjects, but they are not the same subject.

The terminology used in the present disclosure is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Figure 1:
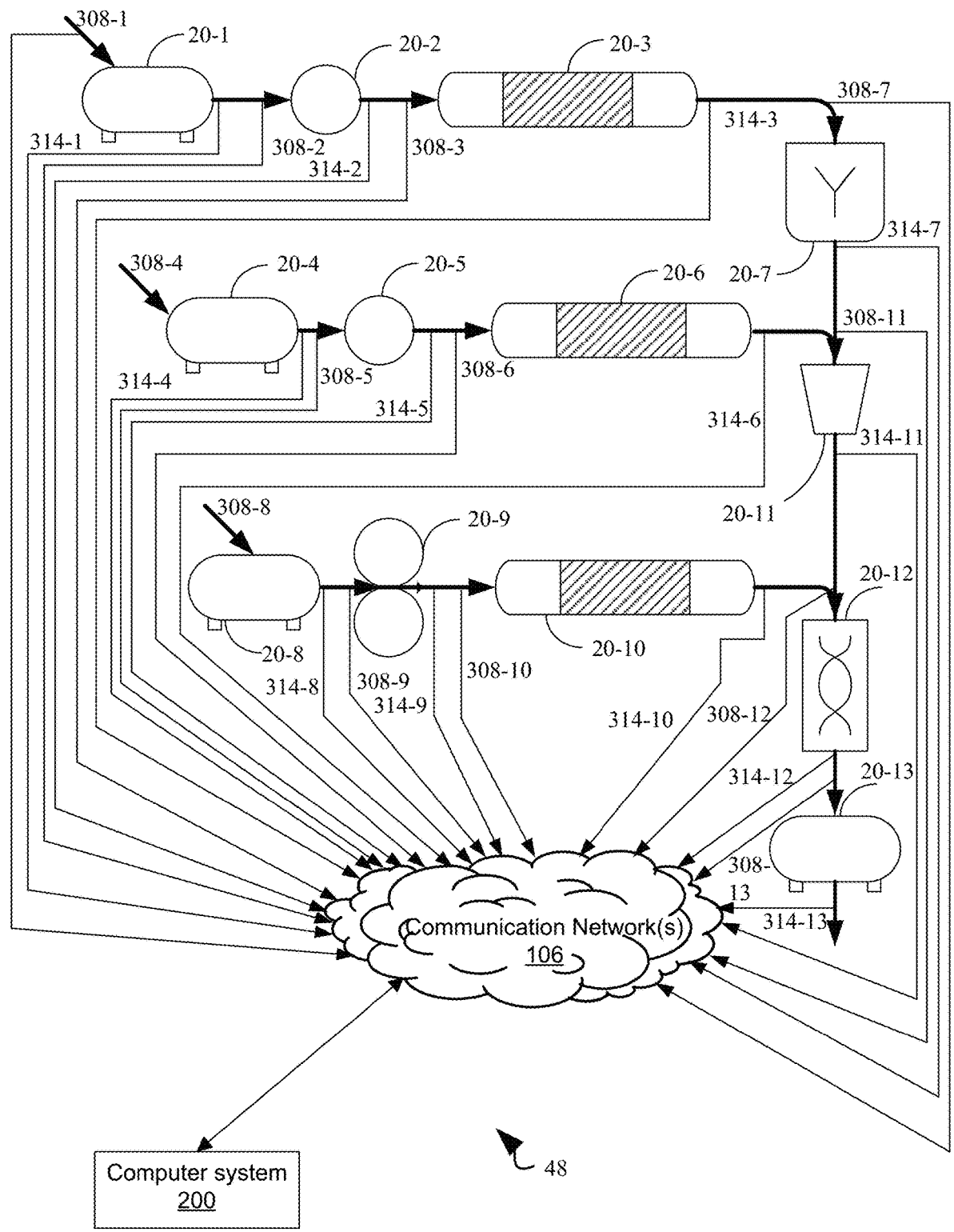
FIG. 1 illustrates a system topology in accordance with the present disclosure that includes a device, namely a computer system 200, and a plurality of stages 20 of a process.

A detailed description of a system 48 for providing process design and analysis of one or more processes in accordance with the present disclosure is described in conjunction with FIGS. 1 through 5. In particular, FIG. 1 illustrates a process or pipeline having a plurality of stages 20. Each respective stage 20 in FIG. 1 is illustrated by an exemplary reaction chamber to indicate that a form of material transformation takes place. However, there is no requirement that this material transformation take place in a reaction chamber. In the embodiment illustrated in FIG. 1, each stage 20 includes a set of parameterized inputs 308 and a set of parameterized outputs 314. More generally, in some embodiments, each respective stage in the plurality of stages is associated with one or more inputs and at least one output.

In some embodiments, as illustrated in FIG. 1, a description of these inputs 308 and outputs 314 is provided to computer system 200, possibly over communications network 106. For instance, at stage 20-2, when a process run completes this stage, a file that includes the parameterized outputs of this stage is stored in a directory associated with this stage. Then, a sweeping or monitoring process takes this new file and sends it to computer system 200 where it is uploaded into a corresponding process run stored in the computer system 200. In more detail, in some embodiments, inputs 308 or outputs 314 are electronically measured by measuring devices. For instance, in some embodiments a software component such as a sync engine that runs as a background process (like Google Drive or Dropbox Sync) on any computer attached to an instrument or other component of a stage 20 monitors a synced folder. When new instrument data files are added to the folder, the software parses and sends the data associated with the stage across communications network 106 to computer system 200. In some embodiments, a hardware solution is used to communicate the set of inputs 308 and outputs 314 of the stages 20 of a process. In such an approach data acquisition and transfer is performed by direct interface with instruments or other components of stages 20. For instance, in some embodiments a BeagleBone black microcontroller (http://beagleboard.org/BLACK) is used to transmit such data to computer system 200 across network 106. In some embodiments, data (e.g., values for a set of parameterized resource inputs 310 and/or values for a set of parameterized resource outputs 314 associated with a stage 20 of a process) is communicated from the respective stages 20 to the computer system via HTTPS port 443 via HTTP POSTs or representational state transfer.

Of course, other topologies of system 48 are possible, for instance, computer system 200 can in fact constitute several computers that are linked together in a network or be a virtual machine in a cloud computing context. As such, the exemplary topology shown in FIG. 1 merely serves to describe the features of an embodiment of the present disclosure in a manner that will be readily understood to one of skill in the art.

Figure 2:
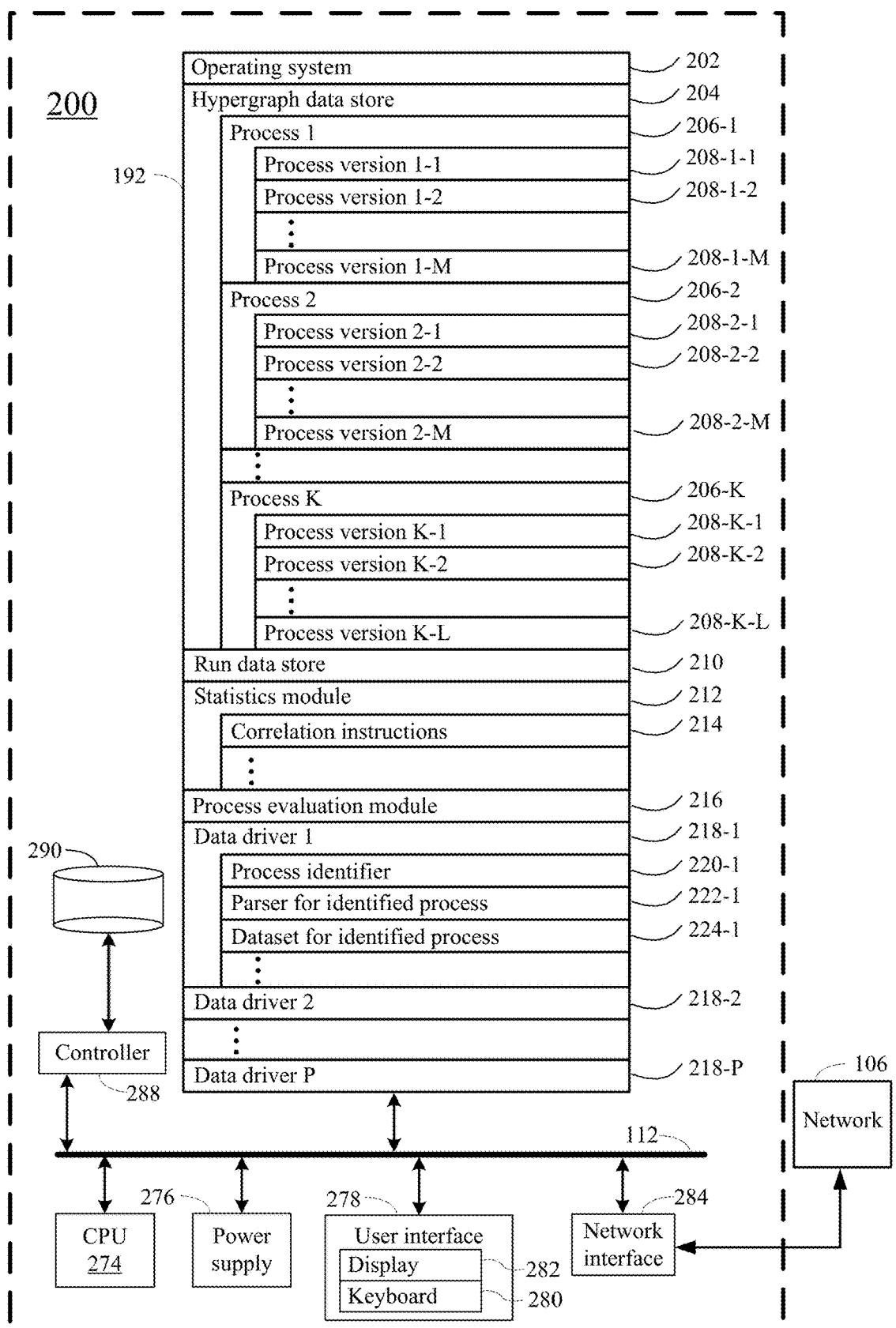
FIG. 2 illustrates a computer system in accordance with an embodiment of the present disclosure.

Referring to FIG. 2, in typical embodiments, a computer system 200 for providing process design and analysis of one or more processes comprises one or more computers. For purposes of illustration in FIG. 2, the computer system 200 is represented as a single computer that includes all of the functionality of the computer system 200. However, the disclosure is not so limited. The functionality of the computer system 200 may be spread across any number of networked computers and/or reside on each of several networked computers and/or by hosted on one or more virtual machines at a remote location accessible across the communications network 106. One of skill in the art will appreciate that a wide array of different computer topologies is possible for the computer system 200 and all such topologies are within the scope of the present disclosure.

The computer system 200 is uniquely structured to record and store data in a computable way with minimal effort, quantitatively search all experimental designs, and data, or any subset thereof, apply real-time statistical analysis, achieve quality by design, update experimental processes and data collection systems, identify meaningful variables via automated critical-to-quality analysis, routinely obtain results that are true and unequivocal, access transparent data and results, make results open and accessible (and securely control access to anyone or any team), build quantitatively and directly on others' designs and results, and unambiguously communicate evidence supporting a conclusion to team members or partners.

Turning to FIG. 2 with the foregoing in mind, a computer system 200 comprises one or more processing units (CPU's) 274, a network or other communications interface 284, a memory 192 (e.g., random access memory), one or more magnetic disk storage and/or persistent devices 290 optionally accessed by one or more controllers 288, one or more communication busses 112 for interconnecting the aforementioned components, and a power supply 276 for powering the aforementioned components. Data in memory 192 can be seamlessly shared with non-volatile memory 290 using known computing techniques such as caching. Memory 192 and/or memory 290 can include mass storage that is remotely located with respect to the central processing unit(s) 274. In other words, some data stored in memory 192 and/or memory 290 may in fact be hosted on computers that are external to computer system 200 but that can be electronically accessed by the computer system over an Internet, intranet, or other form of network or electronic cable (illustrated as element 106 in FIG. 2) using network interface 284.

The memory 192 of computer system 200 stores:
- an operating system 202 that includes procedures for handling various basic system services;
- a hypergraph data store 204 store comprising, for each respective process 206 in the one or more processes, a respective plurality of versions 208 of the respective process 206;
- a run data store 206 that stores a plurality of process runs, each process run comprising an identification of a version 208 in the plurality of versions for a process in the one or more processes;
- a statistics module 212 for analyzing the process data;
- a process evaluation module 216 for initiating alerts when specific conditions arise in a process; and
- one or more optional data drivers 218, each data driver for a respective process in the one or more processes, the data driver including instructions for receiving a dataset for the respective process and instructions for processing the dataset.

In some implementations, one or more of the above identified data elements or modules of the computer system 200 are stored in one or more of the previously mentioned memory devices, and correspond to a set of instructions for performing a function described above. The above identified data, modules or programs (e.g., sets of instructions) need not be implemented as separate software programs, procedures or modules, and thus various subsets of these modules may be combined or otherwise re-arranged in various implementations. In some implementations, the memory 192 and/or 290 optionally stores a subset of the modules and data structures identified above. Furthermore, in some embodiments the memory 192 and/or 206 stores additional modules and data structures not described above.

Turning to FIG. 3, more details of embodiments of a process version 208 are described. The process version comprises a hypergraph 302. The hypergraph 302 comprises a plurality of nodes, is directional, causal, and sequential based. For instance, each respective node 322 in the plurality of nodes is connected to at least one other node in the plurality of nodes by an edge 304 in a plurality of edges. In some embodiments, each respective edge 304 in the plurality of edges comprises a process stage label 306 representing a respective stage in the corresponding process. In some alternative embodiments, each respective node 322 in the plurality of nodes, rather than an edge 304 in the plurality of edges, comprises a process stage label 306 representing a respective stage in the corresponding process.

In some embodiments, a node 322 is a complete and self-contained description of a transformative event that can be used to build larger processes. In some embodiments a node 322 is sufficiently general to serve in a wide array of processes, such as chemical processes, life science processes, and food preparation process. Advantageously, nodes 322 do not lose their meaning or utility when copied into other process. As such, the definition of a particular node 322 does not depend on the definition of another node in a hypergraph 302 in preferred embodiments.

As illustrated in FIG. 3, in some embodiments edges 322 are structured to be associated with data in a unique way, in order to facilitate subsequent data mining and reasoning engines to analyze process runs based on process versions 208.

In some embodiments, each respective edge 304 in the plurality of edges is associated with a set of parameterized resource inputs 308 to the respective stage in the corresponding process. At least one parameterized resource input 310 in the set of parameterized resource inputs 308 is associated with one or more input properties 312, the one or more input properties including an input specification limit 314. Examples of input properties 312 are the attributes (e.g., measurements, quantities, etc.) of things such as people, equipment, materials, and data. There can be multiple input properties for a single parameterized resource input (e.g., temperature, flow rate, viscosity, pH, purity, etc.). In some embodiments, there is a single input property for a particular parameterized resource input. In such embodiments, each respective edge 304 in the plurality of edges is also associated with a set of parameterized resource outputs 314 to the respective stage in the corresponding process. At least one parameterized resource output 316 in the set of parameterized resource outputs 314 is associated with one or more output properties 318, the one or more output properties including a corresponding output specification limit 320. Examples of output properties 318 include attributes (e.g., measurements, quantities, etc.) of things such as people, equipment, materials, and data. There can be multiple output properties for a single parameterized resource output. In some embodiments, there is a single output property for a particular parameterized resource output.

Figure 17:
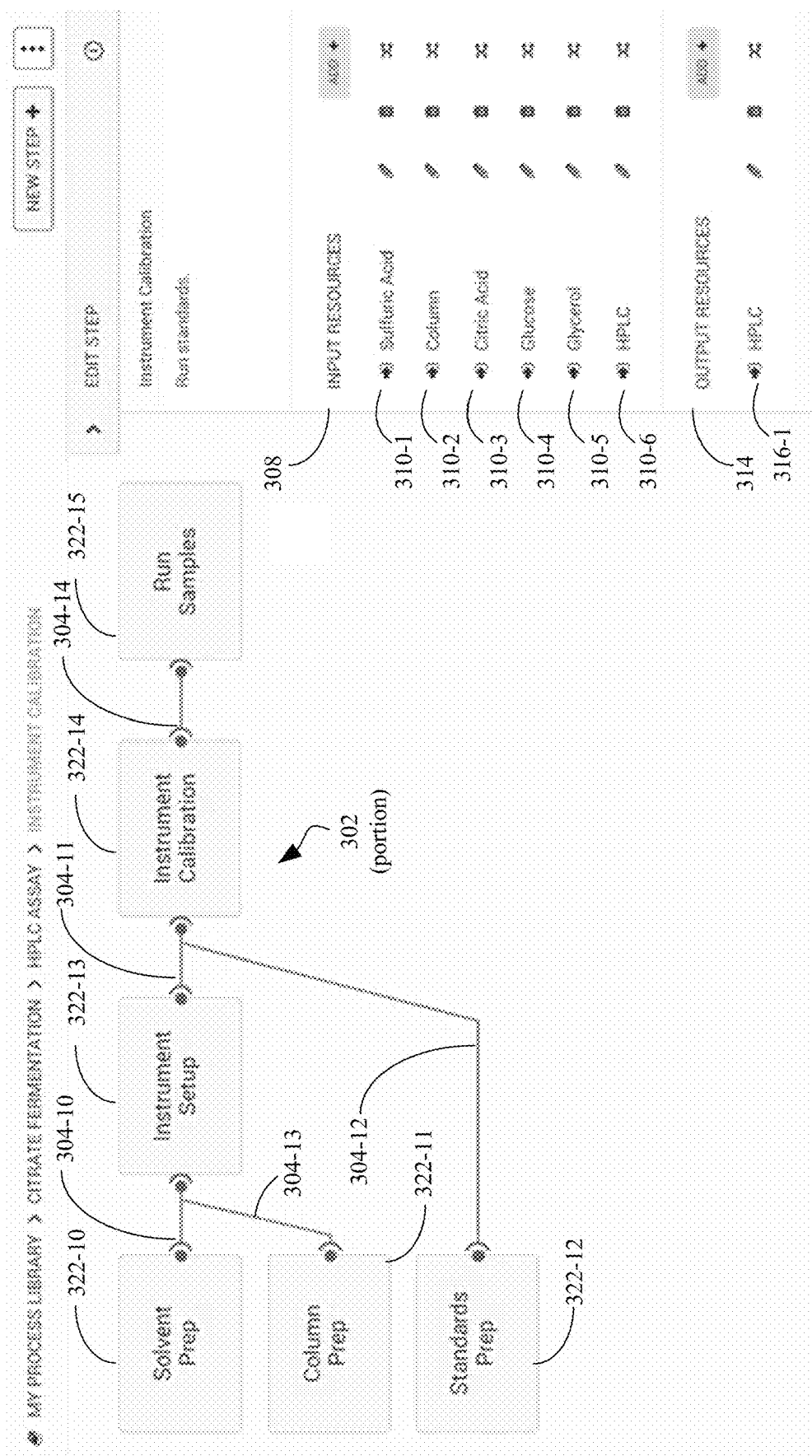
FIG. 17 illustrates how the new instrument calibration stage in the new group of stages defined in the hypergraph of FIGS. 13 and 14 is defined in accordance with an embodiment of the present disclosure.
Figure 18:
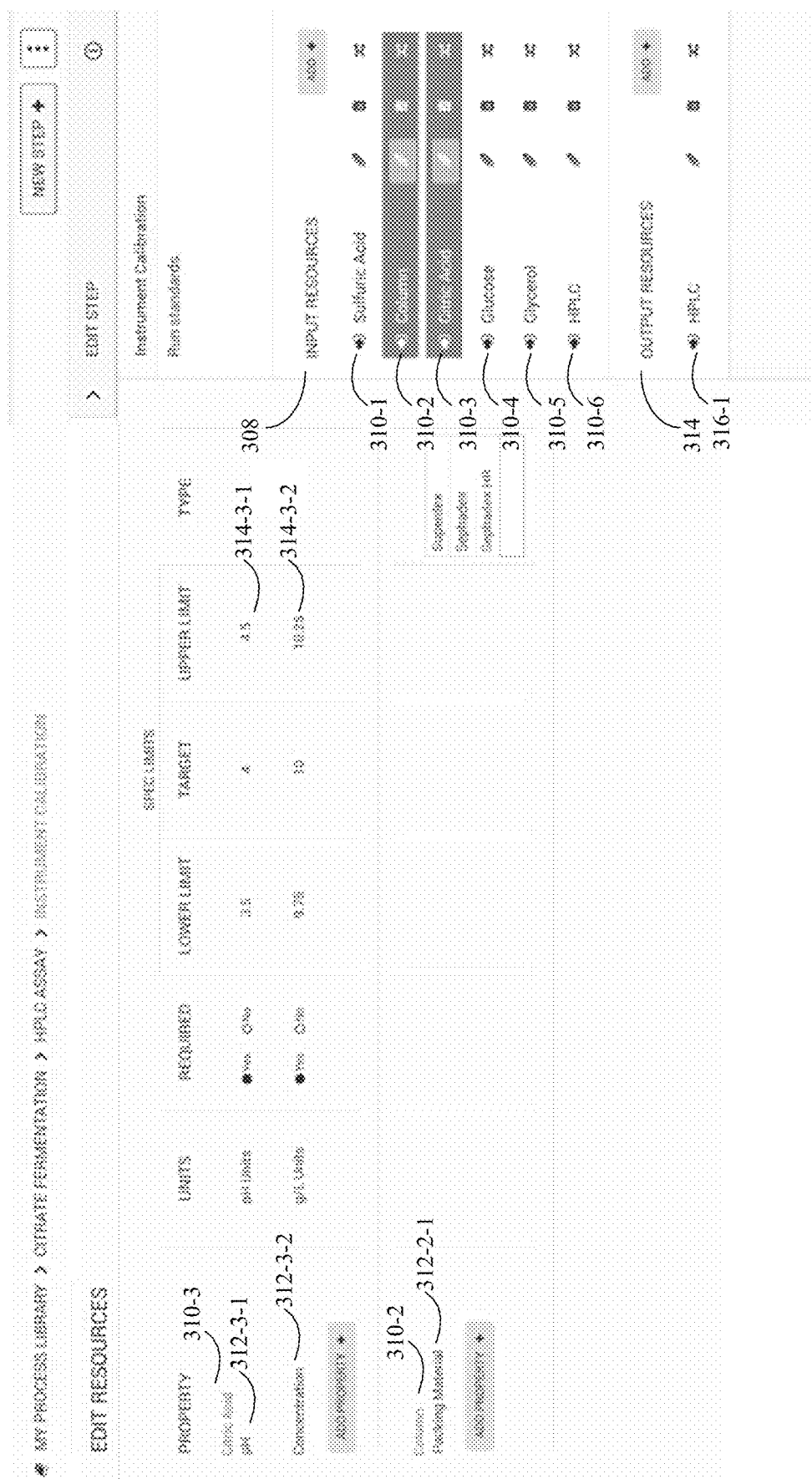
FIG. 18 further illustrates how the new instrument calibration stage in the new group of stages defined in the hypergraph of FIGS. 13 and 14 is defined in accordance with an embodiment of the present disclosure.
Figure 19:
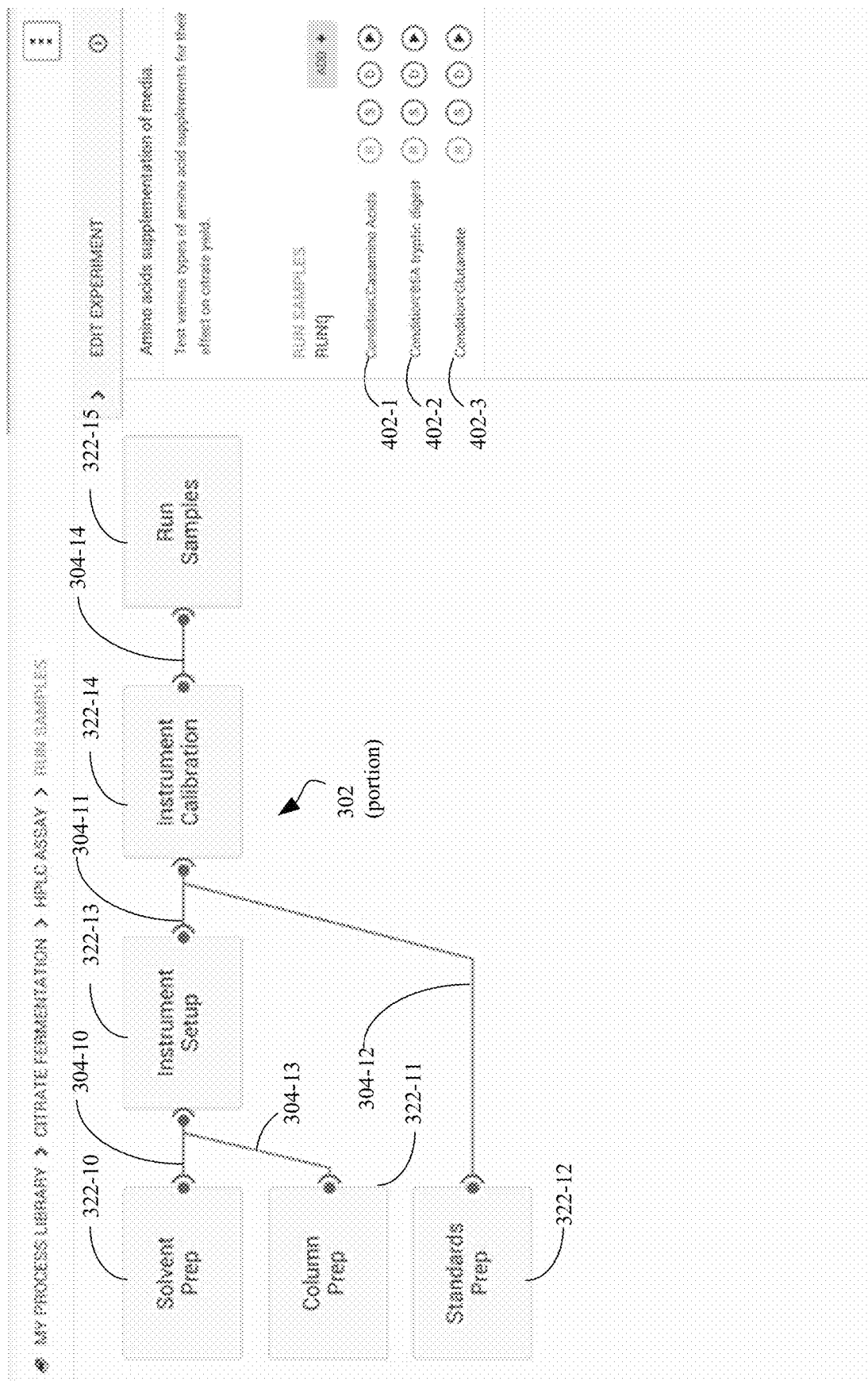
FIG. 19 illustrates how the new run samples stage in the new group of stages defined in the hypergraph of FIGS. 13 and 14 is defined in accordance with an embodiment of the present disclosure.

FIGS. 17 and 18 illustrate the above concepts. FIG. 17 illustrates a portion of a hypergraph 302 and illustrates the nodes 322 in the portion of the hypergraph. The node "Instrument Calibration" 322-14 is highlighted. The set of parameterized resource inputs 308 and the set of parameterized resource outputs 314 for an edge connected to this node are shown on the right side of FIG. 17. The set of parameterized resource inputs 308 for an edge connected to this node includes sulfuric acid 310-1, column 310-2, citric acid 310-3, glucose 310-4, glycerol 310-5, and HPLC 310-6. As such, the exemplary set of parameterized resource inputs 308 illustrates that two of the many possible types of parameterized inputs are (i) compositions (e.g., sulfuric acid, citric acid, glucose, glycerol, etc.) and (ii) type of equipment (e.g., column, HLLC, etc.). The set of parameterized resource outputs 314 for an edge connected to the node "Instrument Calibration" consists of HPLC 316.

Turning to FIG. 18, more details regarding the parameterized resource input 310-2 "column" and parameterized resource input 310-3 "citric acid" are provided. The parameterized resource input 310-3 "citric acid" is associated with one or more input properties 312 including an input specification limit 314. For instance, one input property for parameterized resource input 310-3 "citric acid" is "pH" 312-3-1 and this property includes an input specification limit 314-3-1. In fact, the input specification limit 314-3-1 is expressed as a lower limit (pH 3.5), a target limit (pH 4), and an upper limit (pH 4.5). Another input property for parameterized resource input 310-3 "citric acid" is "concentration" 312-3-2 and this property includes an input specification limit 314-3-2. The input specification limit 314-3-2 is expressed as a lower limit (9.75 g/L Units), a target limit (10 g/L Units), and an upper limit (10.25 g/L Units).

Returning to FIG. 3, each hypergraph 302 includes a plurality of nodes. Each respective node 322 in the plurality of nodes specifies that the set of parameterized resource outputs 314 of a source edge 304 in the plurality of edges is included in the set of parameterized resource inputs 308 of at least one other destination edge 304 in the plurality of edges. In other words, a node specifies that the state of a material, equipment, people or other thing inputted into one edge (destination edge) in a given process is identical to the state of material, equipment, people, or other thing that has been outputted from another edge (source edge) in the hypergraph for that process. In some embodiments, a node specifies that the state of a material, equipment, people or other thing inputted into a plurality of edges (destination node) is identical in a given process to the state of material, equipment, people, or other thing that has been outputted from another edge (source edge) in the hypergraph for that process. Moreover, a destination edge may be connected to two or more source edges meaning that the input the destination edge includes material, equipment, people or other thing in the same state as it was in the output of the two or more source edges for a given process.

Process versioning 208 is an advantageous feature of the disclosed systems and methods. For example, when the input or output of a particular edge is identified through correlation analysis across various process runs of a process to be a cause of poor reproducibility of the overall process, additional edges before and after the problematic edge can be added in successive versions of the process and process runs of these new versions of the process can then be executed. Moreover, advantageously, data from older versions and newer versions of the process can be used together in correlation analysis, in some embodiments, across all the process runs of all of the process versions to determine the root cause of the variability or other unfavorable attribute associated with the problematic edge and hereby develop a process version that adequately addresses the problem. In fact, process runs from multiple processes that make similar but not identical products or produce similar but not identical analytical information can be analyzed to identify such problems.

As FIG. 3 illustrates, each edge 304 has inputs (set of parameterized resource inputs 308), and each of these parameterized resource inputs 310 has one or more input properties 312, and each these input properties has input specification limits 314. Further, each edge 304 has one or more parameterized resource outputs (set of parameterized resource outputs 314), and each of these parameterized resource outputs 316 has one or more output properties 318. Moreover, each of these output properties has output specification limits 320. The set of parameterized resource outputs serve as the inputs to other edges and such relationships are denoted by node. Moreover, the set of parameterized resource outputs 314 of a particular edge can serve as the inputs to more than one edge, thus the nodes and edges constitute a hypergraph. By defining a process in this way, it is easy to create process versions 208, integrate data acquisition from disparate sources and devices, and query process runs to identify correlations, reduce experimental variance, and improve process reproducibility. Process runs invoke a process version and result in values (e.g. measurements) for the set of inputs and set of outputs of an edge in the hypergraph in the process version.

To illustrate the concept of a node in a process, consider a node that is designed to measure the temperature of fermenter broth. The set of parameterized inputs 308 to an edge to this node that includes one or more inputs to this node include a description of the fermenter broth and the thermocouple that makes the temperature measurement. The thermocouple will include input properties that include its cleanliness state, calibration state and other properties of the thermocouple. The set of parameterized outputs of an edge connected to one or more outputs for this node include the temperature of the fermenter broth, and output specification limits for this temperature (e.g., an acceptable range for the temperature). Another possible parameterized resource output 316 of an edge of the node 322 is the thermocouple itself along with properties 316 of the thermocouple after the temperature has been taken, such as its cleanliness state and calibration state. For each of these properties 316 there is again corresponding output specification limits.

In some instances, a destination node 326 includes multiple edges 304, each such edge from a different source node 324. In such instances, the set of parameterized resource outputs 314 for each such edge collectively constitute the set of parameterized resource inputs 308 for the edges leading to the destination node 326.

Figure 4:
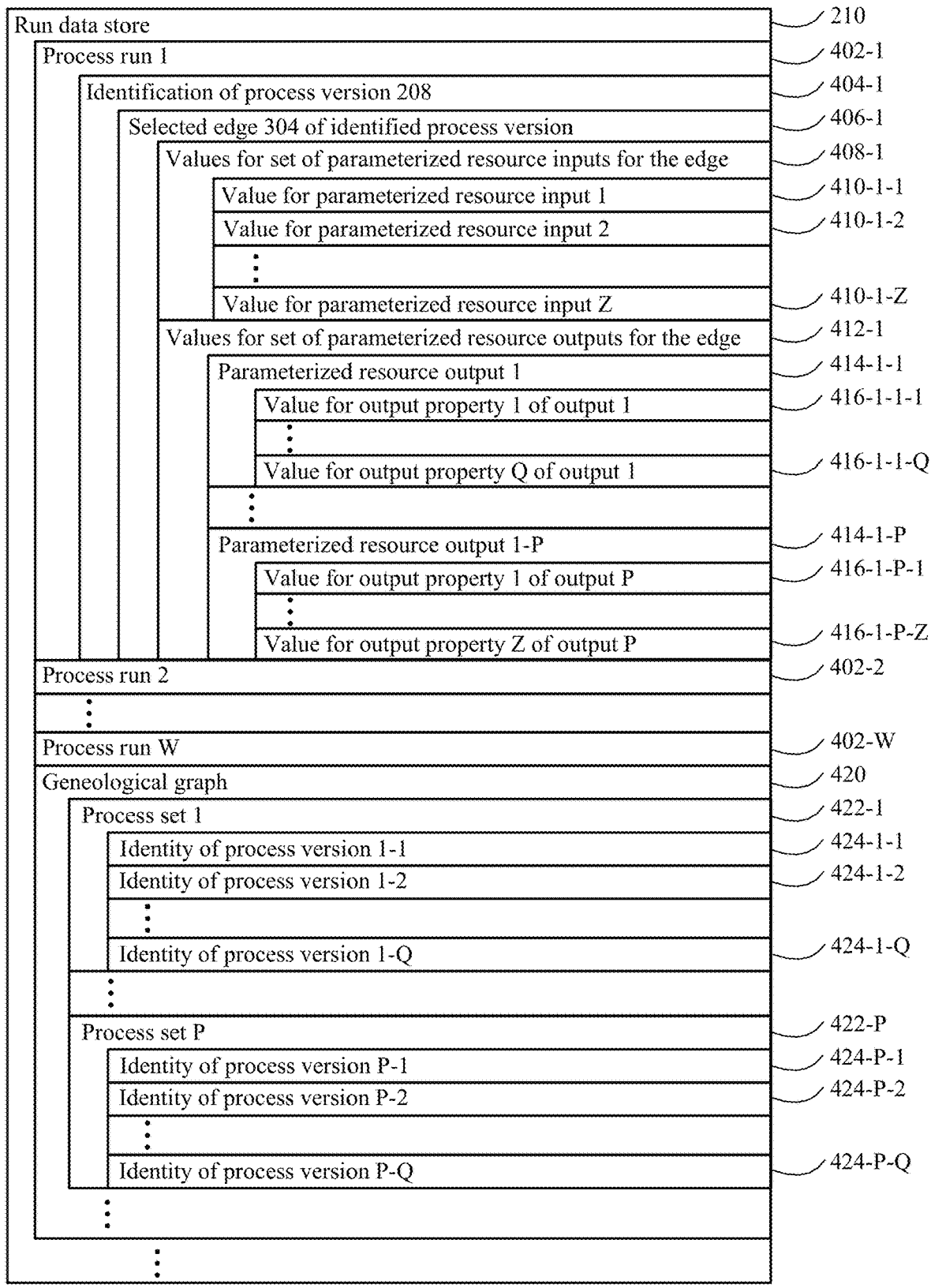
FIG. 4 illustrates a run data store in accordance with an embodiment of the present disclosure.

Turning to FIG. 4, more details of a run data store 210 are provided. The run data store 210 comprises a plurality of process runs. That is to say, when a node of a process is run, actual material lots or pieces of equipment, etc., are obtained and/or used as real world instances of a particular process version 406. As such, each process run 402 comprises an identification of a node 406 of an identified 404 process version 208 in the plurality of versions for a process 206 in the one or more processes. For the identified node 406 of the process version 208, the process run 402 further comprises values for the respective set of parameterized resource inputs 308 of a first edge 304 in the hypergraph 302 of the respective process version 208 and their associated input properties 312. For the identified process version 208, the process run 402 also comprises the respective set of parameterized resource outputs 314 of the first edge 304. Further, for the identified process version 208, the process run 402 also comprises obtained values of at least one output property 318 of a parameterized resource output 316 in the respective set of parameterized resource outputs 314 of the first edge 304 in the hypergraph 302 of the respective process version. FIGS. 19 through 24 illustrate three process runs 402 for a particular process version, with each process run 402 characterized by different conditions (e.g., different amounts for one or more input properties of one or more parameterized inputs to one or more nodes in the hypergraph of the process version).

In some embodiments, run data store 210 includes a genealogical graph 420 comprising one or more process sets 422. Each process set 422 comprises the identities 424 of related process versions 424. For instance, in some embodiments, a first process version 404 in a process set 420 and a second process version 404 in the process set 420 have the same hypergraph but an output property, output specification limit, input property, or input specification limit to one of the edges in the hypergraph is different. In another example, a first process version 404 in a process set 420 and a second process version 404 in the process set 420 have hypergraphs that have all but one, all but two, all but three, or all but four nodes and/or edges in common. Typically, the process versions in a process set are related to each other in the sense that a process gets refined over time, and various versions of the process are saved as process versions. Refinement of a process includes any combination of adding or removing nodes from a hypergraph, adding or removing edges from the hypergraph, adding or removing parameterized resource inputs to one or more edges in the hypergraph, adding or removing parameterized resource outputs to one or more edges in the hypergraph, adding, removing or changing an input property or input specification limit of a parameterized resource input of one or more edges in the hypergraph, and/or adding, removing or changing an output property or output specification limit of a parameterized resource output of one or more edges in the hypergraph.

Figure 5:
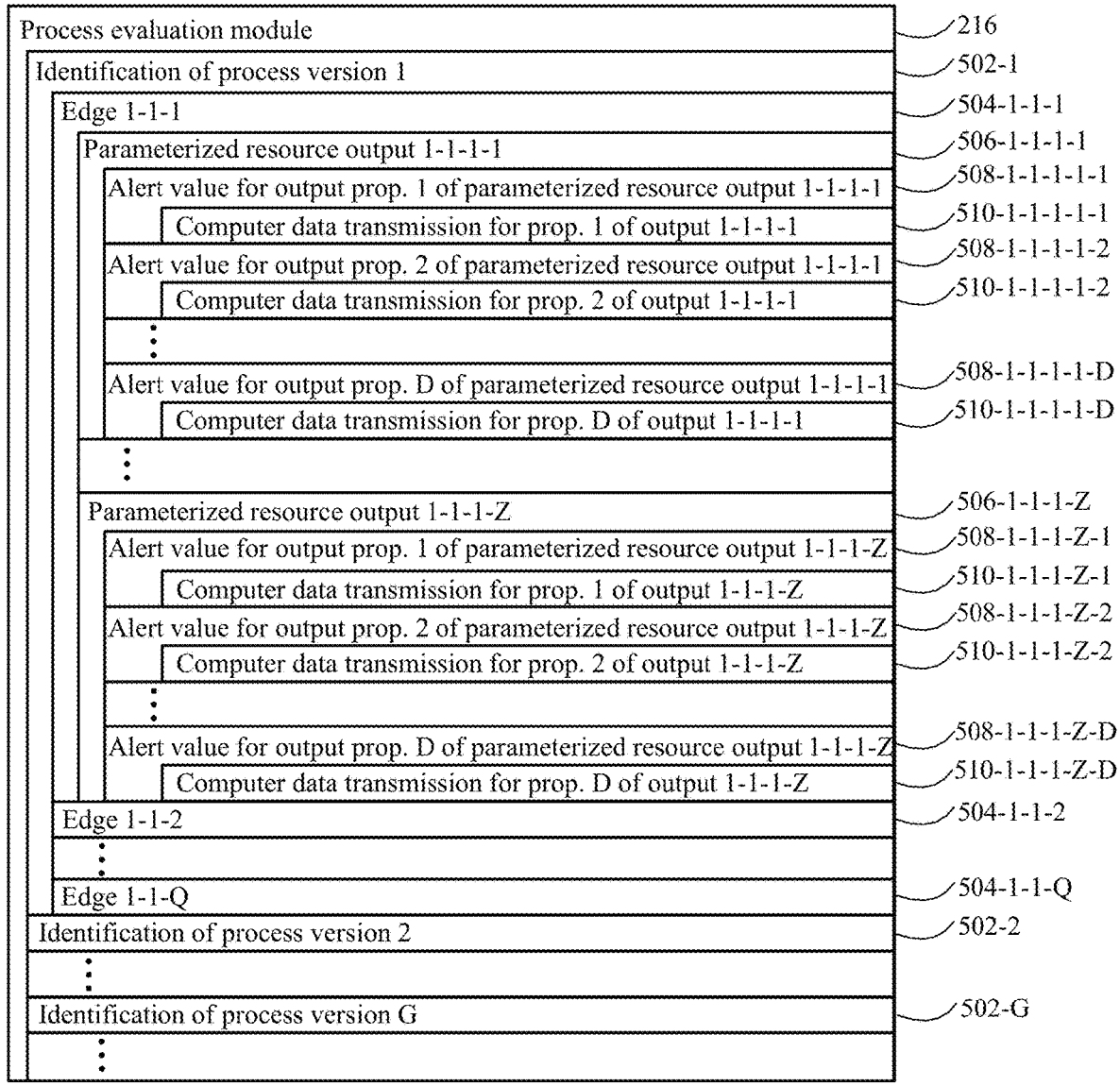
FIG. 5 illustrates a process evaluation module in accordance with an embodiment of the present disclosure.

Turning to FIG. 5, more details of a process evaluation module 216 are provided. The process evaluation module 216 takes advantage of the unique architecture of the disclosed processes. In particular, when assessing whether a parameterized resource output 316 for a particular edge 304 satisfies a particular associated output specification limit 320, it is only necessary to evaluate the values in process runs for the corresponding parameterized resource output of that edge. The inputs and outputs of other edges do not need to be evaluated for this purpose. So it is possible to generate an alert in the form of a computer data transmission when an obtained value for an output property of a parameterized resource output in a set of parameterized resource outputs for a run of an edge in a hypergraph for a process version is outside the output specification limit. Moreover, this alert is portable to other process versions that make use of the same edge. Thus, in some embodiments, a process evaluation module is organized by process version 502. For each process version, edges 504 for which process alerts are needed are identified. For each such edge 504, one or more parameterized resource outputs 506 to the edge are identified. For each of the one or more parameterized resource outputs, one or more alert values 508 are identified for the parameterized resource outputs. If an alert value is triggered for a property of a parameterized resource output of a particular edge of a particular process version, then a computer data transmission 510 corresponding to the alert is communicated. In some embodiments, the computer data transmission 510 is a message sent to a user interface or a client computer indicating that the alert has been triggered. In some embodiments, the computer data transmission is in the form of a text message, an E-mail, an SMS message, or an audible alarm. To illustrate, consider the case in which the output specification limit 320 of an output property 318 of a parameterized resource output 316 of an edge 304 specifies that output pH should not exceed 7. Thus, an alert 508 is set up for this output property. If, in a process run 502, the pH of the resource output does in fact exceed 7.0, then a computer data transmission 510 corresponding to this alert is communicated.

System 48 provides a unique design for processes through unambiguous definition of state (e.g., the state of edge inputs and edge outputs) at whatever level of resolution needed to achieve the performance goals of a process (e.g., to satisfactorily stabilize the process). Such states include, for example, the "what" and "how much" for each of the edge inputs and outputs. Examples of "what" can be a piece of equipment, human resource, type material or composition of matter, to name a few examples. System 48 advantageously provides a way to unite multiple disparate functional areas (e.g., chemistry, biology, fermentation, analytical, different control systems, etc.) into a seamless process of repeatable material transformations (nodes) that can be versioned and for which the data from process runs can be evaluated using statistical techniques to achieve product control (e.g., identify root causes of unwanted variability).

Advantageously, the disclosed data structures fully define nodes and edges (their input, their output, and hence the transformation that takes place at each node) without any ambiguity in the pertinent properties of each edge input and each edge output. However, it is to be noted that the actual transformation that takes place within a node does not necessarily need to be defined beyond a basic description (stage label) for record keeping and identification purposes. In some instances, process runs, in which the inputs of a node and/or edge in a process are varied, are run and the outputs or final product of the process is statistically analyzed in view of these varied inputs to determine if the change in the inputs improves an aspect of the final product of the process (e.g., reproducibility, yield, etc.). One benefit of the disclosed systems and methods is that they provide mechanisms to truly understand the dynamics of a process (e.g., how variance in certain edge inputs or properties of edge inputs affect final product) and therefore allows the process to be successfully scaled up in size more easily. Because of the way processes are defined in the disclosed systems and methods, it is possible to find sources of error that cause undesirable results (e.g. bad yield, poor reproducibility, etc.) in defined processes or, for that matter, desirable results. Examples of unwanted error in processes is application dependent and depends, for example on the type of edge input or output, but can be for instance, measurement error or failure to quantify or even identify a relevant property of an edge input or edge output. For instance, if an edge input is sugar, a measurement error may arise because the process by which the weight of the sugar input to the edge is measured is not sufficiently accurate. In another example, if an edge input is sugar, a relevant property of the sugar may be lot number, because in the particular process, sugar lot number happens to have a profound impact on overall product yield.

Now that details of a system 48 for providing process design and analysis of one or more processes have been disclosed, details regarding a flow chart of processes and features of the network, in accordance with an embodiment of the present disclosure, are disclosed with reference to FIG. 6.

As illustrated in block 602 of FIG. 6A, a hypergraph data store 204 is maintained. The hypergraph data store 204 comprises, for each respective process 206 of one or more processes, a respective plurality of versions of the respective process. Each respective version 208 comprises a hypergraph 302 comprising a plurality of nodes 322 connected by edges 304 in a plurality of edges. Each respective node 304 in the plurality of nodes comprises a process stage label representing a respective stage in the corresponding process.

Figure 7:
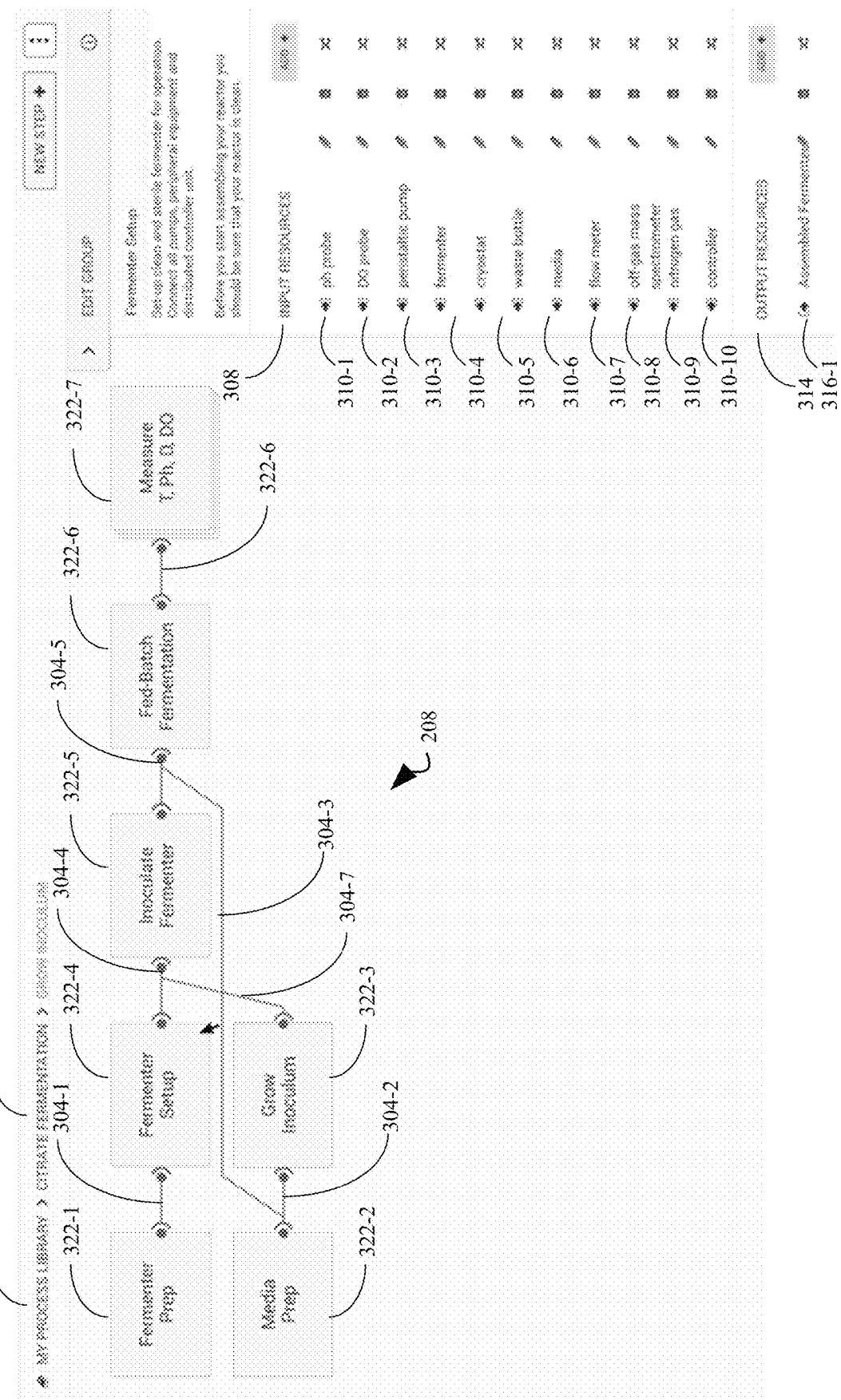
FIG. 7 illustrates a hypergraph comprising a plurality of nodes connected by edges in which a fermenter setup stage is highlighted in accordance with an embodiment of the present disclosure.

FIG. 7 illustrates a process version 208. The process version includes a hypergraph that includes a plurality of nodes 322 corresponding to respective stages of a process (e.g., "Fermenter Prep," "Fermenter Setup," "Media Prep," "Grow Inoculum," "Innoculate Fermenter," "Fed-Batch Fermentation," and "Measure T, Ph, D, DO"). In some embodiments, concurrency is supported. That is, multiple users, each operating at a different client computer in communication with computer system 200, can view an instance of the process version displayed in FIG. 7, make changes to it, and view and analyze data from process runs that make use of it.

Figure 8:
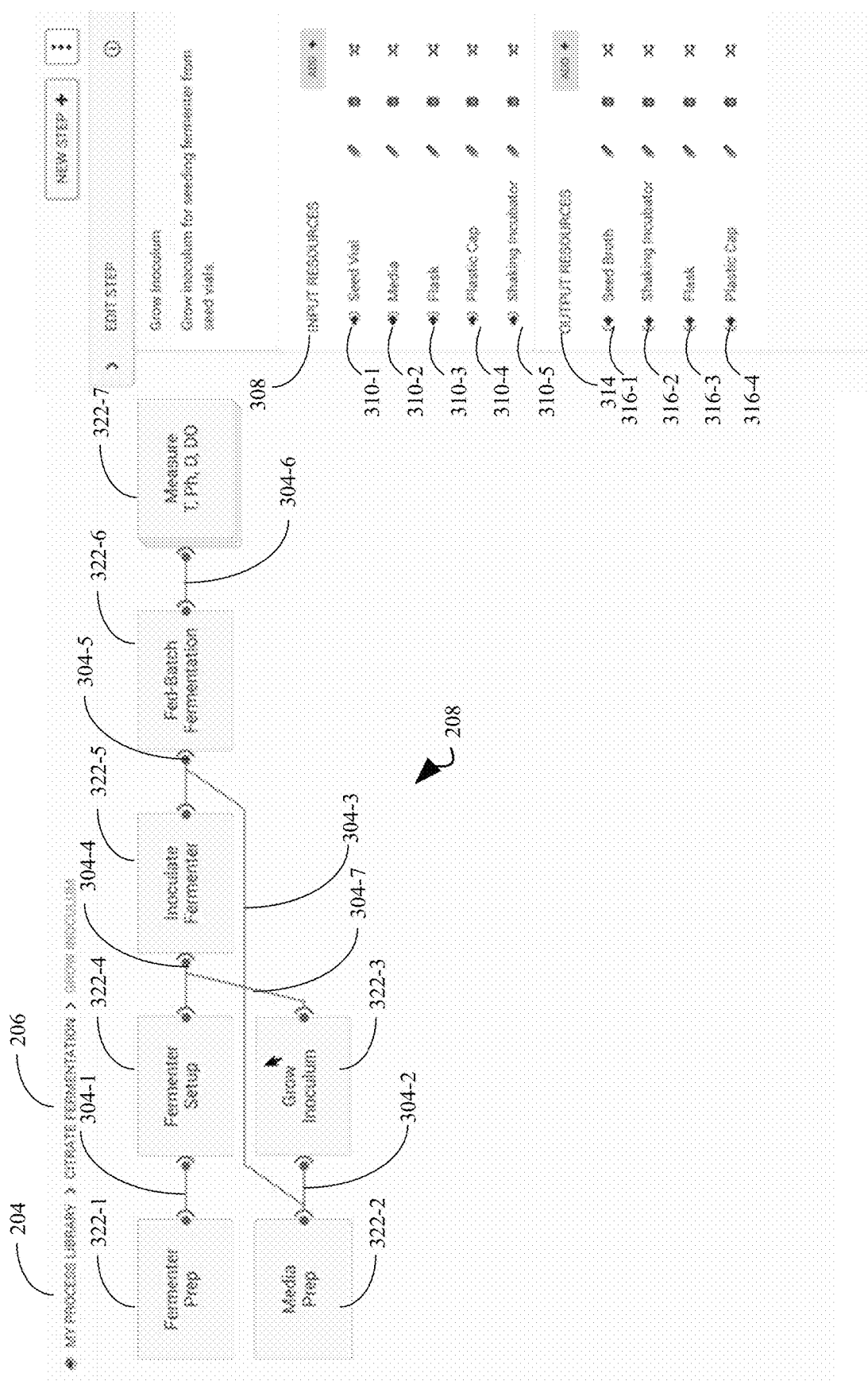
FIG. 8 illustrates the hypergraph of FIG. 7 in which a grow inoculum stage is highlighted in accordance with an embodiment of the present disclosure.
Figure 9:
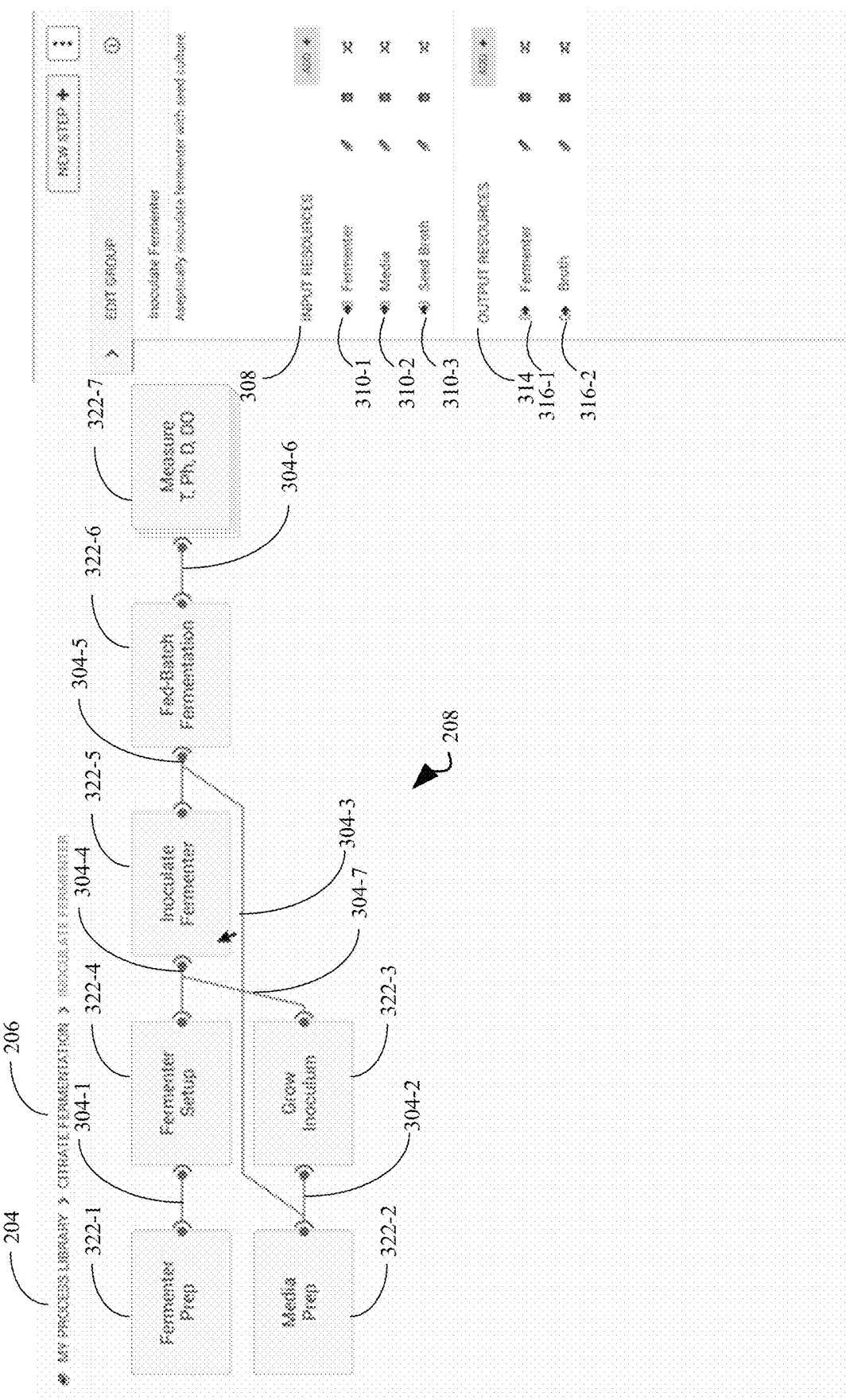
FIG. 9 illustrates the hypergraph of FIG. 7 in which a inoculate fermenter stage is highlighted in accordance with an embodiment of the present disclosure.
Figure 10:
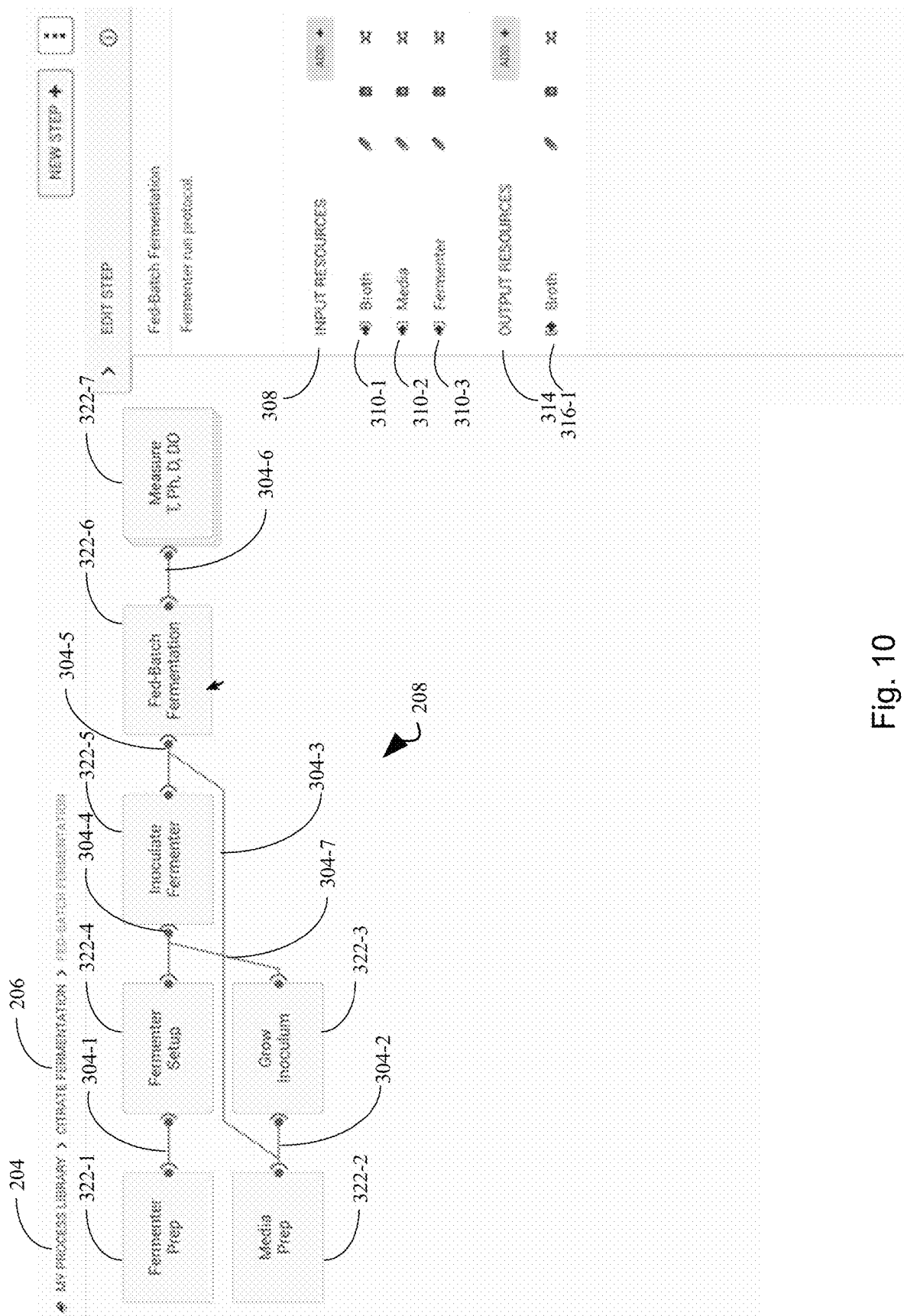
FIG. 10 illustrates the hypergraph of FIG. 7 in which a fed-batch fermentation stage is highlighted in accordance with an embodiment of the present disclosure.

Each edge 304 is associated with a set of parameterized resource inputs 308. At least one parameterized resource input 310 in the set of parameterized resource inputs 308 is associated with one or more input properties 312. The one or more input properties include an input specification limit 314. Each edge 304 is also associated with a set of parameterized resource outputs 314. At least one parameterized resource output 316 in the set of parameterized resource outputs is associated with one or more output properties. The one or more output properties include a corresponding output specification limit. FIG. 7 illustrates the set of parameterized resource inputs 308 and the set of parameterized resource outputs 314 for an edge connected to node 304-4 "Fermenter Setup." FIG. 8 illustrates the set of parameterized resource inputs 308 and the set of parameterized resource outputs 314 for an edge connected to the node 304-3 "Grow Inoculum." FIG. 9 illustrates the set of parameterized resource inputs 308 and the set of parameterized resource outputs 314 for an edge connected to the node 304-5 "Inoculate Fermenter." FIG. 10 illustrates the set of parameterized resource inputs 308 and the set of parameterized resource outputs 314 for an edge connected to the node 304-6 "Fed-Batch Fermentation." In some embodiments, a user can simply click on a node 322 and/or edge 304 to see their inputs and outputs. Moreover, unstructured data in the form of videos, pictures, or comments can be added to nodes 322 and/or edges 304. For example, a video showing the proper way to perform a procedure associated with a node can be linked to a node by simply dragging an icon link to the video onto the representation of node 322. For example, a video on the proper way perform a fermenter setup can be dragged onto the "Fermenter Setup" node 322-4 of FIG. 7. Thereafter, when a user clicks on node 322-4, the video is played unless otherwise requested by the user.

Each respective node 322 in the plurality of nodes specifies that the set of parameterized resource outputs of an edge in the plurality of edges is included in the set of parameterized resource inputs of at least one other edge in the plurality of edges.

Figure 11:
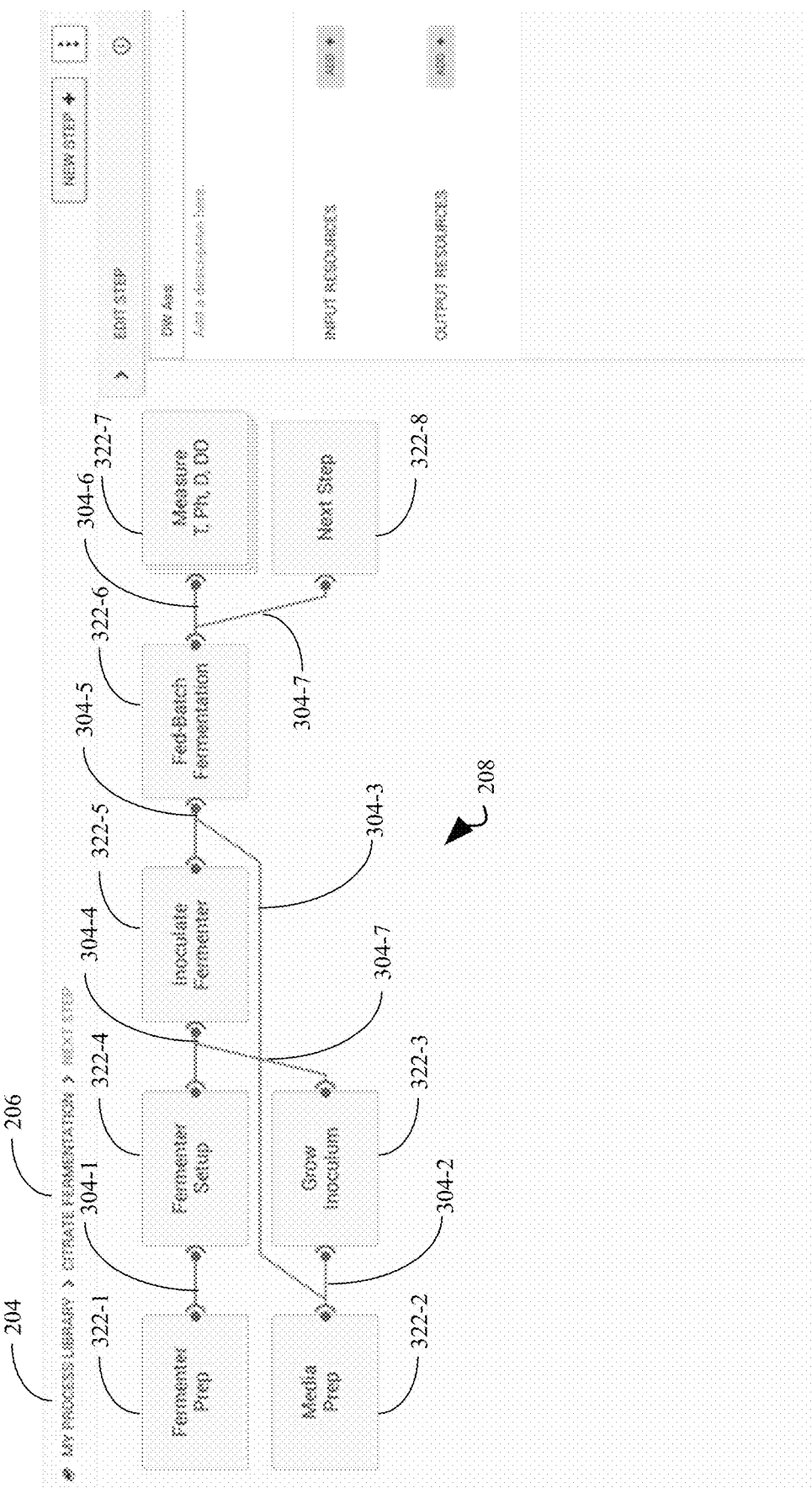
FIG. 11 illustrates the hypergraph of FIG. 7 in which a new stage is being added to the hypergraph of FIG. 7 in accordance with an embodiment of the present disclosure.
Figure 12:
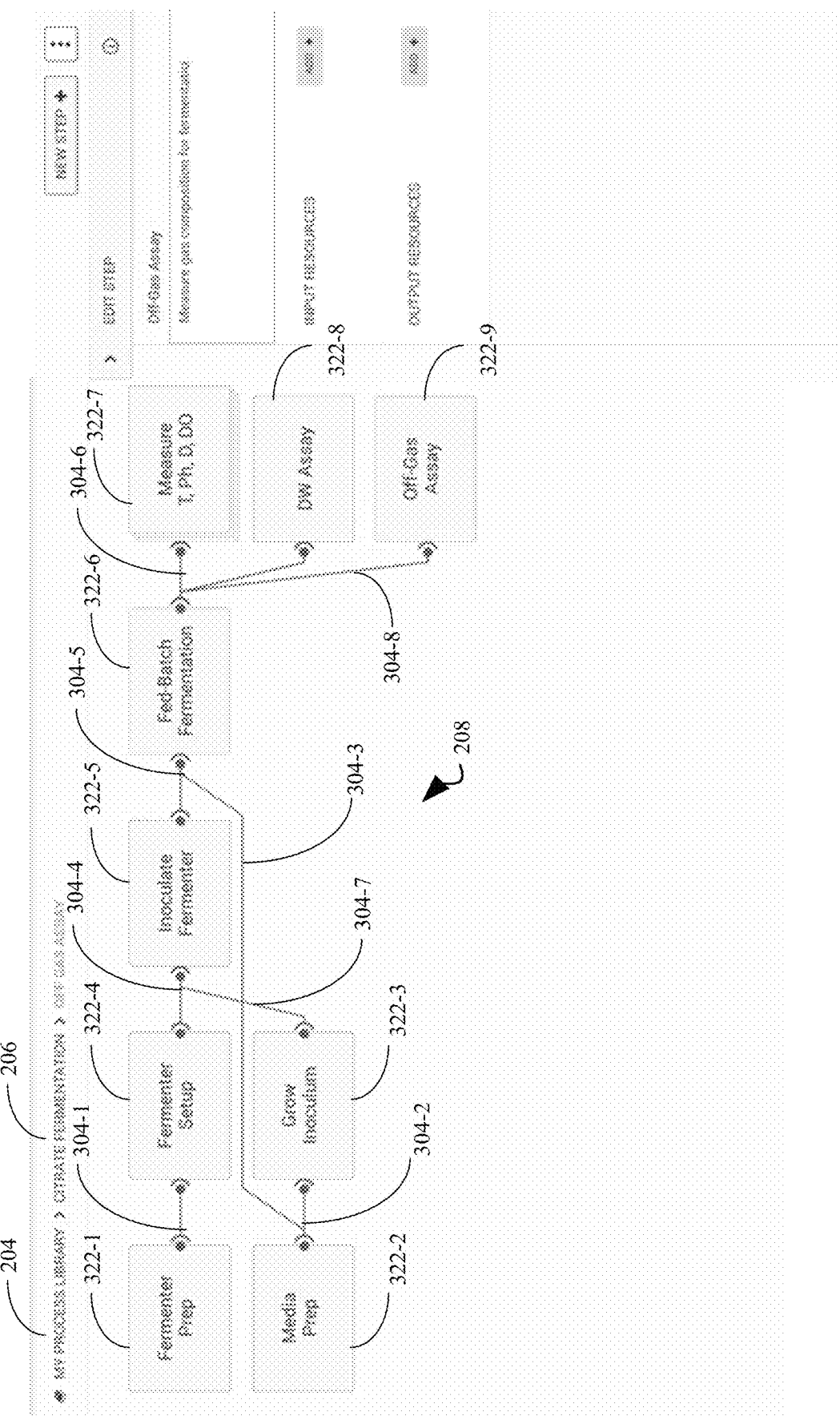
FIG. 12 illustrates the hypergraph of FIG. 11 in which a DW Assay stage and Off-Gas Assay stage are added to the hypergraph of FIG. 7 in accordance with an embodiment of the present disclosure.
Figure 13:
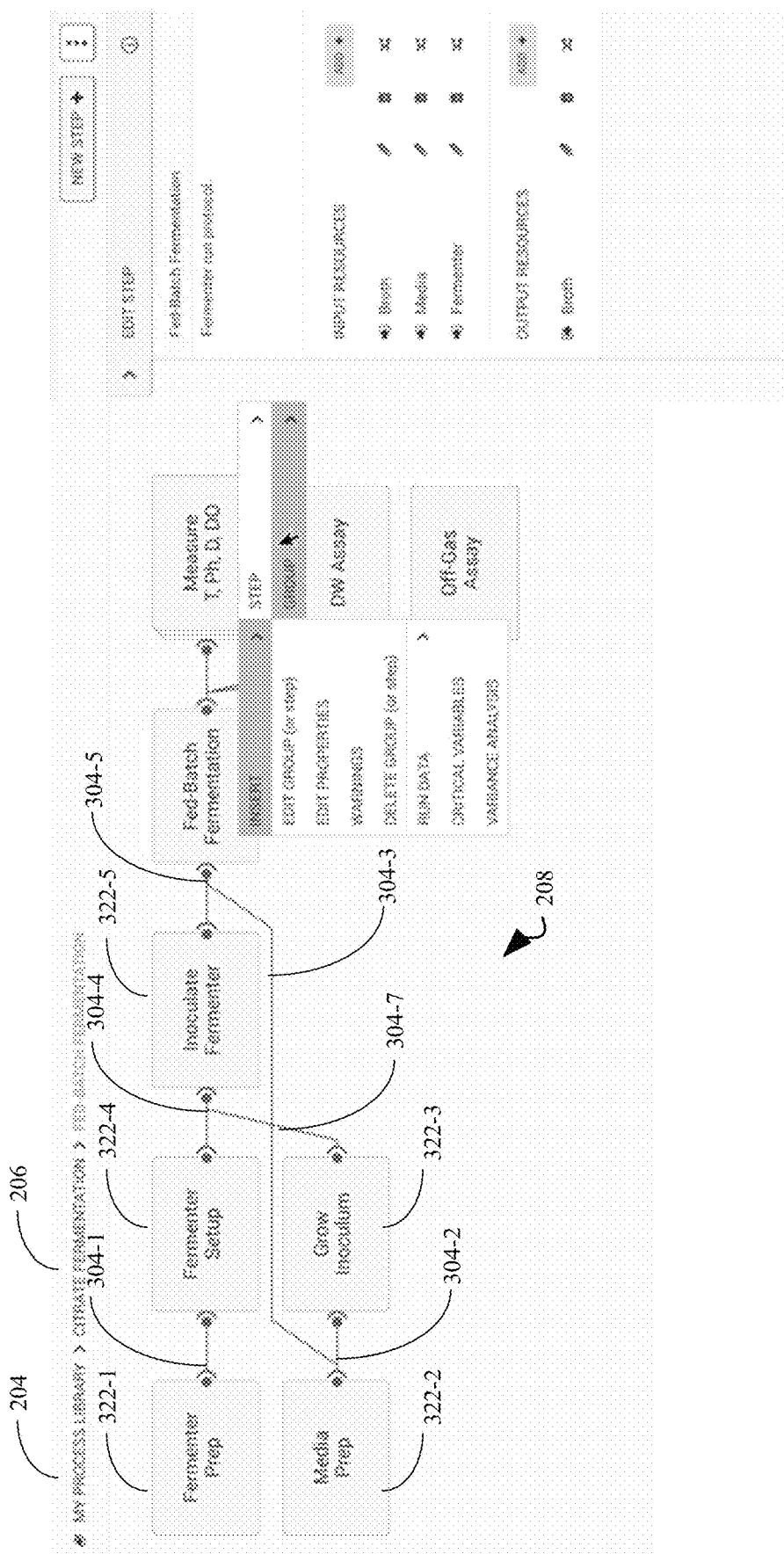
FIG. 13 illustrates the hypergraph of FIG. 12 in which a new group of stages is added to the hypergraph of FIG. 7 in accordance with an embodiment of the present disclosure.
Figure 14:
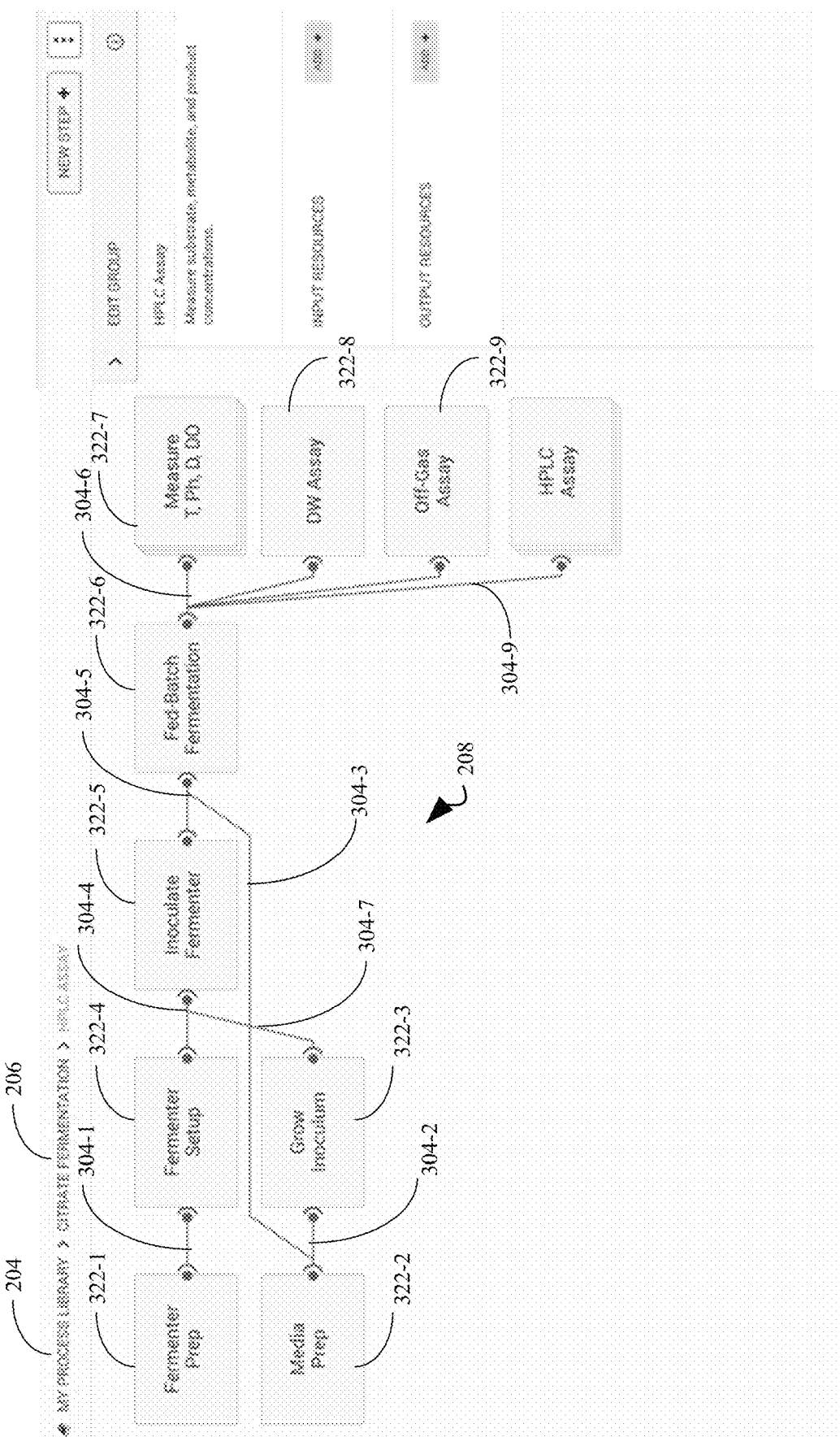
FIG. 14 illustrates the hypergraph of FIG. 13 in which the new group of stages is defined in accordance with an embodiment of the present disclosure.
Figure 15:
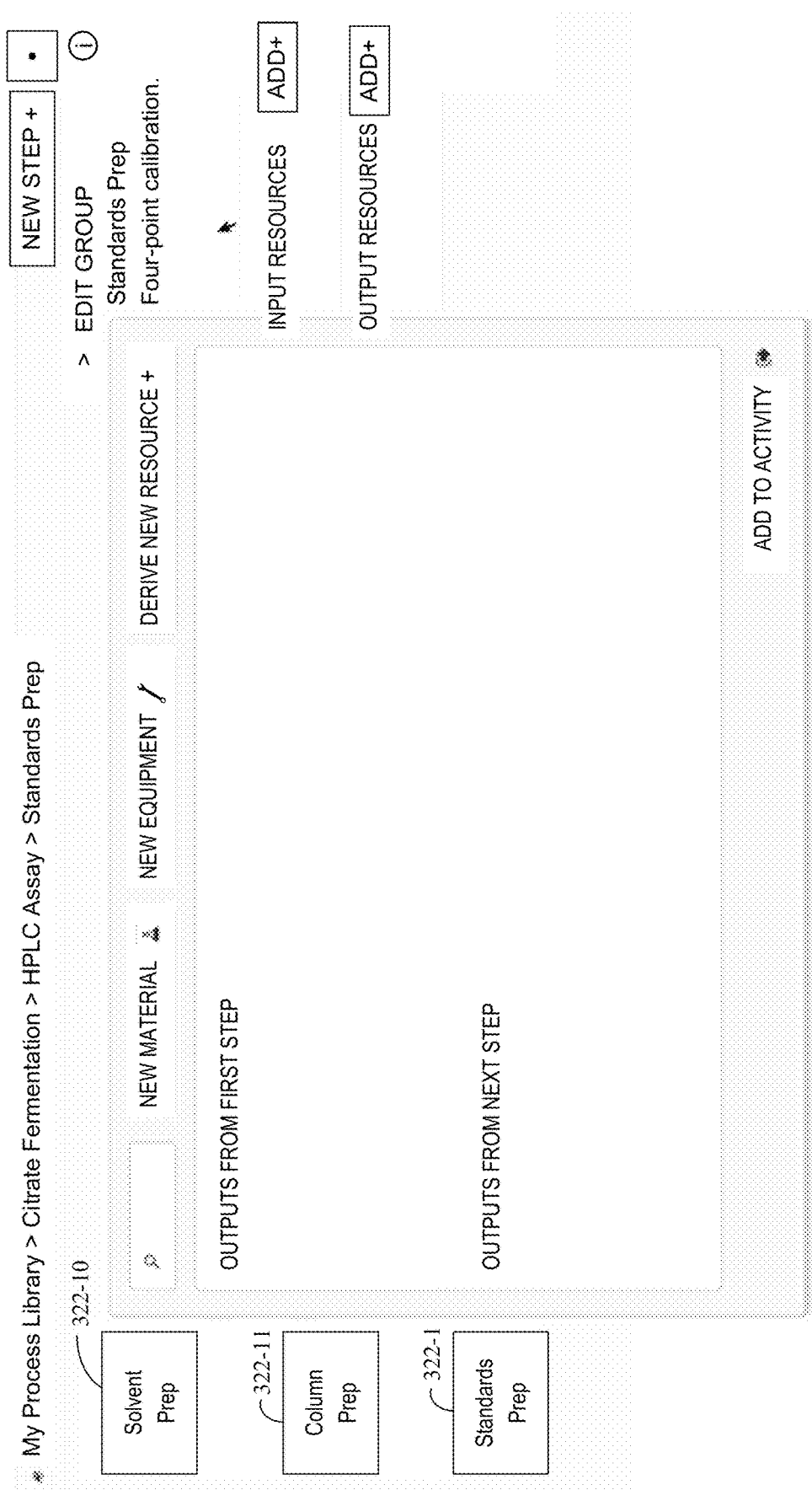
FIG. 15 illustrates how the new group of stages defined in the hypergraph of FIGS. 13 and 14 is defined in accordance with an embodiment of the present disclosure.
Figure 16:
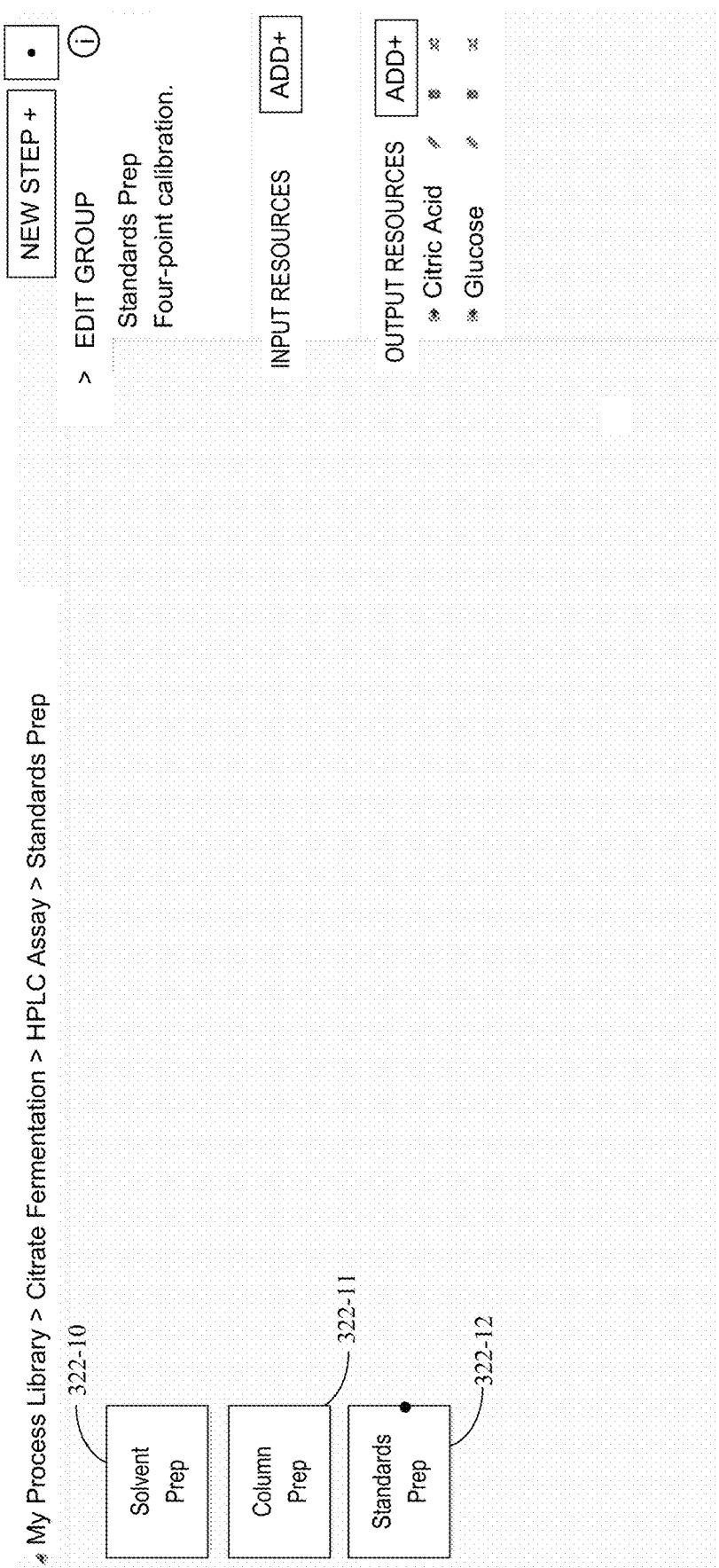
FIG. 16 illustrates how the new standards prep stage in the new group of stages defined in the hypergraph of FIGS. 13 and 14 is defined in accordance with an embodiment of the present disclosure.

FIGS. 11 and 12 illustrate adding new nodes 322-8 "DW Assay" and 322-9 "Off-Gas ssay" to an existing hypergraph and FIGS. 13 and 14 illustrate adding a group of nodes entitled "HPLC Assay" to the hypergraph. The HPLC Assay group is an extension of the existing hypergraph of FIG. 7 and includes nodes and edges of this extension. Referring to FIGS. 15 and 16, HPLC Assay begins with three initial nodes, node 322-10 "Solvent Prep," node 322-11 "Column Prep," and node 322-12 "Standards Prep." In some embodiments, the names of nodes are chosen by a user from a database of allowed node names in order to ensure conformity in node names. In some embodiments, the names of edge inputs 310 and 316 are also chosen by a user from a database of allowed edge input and output names in order to ensure conformity in edge input and output names. In some embodiments, the names of edge input properties 312 and edge output properties 318 are also chosen by a user from a database of allowed edge input property names and edge output property names in order to ensure their conformity. FIG. 17 illustrates the portion of the hypergraph 302 encompassed by "HPLC Assay" after more nodes have been defined in this portion of the hypergraph. The node "Instrument Calibration" 304-14 is selected in FIG. 17. Accordingly, a set of parameterized resource inputs 308 and the set of parameterized resource outputs 314 for an edge connected to node 304-14 are shown on the right side of FIG. 17.

As discussed above, versions 208 of a process 206 are related to each other. In some embodiments, each version 208 of a process 604 produces the same product. However, typically a first version and a second version in a respective plurality of versions for a process differ from each other in some way, such as in a number of nodes, a number of edges, a process stage label of an edge, a parameterized resource input in a set of parameterized resource inputs, a parameterized resource output in a set of parameterized resource outputs, a parameterized resource input specification limit, or a parameterized resource output specification limit, to name some possibilities (604).

To illustrate a set of parameterized resource inputs 308, in some embodiments, the set of parameterized resource inputs 308 for an edge 304 in the plurality of edges of a hypergraph 302 for a process version 208 in the respective plurality of process versions comprises a first 310-1 and second parameterized resource input 310-2. The first parameterized resource input specifies a first resource and is associated with a first input property 312-1 (606). The second parameterized resource input 310-2 specifies a second resource and is associated with a second input property 312-2. In some embodiments, the first input property is a viscosity value, a purity value, composition value, a temperature value, a weight value, a mass value, a volume value, or a batch identifier of the first resource (608). FIG. 7 illustrates. An edge connected to node 322-4 "Fermenter Setup" includes in its associated set of parameterized resource inputs 308 a fermenter 310-3 and a waste bottle 310-5 among other resource inputs. Although not shown in FIG. 7, the fermenter 310-3 is associated with a first input property, such as a size of the fermenter or a fermenter make/model number. Furthermore, waste bottle 310-5 is associated with a second input property, such as a size of the waste bottle 310-5 or a waste bottle 310-5 make and model number.

In some embodiments a resource input 310 is a single resource. For instance, in FIG. 7, resources 310-1 through 310-10 are all examples of single resources. In some embodiments, a resource input 310 is a composite resource. Examples of composite resources include, but are not limited, to mixtures of compositions (e.g., media, broth, etc.) and multi-component equipment.

Referring to FIG. 6B, in some embodiments, the set of parameterized resource inputs 308 for a first edge 304 in the plurality of edges of a hypergraph 302 of a process version 208 in the respective plurality of process versions comprises a first parameterized resource input 310 and this first parameterized resource input specifies a process condition associated with the corresponding stage of the process associated with the first edge 304 (612). For example, in some embodiments, this process condition is a temperature, an exposure time, a mixing time, a concentration, a type of equipment or a batch identifier (614).

As noted above, for a given edge, at least one of the parameterized resource outputs in the set of parameterized resource outputs for the edge is associated with one or more output properties, and the one or more output properties includes a corresponding output specification limit. In some embodiments, this corresponding output specification limit comprises an upper limit and a lower limit for the corresponding parameterized resource output (616). To illustrate, an example of an output property is pH of a composition. In such an example, the output specification limit specifies the allowed upper limit for the pH of the composition and the allowed lower limit for the pH of the composition. In alternative embodiments, this corresponding output specification limit comprises an enumerated list of allowable types (618). To illustrate, an example of an output property is a crystallographic orientation of a material. In such an example, the output specification limit specifies an enumerated list of allowed crystallographic orientations for the material.

In some embodiments, the one or more processes in a hypergraph data store is, in fact, a plurality of processes. Further, a first process in the plurality of processes results in a first product and a second process in the plurality of processes results in a different second product (620). For instance, a first process in the hypergraph data store may result in the manufacture of one type of composition and another process in the hypergraph data store may result in the manufacture of another composition.

Referring to block 622 of FIG. 6B, a run data store 210 is also maintained. The run data store comprises a plurality of process runs 402. In typical embodiments, a process version 208 is locked before a process run 402 for the process version 208 is executed so that no further changes can be made to the process version 208. If changes to underlying process 206 are desired, a new process version 208 is defined in such embodiments.

Figure 20:
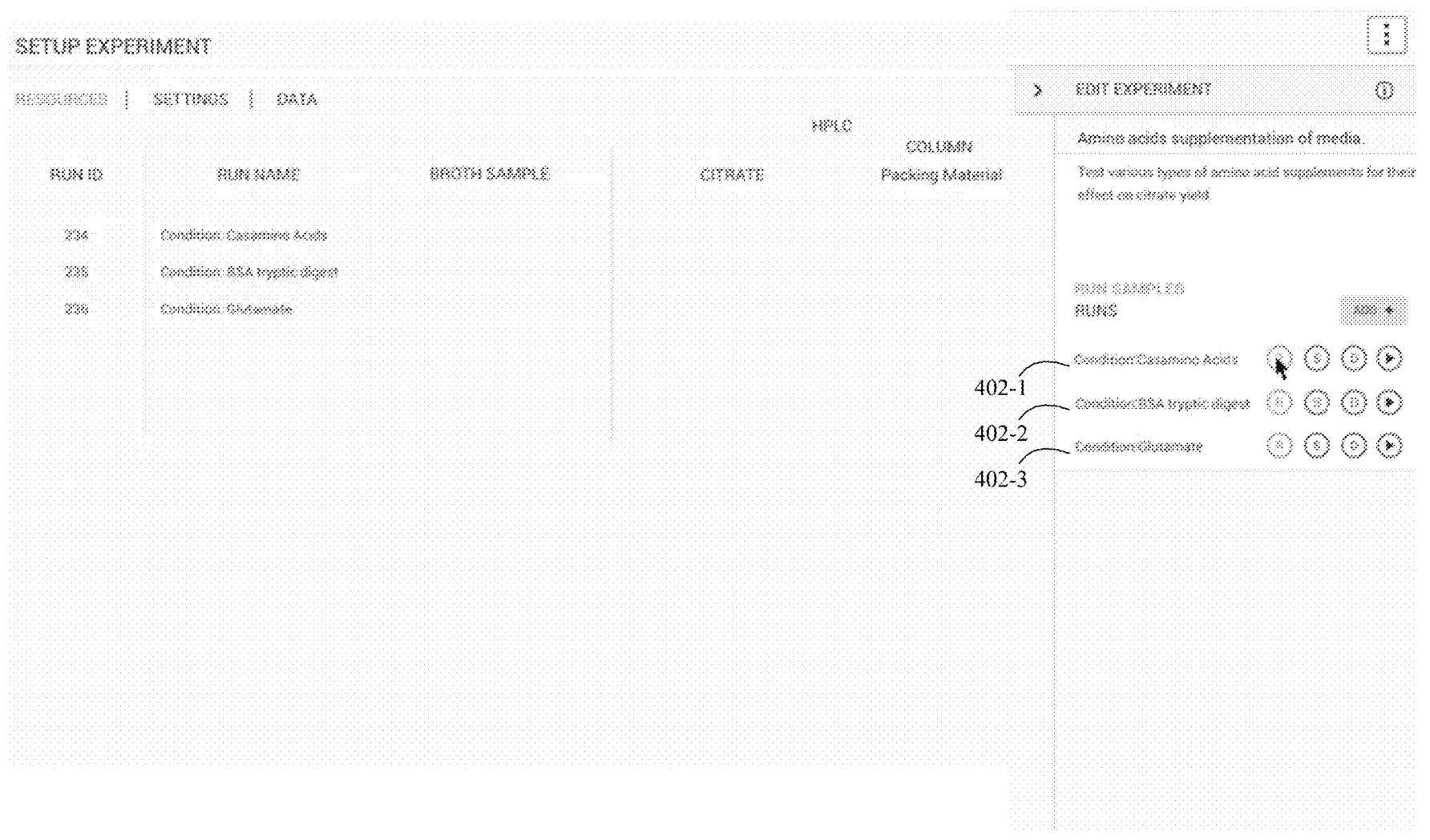
Figure 21:
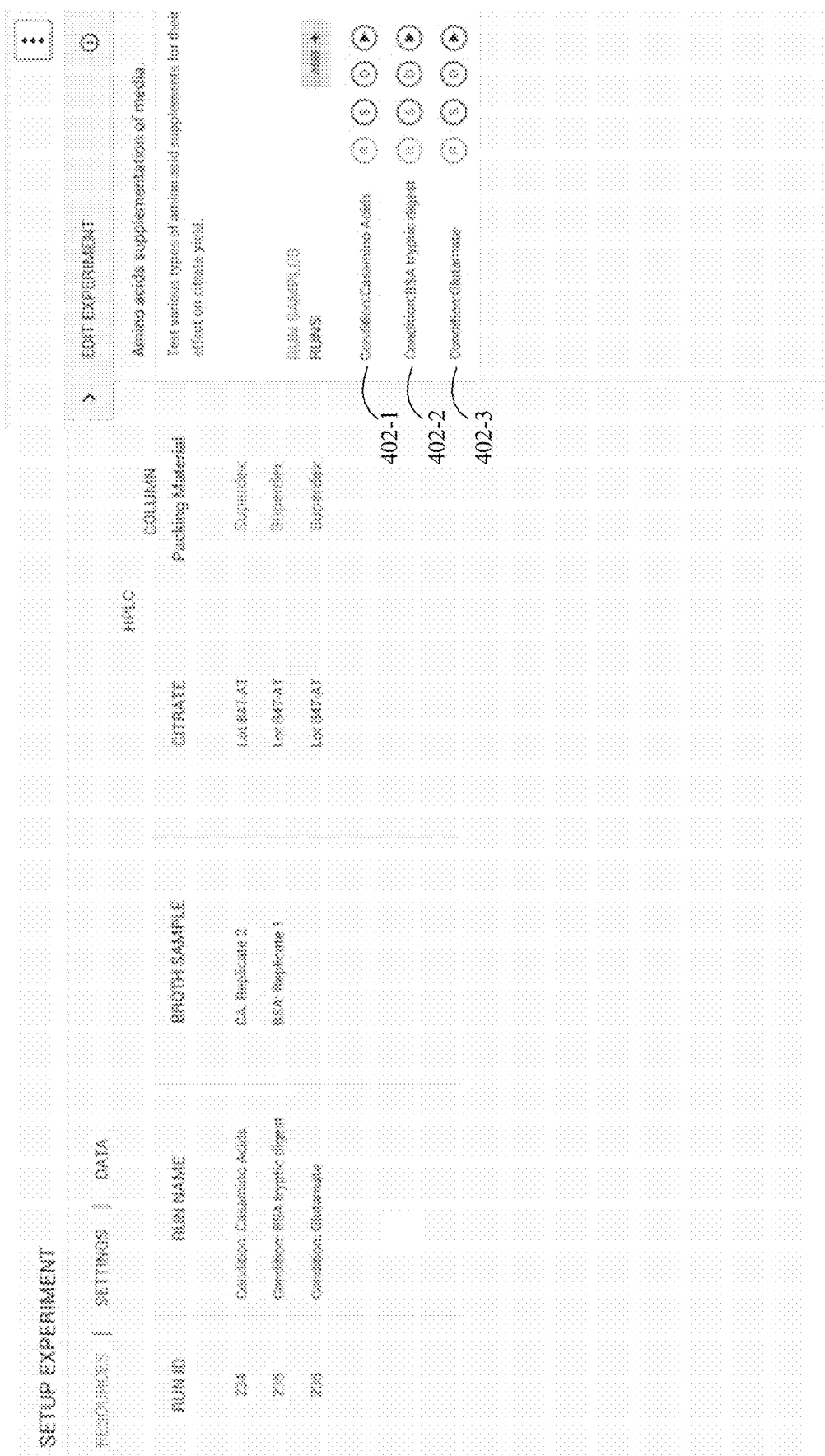
FIG. 21 further illustrates setting up process runs using the new group of stages defined in the hypergraph of FIGS. 13 and 14 in accordance with an embodiment of the present disclosure.
Figure 22:
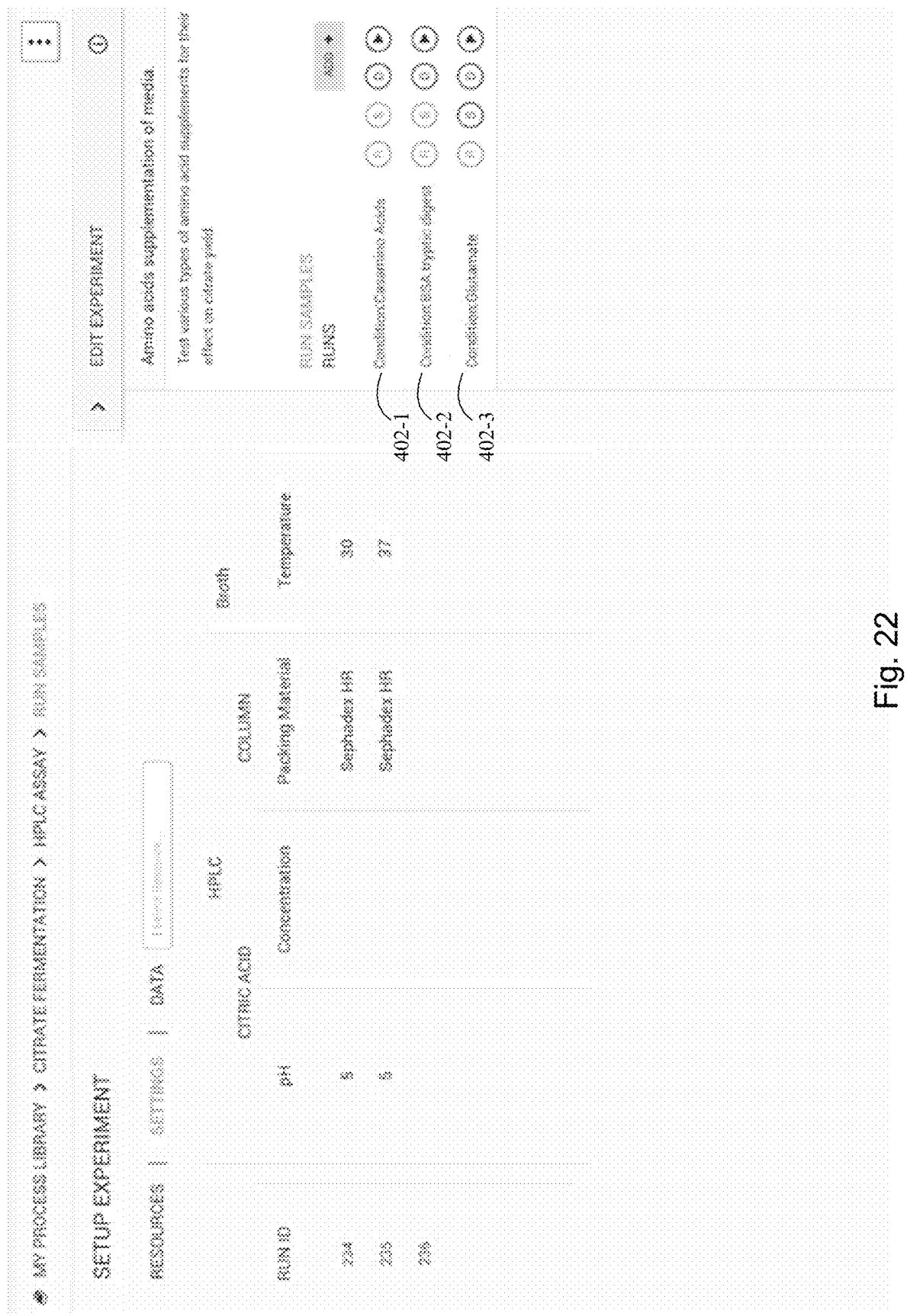
FIG. 22 further illustrates setting up process runs using the new group of stages defined in the hypergraph of FIGS. 13 and 14 in accordance with an embodiment of the present disclosure.

Each process run 402 comprises an identification of a process version 404 (208) in a plurality of versions for a process 206 in the one or more processes, as illustrated in FIG. 4. Furthermore, values for the respective set of parameterized resource inputs 408 of a first edge 406 (304) in the hypergraph 302 of the respective version and their associated input properties 410 are provided in a process run. More precisely, values for the properties of the parameterized resource inputs in the set of parameterized resource inputs 408 of an edge 406 in the hypergraph 302 of the respective version are provided in a process run. FIGS. 20 through 22 illustrate setting up three process runs, 402-1, 402-2, and 402-3 for a particular edge of a process version based upon the hypergraph illustrated in FIG. 19. In FIG. 22, values for properties of the parameterized resource inputs "Citric Acid" and "Column" are entered. In particular, referring to FIG.

Figure 23:
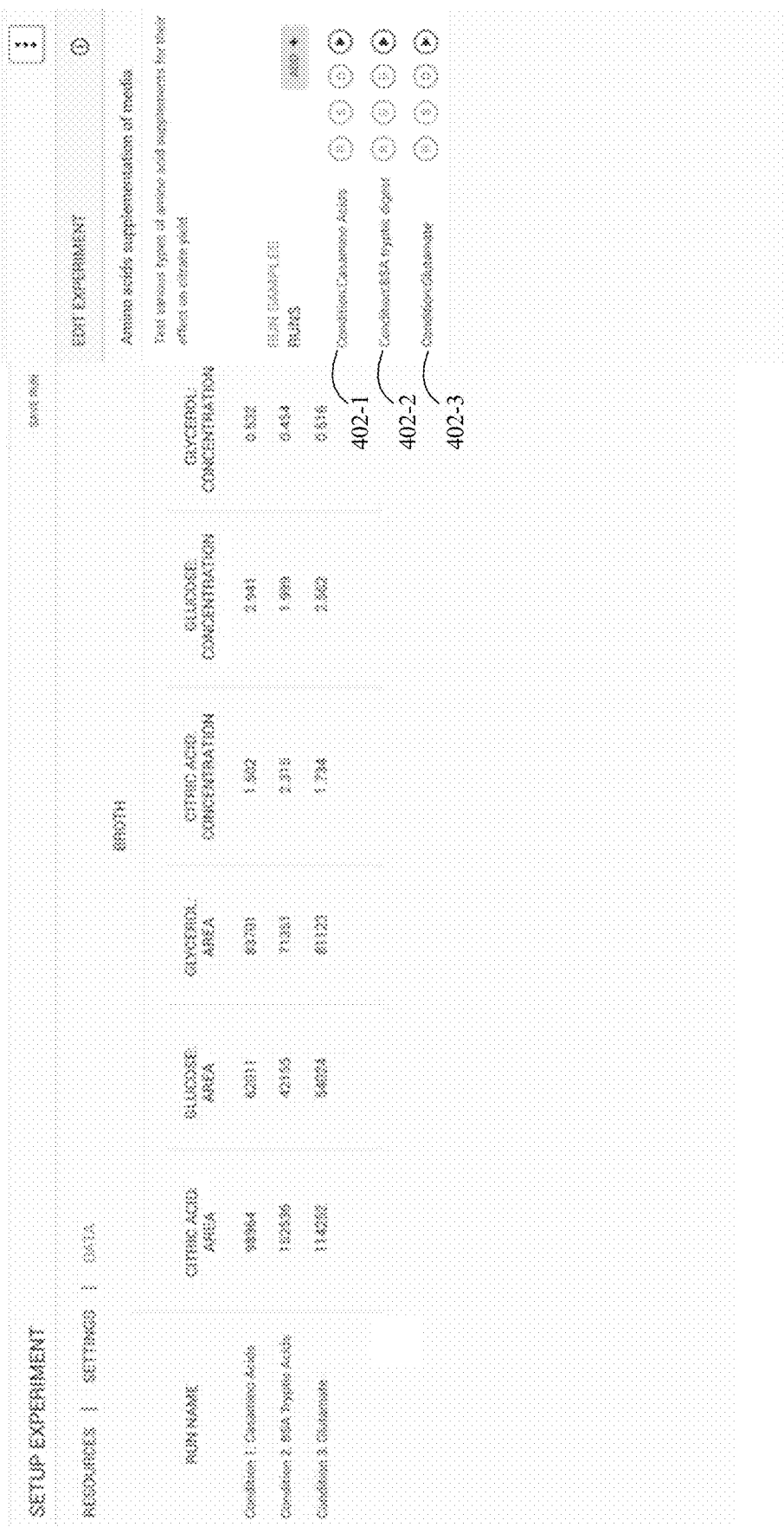
FIG. 23 further illustrates the raw data for three different process runs of the new run samples stage in the new group of stages defined in the hypergraph of FIGS. 13 and 14 in accordance with an embodiment of the present disclosure.
Figure 24:
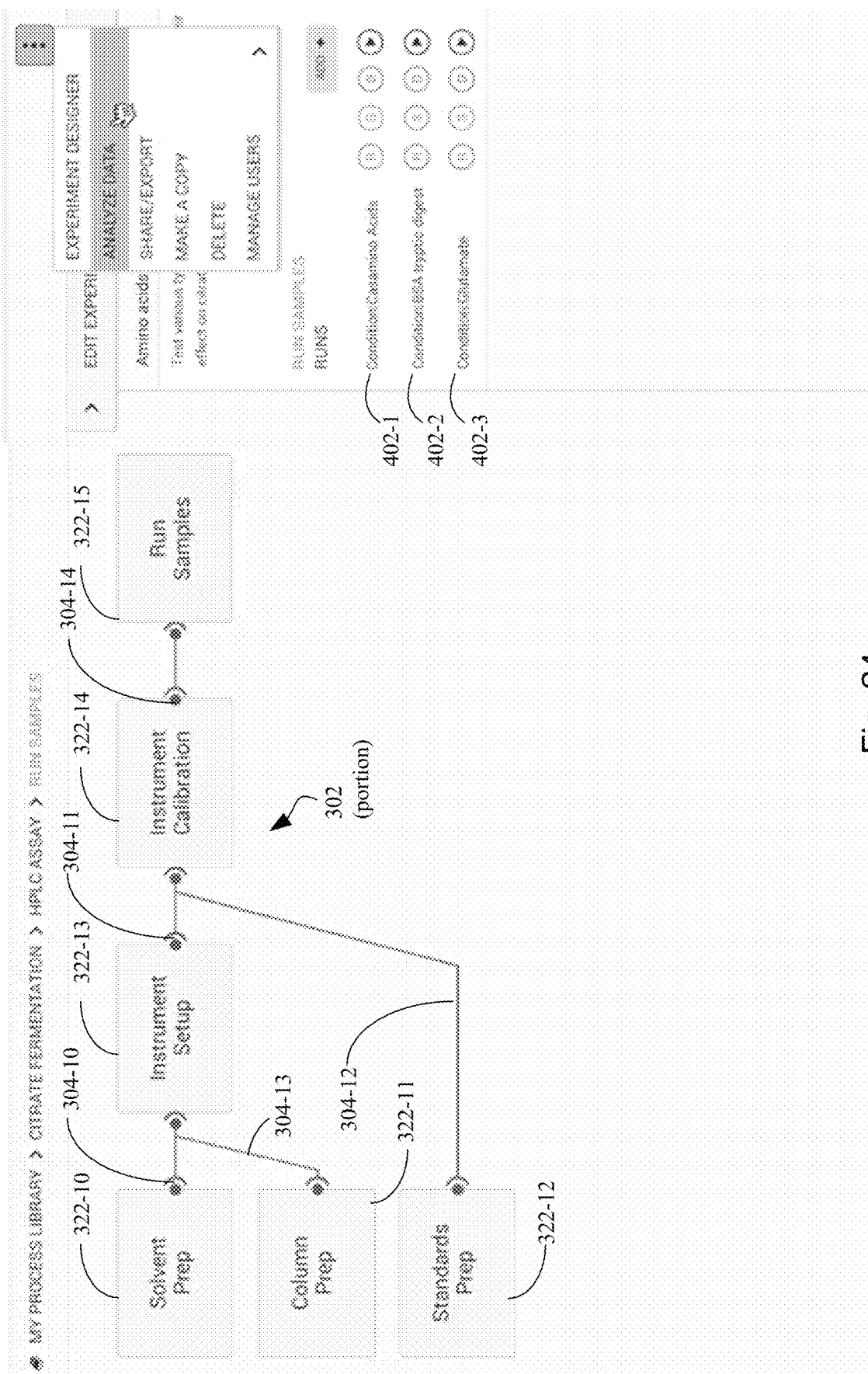
FIG. 24 further illustrates selecting to analyze the data illustrated in FIG. 23 in accordance with an embodiment of the present disclosure.
Figure 25:
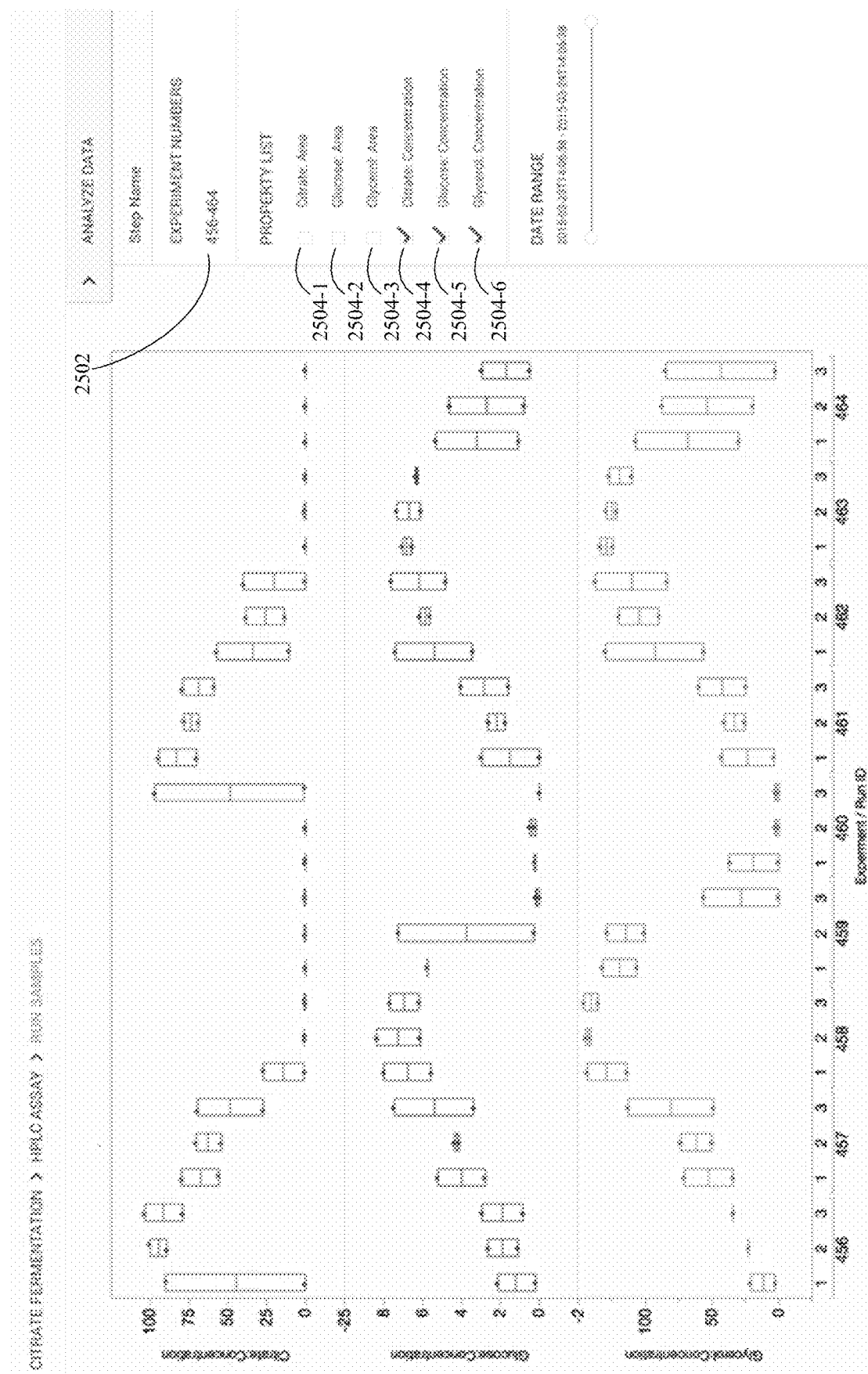
FIG. 25 illustrates analysis of the data illustrated in FIG. 23 in accordance with an embodiment of the present disclosure.
Figure 26:
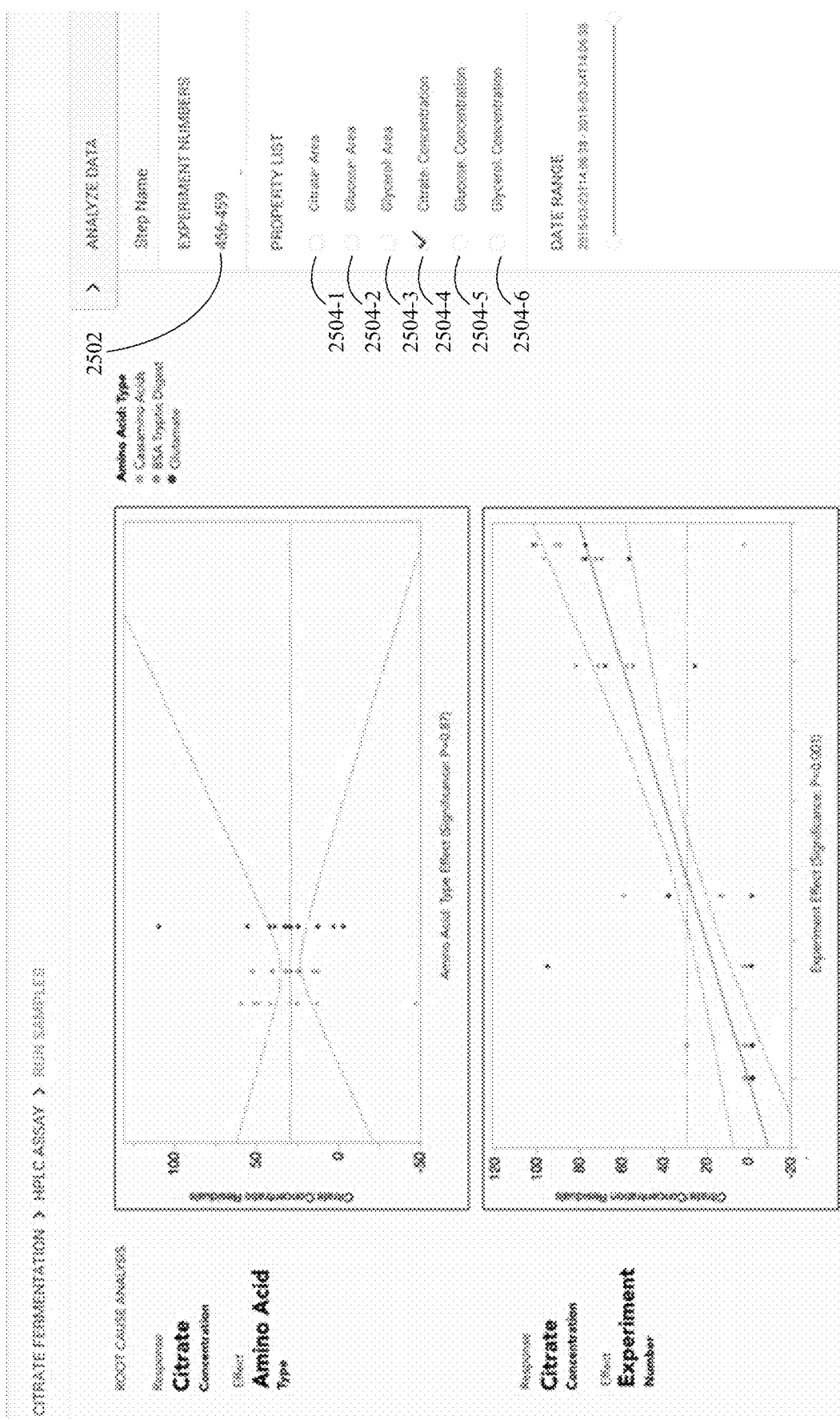
FIG. 26 illustrates further analysis of the data illustrated in FIG. 23 in accordance with an embodiment of the present disclosure.

22, for the property "pH" of parameterized resource input "Citric Acid" is set to 5 and the value for the property "packing material" for the parameterized resource input "Column" is set to "Saphadex HR." FIG. 23 shows raw data from such process runs. FIG. 24 shows selecting to analyze these process runs and FIG. 25 shows the resulting analysis of such process runs. Conveniently, as illustrated in FIGS. 25 and 26, query 2502 and toggles 2504 can be used to select which properties (e.g., input or output properties of the edges of the underlying process versions) of which process runs are viewed. Furthermore, referring to FIG. 26, calculated properties (e.g., amount of final product divided a quantity of input material) based upon the raw data from such process runs as well as correlations between calculated properties can be viewed. Advantageously, because of the structured way in which process runs are defined based on an edge of underlying process versions, it is possible to automatically set up predefined process calculations (e.g. a process yield calculation) of the raw data (e.g., the raw data illustrated in FIG. 23) of executed process runs so that when new process runs are performed such process calculations are automatically applied to the raw data. This greatly reduces the labor in analyzing process runs.

Each process run 402 comprises the respective set of parameterized resource outputs 412 of the subject edge 304 in the hypergraph 302 of the respective version 208. The process run 402 further comprises obtained values of at least one output property of a parameterized resource output in the respective set of parameterized resource outputs of the node.

In some embodiments, the run data store 210 further comprises a genealogical graph 420 showing a relationship between (i) versions of a single process in the plurality of versions of a process that are in the plurality of process runs or (ii) versions of two or more processes in the respective plurality of versions of two or more processes that are in the plurality of process runs (624). For instance, in some embodiments, a first process version 404 in a process set 420 and a second process version 404 in the process set 420 have the same hypergraph but an output property, output specification limit, input property, or input specification limit to one of the edges in the hypergraph is different. In another example, a first process version 404 in a process set 420 and a second process version 404 in the process set 420 have hypergraphs that have all but one, all but two, all but three, or all but four edge and/or node, and so forth, in common. The genealogical graph provides an advantageous way of discerning the relationship between the various process versions of a given process.

Figure 6C:
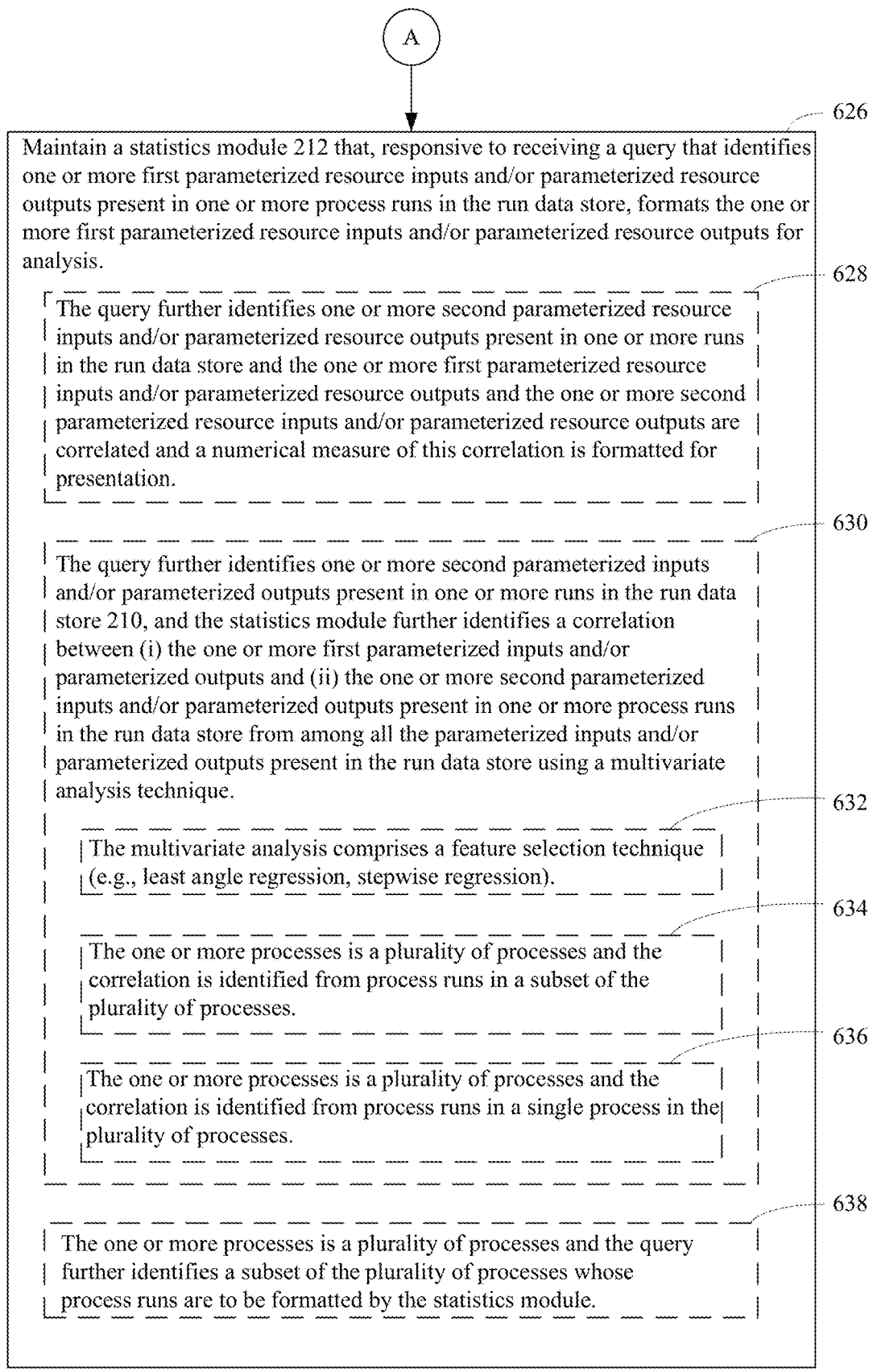

Turning to FIG. 6C, a statistics module 212 is also maintained (626). The statistics module 212 leverages the structure of run data store 210 and hypergraph data store 204 to enable analytics of process runs. In particular, the statistics module 212 combined with the unique structure of run data store 210 and hypergraph data store 204 provides an advantageous platform for supporting statistical process control (SPC) over the many disparate components of a process 206 and thus provides powerful tools for analyzing and stabilizing such processes. SPC is a method of quality control which uses statistical methods. It is applied in order to monitor and control processes. Monitoring and controlling processes ensures that they operate at their full potential. For instance, at its full potential, a process 206 can make as much conforming product as possible with a minimization of waste. SPC can be applied to any process 206 where the "conforming product" (product meeting specifications) output can be measured. SPC makes use of control charts, a focus on continuous improvement and the design of process runs 402 (e.g., experiments). See, for example, Barlow and Irony, 1992, "Foundations of statistical quality control" in Ghosh, M. & Pathak, P. K. (eds.) *Current Issues in Statistical Inference: Essays in Honor of D. Basu*, Hayward, Calif., Institute of Mathematical Statistics, pp. 99-112, which is hereby incorporated by reference.

Advantageously, rather than having to track down the disparate data in disparate forms associated with a process or, rather the process runs that make use of the nodes and/or edges of the process, in order to support SPC, the statistics module 212, responsive to receiving a query that identifies one or more first parameterized resource inputs and/or parameterized resource outputs present in one or more process runs in the run data store, is able to easily retrieve and format the one or more first parameterized resource inputs and/or parameterized resource outputs for analysis. In some embodiments, for example, the data is formatted as one or more tab delimited files, CSV files, EXCEL spreadsheets, GOOGLE Sheets, and/or in a form suitable for relational databases. In particular, the data is structured to ensure that such data can be efficiently analyzed so that potential correlations are not overlooked in subsequent analysis. An example of such analysis that is performed as part of SPC is correlation analysis such as the root cause analysis illustrated in FIG. 26. Root cause analysis is described, for example, in Wilson et al., 1993, *Root Cause Analysis: A Tool for Total Quality Management*, Milwaukee, Wis., ASQ Quality Press. pp. 8-17, which is hereby incorporated by reference. Leading up to the root cause analysis illustrated in FIG. 26, a query identifies one or more first parameterized resource inputs (e.g., amino acid type) and/or parameterized resource outputs (e.g., citrate concentration) present in one or more process runs in the run data store. Data for the one or more first parameterized resource inputs and/or parameterized resource is then formatted and outputted for analysis. With this formatted data, an analysis, such as the root cause analysis of FIG. 26, is conducted. In some embodiments, the query results are formatted for a third party statistical analysis package such as JMP (SAS, Buckinghamshire, England, http://www.jmp.com/en_dk/software.html). Analysis using such a third party statistical analysis package typically results in proposals for new process versions, in which nodes and/or edges are added or removed, or the inputs or outputs to existing edges are further defined or redefined, in order to identify and remove unwanted process variability (e.g., to stabilize the process).

The query can be of any of the resource inputs or outputs available for any combination of process versions of any combination of the one or more processes in the run data store 210 or properties of these inputs or outputs. As such, in some embodiments, the query further identifies one or more second parameterized resource inputs and/or parameterized resource outputs present in one or more runs in the run data store (or properties thereof) and the one or more first parameterized resource inputs and/or parameterized resource outputs and the one or more second parameterized resource inputs and/or parameterized resource outputs are correlated and a numerical measure of this correlation is formatted for presentation (628). In some embodiments, the numerical measure of correlation is on a scale between a low number and a high number, where the low number (e.g., zero) is indicative of no correlation and the high number (e.g., one) is indicative of complete correlation across the one or more first parameterized resource inputs and/or parameterized resource outputs and the one or more second parameterized resource inputs and/or parameterized resource outputs.

In some embodiments, the query further identifies one or more second parameterized inputs and/or parameterized outputs present (or their properties) in one or more runs in the run data store, and the statistics module further identifies a correlation between (i) the one or more first parameterized inputs and/or parameterized outputs and (ii) the one or more second parameterized inputs and/or parameterized outputs present in one or more process runs in the run data store from among all the parameterized inputs and/or parameterized outputs present in the run data store using a multivariate analysis technique (630).

In some embodiments, the query identifies (i) one or more properties of one or more first parameterized inputs and/or parameterized outputs and (ii) one or more properties of one or more second parameterized inputs and/or parameterized outputs present in one or more runs in the run data store, and the statistics module further seeks a correlation between (i) the identified properties of the one or more first parameterized inputs and/or parameterized outputs and (ii) the identified one or more properties of the one or more second parameterized inputs and/or parameterized outputs present in one or more process runs in the run data store from among all the parameterized inputs and/or parameterized outputs present in the run data store using a multivariate analysis technique.

In some embodiments, the above processes invoke a multivariate analysis technique that comprises a feature selection technique (632) (e.g., least angle regression, stepwise regression). Feature selection techniques are particularly advantageous in identifying, from among the multitude of variables (e.g., values for input properties of inputs and values for output properties of outputs of nodes) present across sets of process runs, which variables (e.g., which input properties of inputs of which nodes and/or which output properties of outputs of which nodes) have a significant causal effect on a property of the product of the process (e.g., which of the variables are causal for poor reproducibility, poor yield, or conversely which of the variables are causal for excellent reproducibility, higher yield). Feature selection techniques are described, for example, in Saeys et al., 2007, "A review of feature selection techniques in bioinformatics," Bioinformatics 23, 2507-2517, and Tibshirani, 1996, "Regression and Shrinkage and Selection via the Lasso," J. R. Statist. Soc B, pp. 267-288, each of which is hereby incorporated by reference.

In some embodiments, the one or more processes are a plurality of processes and the correlation is identified from process runs in a subset of the plurality of processes (634). There is no requirement that each of the processes across which this correlation is identified make the same product in such embodiments. Such embodiments are highly advantageous because they allow for the investigation of undesirable process variability across process runs used in the manufacture of different products. For instance, some of the process runs used in a correlation analysis may manufacture biologic A and other process runs used in the same correlation analysis may manufacture biologic B. Correlation analysis that uses data from process runs for biologics A and B allows for the investigation of causes of variation that are product independent, such as, for example, a poorly defined fermentation step. For example, the sugar input into this fermentation step in the process runs for both biologics A and B may not be adequately defined to ensure process stabilization. Another example of a source of variation common to these process versions could be, for example, identified through correlation analysis across process runs for both biologics A and B, to a piece of equipment that is beginning to fail due to age. This is all possible because the disclosed systems and methods advantageously impose a consistent framework to the process runs that make different products. Thus, it is possible to aggregate process runs from across different products and perform cross-sectional filtering on any desirable set of inputs, input properties, outputs, and/or output properties, or specification limits thereof in these process runs, in order to, for example, discover sources of process variability that are independent (or dependent) of actual products made by such processes.

In some embodiments, the one or more processes are a plurality of processes and the correlation is identified from process runs in a single process in the plurality of processes (636). In such embodiments, each of the processes across which this correlation is identified makes the same product or produce the same analytical information. Such embodiments are used, for example, to precisely identify key sources of variability in the manufacture of the product or production of the analytical information through the process.

In some embodiments, the one or more processes is a plurality of processes and the query further identifies a subset of the plurality of processes whose process runs are to be formatted by the statistics module (638).

Turning to FIG. 6D, in some embodiments the statistics module 212 further provides suggested values for the one or more second parameterized inputs for one or more additional process runs of a first process in the one or more processes, not present in the run data store 210, based on a prediction that the suggested values for the one or more second parameterized inputs will alter a numerical attribute of the product of such process runs (640). In some embodiments, the numerical attribute is a reduction in variance in the one or more first parameterized inputs (642). Such an embodiment is utilized, for example, to identify situations in which the input space covered by the parameterized resource inputs 310 of the edges in the process runs is insufficient to find a correlation between certain process variables across the process runs previously executed with a sufficiently high degree of confidence, or any correlation at all. In these instances, suggested values for the input space that is covered by the parameterized resource inputs 310 are provided in order to test for a correlation. Such an embodiment is utilized, in other examples, when a potential problem is identified from analysis of existing process runs. In such embodiments, proposed additions to the input space not present in the process runs in the run data store are made that will facilitate determining whether the potential problem is real. If the potential problem is real, a new version of the process can be developed that further defines a state (property) of an input or output to an existing or new edge in the process in order to attempt to remove process state ambiguity and thereby stabilize the process.

In some embodiments the query identifies one or more third parameterized inputs and/or parameterized outputs present in runs in the run data store, and the above-described numerical attribute is a confidence in a correlation between the first parameterized inputs and/or outputs and the third parameterized inputs and/or outputs (644). In some embodiments, the one or more processes is a plurality of processes and the query further identifies a single process in the plurality of processes whose process runs are to be formatted by the statistics module (646). In such embodiments, all the process runs identified by the query make the same product or produce the same form of analytical information.

In some embodiments, the query further identifies a subset of process runs in the one or more processes (648). In such embodiments, there is no requirement that all the process runs identified by the query make the same product or produce the same form of analytical information. In fact, some of the process runs responsive to the query may make different products or produce different types of analytical information.

In some embodiments, the statistics module further identifies a correlation between (i) a first set comprising one or more process runs in the run data store and (ii) a second set comprising one or more process runs in the run data store, where process runs in the second set are not in the first set (650). For instance, in some embodiments, the correlation is computed across a plurality of parameterized inputs and/or parameterized outputs present in the first and second sets (652).

Figure 6E:
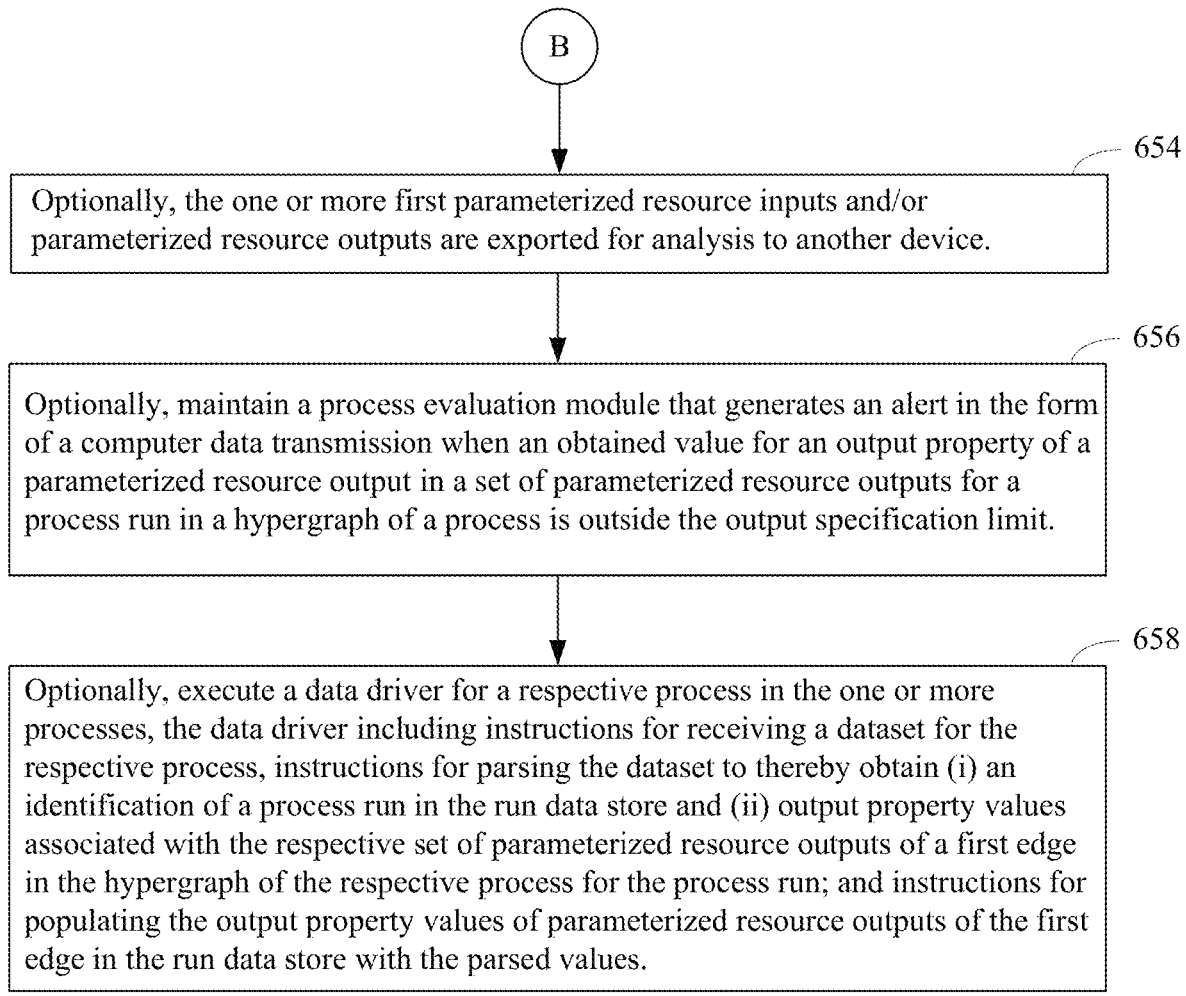

Referring to FIG. 6E, optionally, the one or more first parameterized resource inputs and/or parameterized resource outputs are exported for analysis to another device (654), e.g., as one or more tab delimited files, CSV files, EXCEL spreadsheets, GOOGLE Sheets, or in a form suitable for an SQL database.

Optionally, in some embodiments, as discussed above in relation to FIG. 5, in some embodiments a process evaluation module is maintained that generates an alert in the form of a computer data transmission when an obtained value for an output property of a parameterized resource output in a set of parameterized resource outputs for an edge in a hypergraph of a process version is outside the output specification limit (656).

Optionally, in some embodiments a data driver 218 is executed for a respective process in the one or more processes (658). The data driver includes instructions for receiving a dataset for the respective process and further includes instructions for parsing the dataset to thereby obtain (i) an identification of a process run in the run data store and (ii) output property values associated with the respective set of parameterized resource outputs of a first edge in the hypergraph of the respective process for the process run. The data driver further includes instructions for populating the output property values of parameterized resource outputs of the first edge in the run data store with the parsed values. For instance, in some embodiments, a sync engine associated with an edge in the process monitors an associated synced folder. In some embodiments, the sync engine associated with the edge runs as a background process (like Google Drive or Dropbox Sync) on any PC attached to an instrument associated with the node. When new instrument data files are added to the folder, the software parses and sends the data to the data driver 218. In some embodiments, association of the data sets to the correct protocol variables (parameterized resource outputs) of process runs is done via interaction with a user who is presented with a notification containing choices of process runs to which they have access. In some embodiments, the data driver 218 already contains the associations between values in the data sets and the correct protocol variables (parameterized resource inputs and/or outputs) of process runs.

In some embodiments, data in the set of parameterized resource outputs 314 that is communicated to the computer system for a node 504 of a process run 502 comprises a node identifier 406 (e.g., an instrument identifier such as a Bluetooth UUID), an identification of a process version 404, and a value for a parameterized resource input 410. In some embodiments the data is in the form of a JSON structure. See the Internet at json.org.

Another aspect of the present disclosure provides a computer system 200 comprising one or more processors 274, memory 192/290, and one or more programs stored in the memory for execution by the one or more processors. The one or more programs comprise instructions for maintaining a hypergraph data store 204. The hypergraph data store 204 comprises, for each respective process 206 in the one or more processes, a respective plurality of versions 208 of the respective process. Each respective version 208 comprises a hypergraph 302 comprising a plurality of nodes 322 connected by edges 304 in a plurality of edges. Each respective edge 304 in the plurality of edges comprises a process stage label 306 representing a respective stage in the corresponding process 206. Each respective edge 304 in the plurality of edges is associated with a set of parameterized resource inputs 308 to the respective stage 306 in the corresponding process 206. At least one parameterized resource input 310 in the set of parameterized resource inputs 308 is associated with one or more input properties 312. The one or more input properties include an input specification limit 314. Each respective edge 304 in the plurality of edges is also associated with a set of parameterized resource outputs 314 to the respective stage 306 in the corresponding process 206. At least one parameterized resource output 316 in the set of parameterized resource outputs 314 is associated with one or more output properties 318. The one or more output properties 318 include a corresponding output specification limit 320. Each respective node 322 in the plurality of nodes specifies that the set of parameterized resource outputs 314 of an edge 304 in the plurality of edges is included in the set of parameterized resource inputs 308 of at least one other edge 304 in the plurality of edges. The one or more programs further comprise instructions for maintaining a run data store 210. The run data store 210 comprises a plurality of process runs 402. Each process run 402 comprises (i) an identification of a process version 404 in the plurality of versions for a process 206 in the one or more processes, (ii) values for the respective set of parameterized inputs 408 (FIG. 4) of a first edge 304 in the hypergraph 302 of the respective version 208 and their associated input properties 410, (iii) the respective set of parameterized resource outputs 412 of the first edge 304, and (iv) obtained values of at least one output property 416 of a parameterized resource output 414 in the respective set of parameterized resource outputs of the first edge. The one or more programs further comprise instructions for maintaining a statistics module 212 that, responsive to receiving a query that identifies one or more first parameterized inputs and/or parameterized outputs present in one or more process runs 402 in the run data store, formats the one or more first parameterized inputs and/or parameterized outputs for statistical analysis. In this way instances (process runs) of a process can be performed with satisfactory reproducibility.

Embodiments in which steps (edges) are connected by generic entities (nodes) with resource lists associated with those nodes. Details regarding a flow chart of processes and features of a network, in accordance with another embodiment of the present disclosure, are disclosed with reference to FIG. 27.

As illustrated in block 2702 of FIG. 27A, a hypergraph data store 204 is maintained. The hypergraph data store 204 comprises, for each respective process 206 of one or more processes, a respective plurality of versions of the respective process. Each respective version 208 comprises a hypergraph 302 comprising a plurality of nodes 322 connected by edges 304 in a plurality of edges. Each respective edge 304 in the plurality of edges comprises a process stage label representing a respective stage in the corresponding process.

In the embodiment in accordance with FIG. 27, each respective node 322 in the plurality of nodes is associated with a corresponding set of parameterized resources and the corresponding set of parameterized resources specifies that each respective parameterized resource in the corresponding set of parameterized resources is associated with at least a corresponding output of the at least one output of a first edge in the plurality of edges and also is associated with at least a corresponding input of the one or more inputs of at least one other edge in the plurality of edges. Moreover, the values of a resource associated with the output side of a node may be different than the values of a resource associated with the input side of the same node. In some embodiments, a user can simply click on an edge 304 to see their inputs and outputs. Moreover, unstructured data in the form of videos, pictures, or comments can be added to nodes 322 or edges 304. For example, a video showing the proper way to perform a procedure associated with a node or edge can be linked to the node or edge by simply dragging an icon link to the video onto the representation of the node 322 or edge 204. For example, a video on the proper way perform a fermenter setup can be dragged onto the "Fermenter Setup" node 322-4 of FIG. 7. Thereafter, when a user clicks on node 322-4, the video is played.

As discussed above, versions 208 of a process 206 are related to each other. In some embodiments, each version 208 of a process 604 produces the same product. However, typically a first version and a second version in a respective plurality of versions for a process differ from each other in some way, such as in a number of nodes, a number of edges, a process stage label of an edge, a parameterized resource in a set of parameterized resources, to name some possibilities (2704).

In some embodiments a resource 310 is a single resource. In some embodiments, a resource is a composite resource. Examples of composite resources include, but are not limited, to mixtures of compositions (e.g., media, broth, etc.) and multi-component equipment (2710).

Figure 27B:
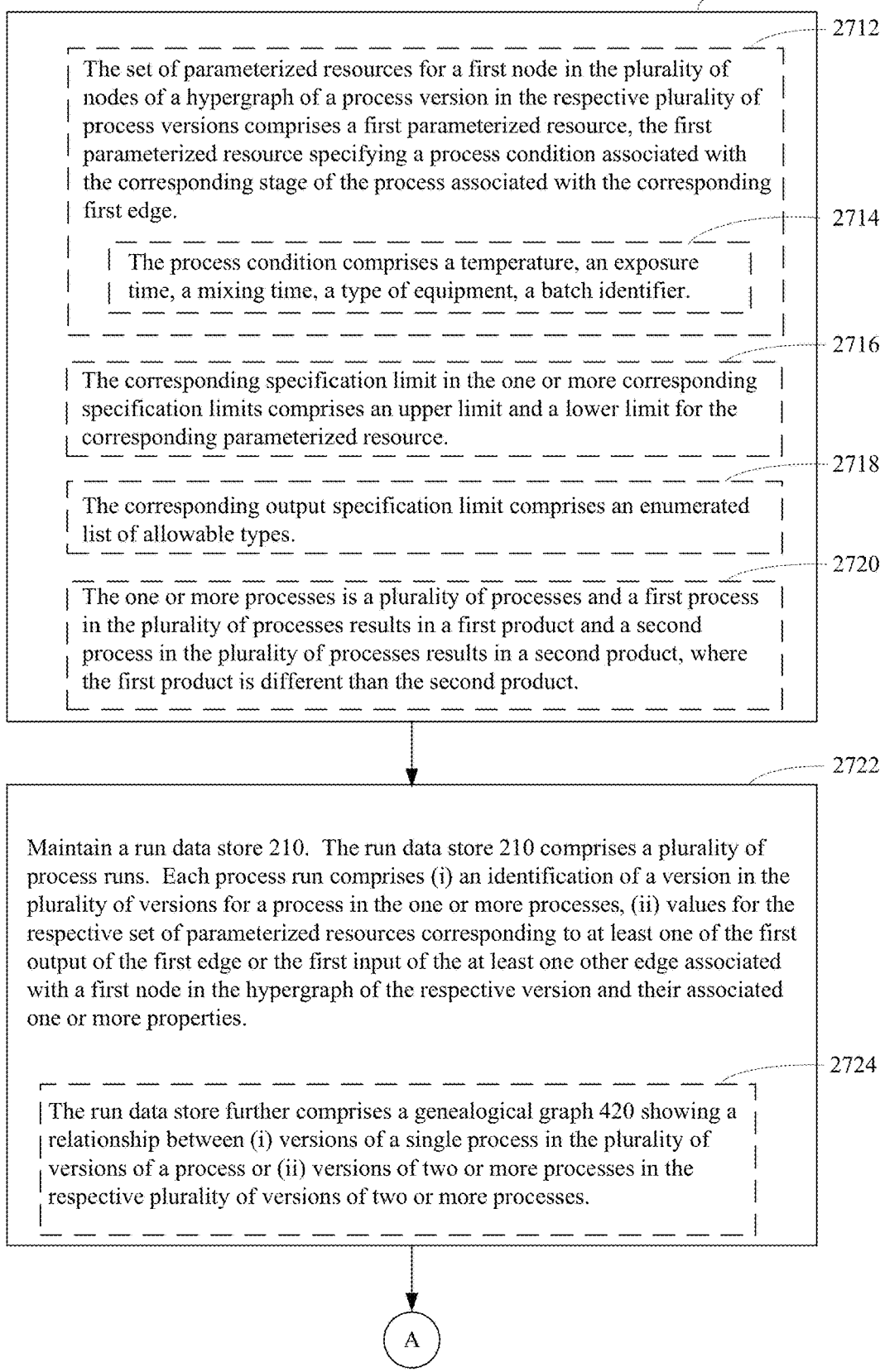

Referring to FIG. 27B, in some embodiments, the set of parameterized resources for a first node in the plurality of nodes of a hypergraph 302 of a process version 208 in the respective plurality of process versions comprises a first parameterized resource and this first parameterized resource specifies a process condition associated with the corresponding stage of the process associated with the corresponding edge (2712). For example, in some embodiments, this process condition is a temperature, an exposure time, a mixing time, a concentration, a type of equipment or a batch identifier (2714).

As noted above, for a given node, at least one of the resources in the set of parameterized resources for the node is associated with one or more properties, and the one or more properties includes a corresponding specification limit. In some embodiments, this corresponding specification limit comprises an upper limit and a lower limit for the corresponding parameterized resource (2716). To illustrate, an example of a property is pH of a composition. In such an example, the specification limit specifies the allowed upper limit for the pH of the composition and the allowed lower limit for the pH of the composition. In alternative embodiments, this corresponding specification limit comprises an enumerated list of allowable types (2718). To illustrate, an example of a property is a crystallographic orientation of a material. In such an example, the specification limit specifies an enumerated list of allowed crystallographic orientations for the material.

In some embodiments, the one or more processes in a hypergraph data store is, in fact, a plurality of processes. Further, a first process in the plurality of processes results in a first product and a second process in the plurality of processes results in a different second product (2720). For instance, a first process in the hypergraph data store may result in the manufacture of one type of composition and another process in the hypergraph data store may result in the manufacture of another composition.

Referring to block 2722 of FIG. 27B, a run data store 210 is also maintained. The run data store comprises a plurality of process runs 402. In typical embodiments, a process version 208 is locked before a process run 402 for the process version 208 is executed so that no further changes can be made to the process version 208. If changes to underlying process 206 are desired, a new process version 208 is defined in such embodiments.

In some embodiments, each process run 402 comprises an identification of a first edge of a process version 404 (208) in the plurality of versions for a process 206 in the one or more processes, as illustrated in FIG. 4. Furthermore, values for the respective set of parameterized resources and their associated one or more properties corresponding to at least one node in the plurality of nodes in the hypergraph 302 of the respective version are provided in a process run.

In some embodiments, the run data store 210 further comprises a genealogical graph 420 showing a relationship between (i) versions of a single process in the plurality of versions of a process that are in the plurality of process runs or (ii) versions of two or more processes in the respective plurality of versions of two or more processes that are in the plurality of process runs (2724). For instance, in some embodiments, a first process version 404 in a process set 420 and a second process version 404 in the process set 420 have the same hypergraph but a property or specification limit to one of the nodes in the hypergraph is different. In another example, a first process version 404 in a process set 420 and a second process version 404 in the process set 420 have hypergraphs that have all but one, all but two, all but three, all but four nodes or edges, and so forth, in common. The genealogical graph provides an advantageous way of discerning the relationship between the various process versions of a given process.

Figure 27C:
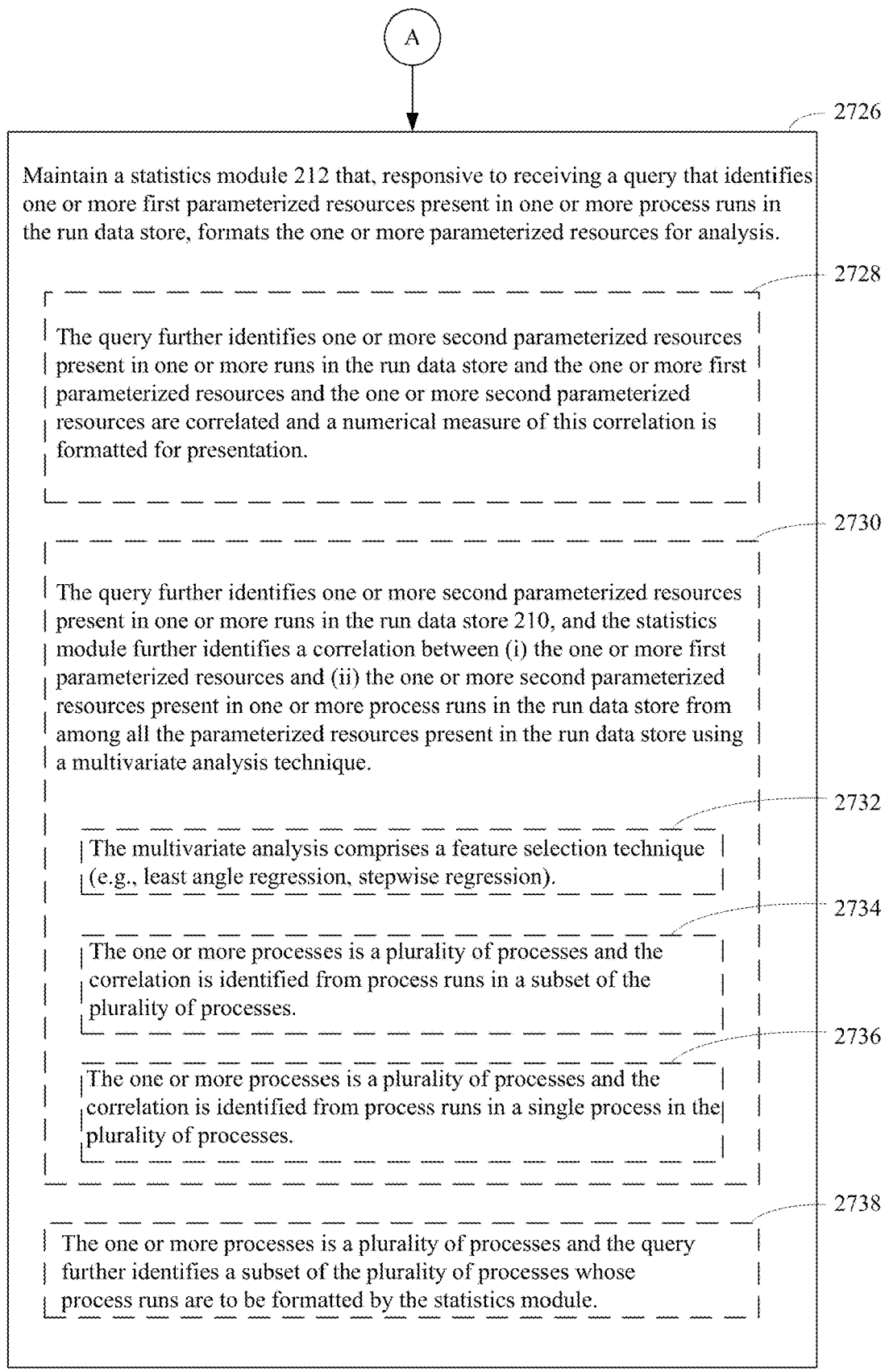

Turning to FIG. 27C, a statistics module 212 is also maintained (2726). The statistics module 212 leverages the structure of run data store 210 and hypergraph data store 204 to enable analytics of process runs. In particular, the statistics module 212 combined with the unique structure of run data store 210 and hypergraph data store 204 provides an advantageous platform for supporting statistical process control (SPC) over the many disparate components of a process 206 and thus provides powerful tools for analyzing and stabilizing such processes. SPC is a method of quality control which uses statistical methods. It is applied in order to monitor and control processes. Monitoring and controlling processes ensures that they operate at their full potential. For instance, at its full potential, a process 206 can make as much conforming product as possible with a minimization of waste. SPC can be applied to any process 206 where the "conforming product" (product meeting specifications) output can be measured. SPC makes use of control charts, a focus on continuous improvement and the design of process runs 402 (e.g., experiments). See, for example, Barlow and Irony, 1992, "Foundations of statistical quality control" in Ghosh, M. & Pathak, P. K. (eds.) *Current Issues in Statistical Inference: Essays in Honor of D. Basu*, Hayward, Calif., Institute of Mathematical Statistics, pp. 99-112, which is hereby incorporated by reference.

Advantageously, rather than having to track down the disparate data in disparate forms associated with a process or, rather the process runs that make use of the nodes of the process, in order to support SPC, the statistics module 212, responsive to receiving a query that identifies one or more first parameterized resources present in one or more process runs in the run data store, is able to easily retrieve and format the one or more resources for analysis. In some embodiments, for example, the data is formatted as one or more tab delimited files, CSV files, EXCEL spreadsheets, GOOGLE Sheets, and/or in a form suitable for relational databases. In particular, the data is structured to ensure that such data can be efficiently analyzed so that potential correlations are not overlooked in subsequent analysis. An example of such analysis that is performed as part of SPC is correlation analysis such as the root cause analysis illustrated in FIG. 26. Root cause analysis is described, for example, in Wilson et al., 1993, *Root Cause Analysis: A Tool for Total Quality Management*, Milwaukee, Wis., ASQ Quality Press. pp. 8-17, which is hereby incorporated by reference. Leading up to the root cause analysis illustrated in FIG. 26, a query identifies one or more first parameterized resources (e.g., amino acid type) present in one or more process runs in the run data store. Data for the one or more first parameterized resources is then formatted and outputted for analysis. With this formatted data, an analysis, such as the root cause analysis of FIG. 26, is conducted. In some embodiments, the query results are formatted for a third party statistical analysis package such as JMP (SAS, Buckinghamshire, England, see the Internet at www.jmp.com/en_dk/software.html). Analysis using such a third party statistical analysis package typically results in proposals for new process versions, in which nodes are added or removed, or the sets of resources associated with nodes are further defined or redefined, in order to identify and remove unwanted process variability (e.g., to stabilize the process).

The query can be of any of the resources available for any combination of process versions of any combination of the one or more processes in the run data store 210 or properties of these resources. As such, in some embodiments, the query further identifies one or more second parameterized resources present in one or more runs in the run data store (or properties thereof) and the one or more first resources and the one or more second resources are correlated and a numerical measure of this correlation is formatted for presentation (2728). In some embodiments, the numerical measure of correlation is on a scale between a low number and a high number, where the low number (e.g., zero) is indicative of no correlation and the high number (e.g., one) is indicative of complete correlation across the one or more first parameterized resources and the one or more second parameterized resources.

In some embodiments, the query further identifies one or more second resources present (or their properties) in one or more runs in the run data store, and the statistics module further identifies a correlation between (i) the one or more first parameterized resources and (ii) the one or more second parameterized resources present in one or more process runs in the run data store from among all the parameterized resources present in the run data store using a multivariate analysis technique (2730).

In some embodiments, the query identifies (i) one or more properties of one or more first resources and (ii) one or more properties of one or more second resources present in one or more runs in the run data store, and the statistics module further seeks a correlation between (i) the identified properties of the one or more first resources and (ii) the identified one or more properties of the one or more second resources present in one or more process runs in the run data store from among all the parameterized resources present in the run data store using a multivariate analysis technique.

In some embodiments, the above processes invoke a multivariate analysis technique that comprises a feature selection technique (2732) (e.g., least angle regression, stepwise regression). Feature selection techniques are particularly advantageous in identifying, from among the multitude of variables (e.g., values for properties of resources in sets of resources associated with edges) present across sets of process runs, which variables (e.g., which properties of resources of which nodes) have a significant causal effect on a property of the product of the process (e.g., which of the variables are causal for poor reproducibility, poor yield, or conversely which of the variables are causal for excellent reproducibility, higher yield). Feature selection techniques are described, for example, in Saeys et al., 2007, "A review of feature selection techniques in bioinformatics," Bioinformatics 23, 2507-2517, and Tibshirani, 1996, "Regression and Shrinkage and Selection via the Lasso," J. R. Statist. Soc B, pp. 267-288, each of which is hereby incorporated by reference.

In some embodiments, the one or more processes are a plurality of processes and the correlation is identified from process runs in a subset of the plurality of processes (2734). There is no requirement that each of the processes across which this correlation is identified make the same product in such embodiments. Such embodiments are highly advantageous because they allow for the investigation of undesirable process variability across process runs used in the manufacture of different products. For instance, some of the process runs used in a correlation analysis may manufacture biologic A and other process runs used in the same correlation analysis may manufacture biologic B. Correlation analysis that uses data from process runs for biologics A and B allows for the investigation of causes of variation that are product independent, such as, for example, a poorly defined fermentation step. For example, the sugar input into this fermentation step in the process runs for both biologics A and B may not be adequately defined to ensure process stabilization. Another example of a source of variation common to these process versions could be, for example, identified through correlation analysis across process runs for both biologics A and B, to a piece of equipment that is beginning to fail due to age. This is all possible because the disclosed systems and methods advantageously impose a consistent framework to the process runs that make different products. Thus, it is possible to aggregate process runs from across different products and perform cross-sectional filtering on any desirable set of resources and properties of resources, or specification limits thereof in these process runs, in order to, for example, discover sources of process variability that are independent (or dependent) of actual products made by such processes.

In some embodiments, the one or more processes are a plurality of processes and the correlation is identified from process runs in a single process in the plurality of processes (2736). In such embodiments, each of the processes across which this correlation is identified makes the same product or produce the same analytical information. Such embodiments are used, for example, to precisely identify key sources of variability in the manufacture of the product or production of the analytical information through the process.

In some embodiments, the one or more processes is a plurality of processes and the query further identifies a subset of the plurality of processes whose process runs are to be formatted by the statistics module (2738).

Turning to FIG. 27D, in some embodiments the statistics module 212 further provides suggested values (e.g., limits) for the one or more second parameterized resources for one or more additional process runs of a first process in the one or more processes, not present in the run data store 210, based on a prediction that the suggested values (e.g., limits) for the one or more second parameterized resources will alter a numerical attribute of the product of such process runs (2740). In some embodiments, the numerical attribute is a reduction in variance in the one or more first parameterized resources (2742). Such an embodiment is utilized, for example, to identify situations in which the resource space covered by the parameterized resources of the nodes in the process runs is insufficient to find a correlation between certain process variables across the process runs previously executed with a sufficiently high degree of confidence, or any correlation at all. In these instances, suggested values for the space that is covered by the parameterized resources are provided in order to test for a correlation. Such an embodiment is utilized, in other examples, when a potential problem is identified from analysis of existing process runs. In such embodiments, proposed additions to the resource space not present in the process runs in the run data store are made that will facilitate determining whether the potential problem is real. If the potential problem is real, a new version of the process can be developed that further defines a state (property) of a resource of an existing or new node in the process in order to attempt to remove process state ambiguity and thereby stabilize the process.

In some embodiments the query identifies one or more third parameterized resources present in runs in the run data store, and the above-described numerical attribute is a confidence in a correlation between the first resources and the third parameterized resources (2744). In some embodiments, the one or more processes is a plurality of processes and the query further identifies a single process in the plurality of processes whose process runs are to be formatted by the statistics module (2746). In such embodiments, all the process runs identified by the query make the same product or produce the same form of analytical information.

In some embodiments, the query further identifies a subset of process runs in the one or more processes (2748). In such embodiments, there is no requirement that all the process runs identified by the query make the same product or produce the same form of analytical information. In fact, some of the process runs responsive to the query may make different products or produce different types of analytical information.

In some embodiments, the statistics module further identifies a correlation between (i) a first set comprising one or more process runs in the run data store and (ii) a second set comprising one or more process runs in the run data store, where process runs in the second set are not in the first set (2750). For instance, in some embodiments, the correlation is computed across a plurality of parameterized resources present in the first and second sets (2752).

Figure 27E:
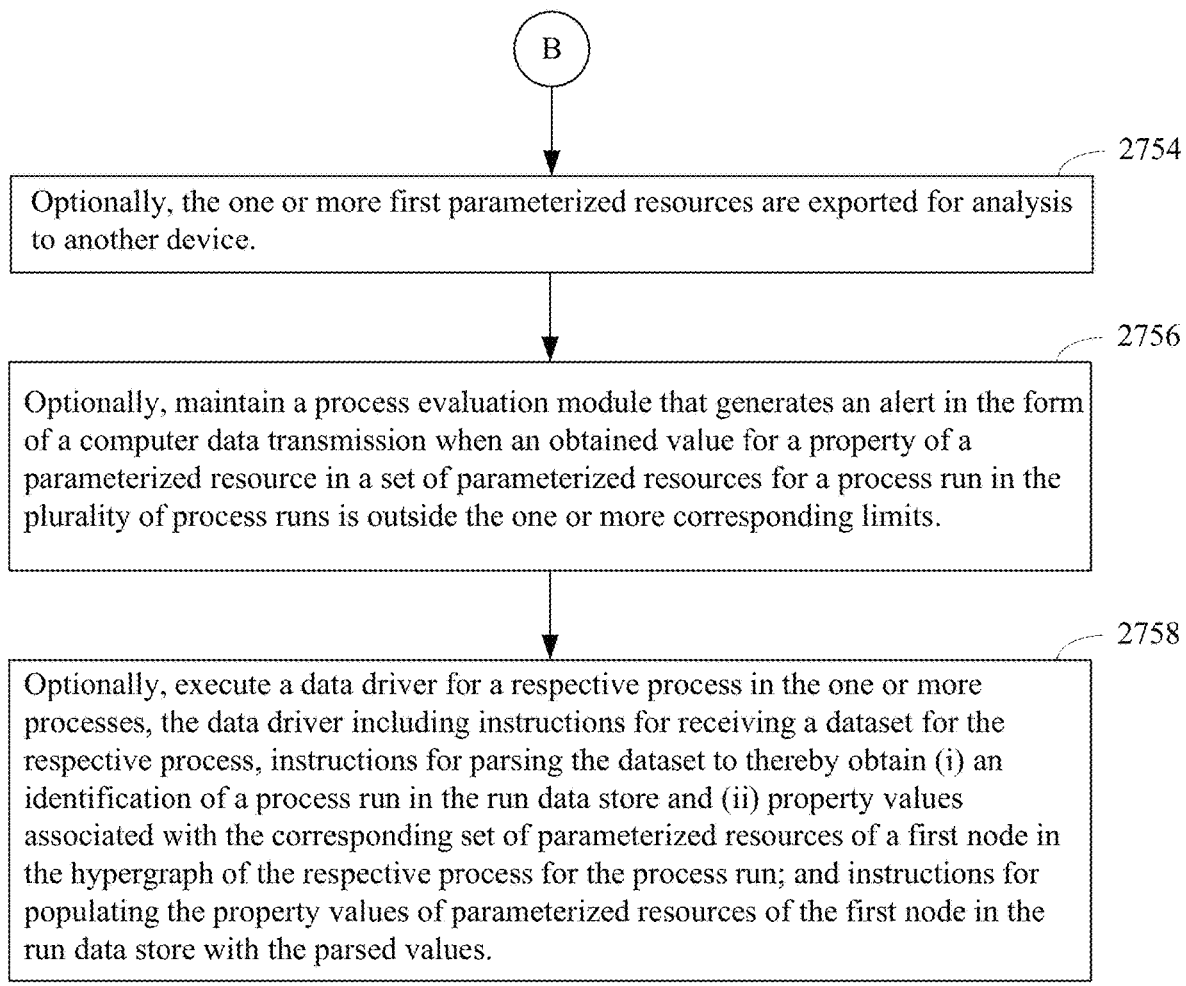

Referring to FIG. 27E, optionally, the one or more first parameterized resources are exported for analysis to another device (2754), e.g., as one or more tab delimited files, CSV files, EXCEL spreadsheets, GOOGLE Sheets, or in a form suitable for an SQL database.

Optionally, in some embodiments, as discussed above in relation to FIG. 5, in some embodiments a process evaluation module is maintained that generates an alert in the form of a computer data transmission when an obtained value for a property of a parameterized resource in a set of parameterized resources for a node in a hypergraph of a process version is outside the specification limit of the resource (2756).

Optionally, in some embodiments a data driver 218 is executed for a respective process in the one or more processes (2758). The data driver includes instructions for receiving a dataset for the respective process and further includes instructions for parsing the dataset to thereby obtain (i) an identification of a process run in the run data store and (ii) property values associated with the respective set of parameterized resources of a first node in the hypergraph of the respective process for the process run. The data driver further includes instructions for populating the property values of parameterized resources of the first node in the run data store with the parsed values. For instance, in some embodiments, a sync engine associated with a node in the process monitors an associated synced folder. In some embodiments, the sync engine associated with the node runs as a background process (like Google Drive or Dropbox Sync) on any PC attached to an instrument associated with the node. When new instrument data files are added to the folder, the software parses and sends the data to the data driver 218. In some embodiments, association of the data sets to the correct protocol variables (parameterized resources) of process runs is done via interaction with a user who is presented with a notification containing choices of process runs to which they have access. In some embodiments, the data driver 218 already contains the associations between values in the data sets and the correct protocol variables (parameterized resources) of process runs.

Embodiments in which steps (edges) are connected by generic entities (nodes) with no associated lists. Details regarding a flow chart of processes and features of a network, in accordance with another embodiment of the present disclosure, are disclosed with reference to FIG. 28.

As illustrated in block 2802 of FIG. 28A, a hypergraph data store 204 is maintained. The hypergraph data store 204 comprises, for each respective process 206 of one or more processes, a respective plurality of versions of the respective process. Each respective version 208 comprises a hypergraph 302 comprising a plurality of edges 304 connected by nodes 322 in a plurality of nodes. Each respective edge 304 in the plurality of edges comprises a process stage label representing a respective stage in the corresponding process.

In the embodiment in accordance with FIG. 28, each respective node 322 in the plurality of nodes comprises an output at the at least one output of a first edge in the plurality of edges and also comprises a first input of the one or more inputs of at least one other edge in the plurality of edges. In some embodiments, a user can simply click on an edge 304 to see their inputs and outputs. Moreover, unstructured data in the form of videos, pictures, or comments can be added to edges 304. For example, a video showing the proper way to perform a procedure associated with an edge can be linked to an edge by simply dragging an icon link to the video onto the representation of the edge 304.

Referring to block 2804 of FIG. 28A, a run data store 210 is also maintained. The run data store comprises a plurality of process runs 402. In typical embodiments, a process version 208 is locked before a process run 402 for the process version 208 is executed so that no further changes can be made to the process version 208. If changes to underlying process 206 are desired, a new process version 208 is defined in such embodiments. Referring to block 2806 of FIG. 28A, in some embodiments, each respective node in the plurality of nodes is associated with a corresponding set of parameterized resources. The corresponding set of parameterized resources comprises a first output of the at least one output of a first edge in the plurality of edges and also comprises a first input of the one or more inputs of at least one other edge in the plurality of edges. At least one parameterized resource in the set of parameterized resources is associated with one or more properties. The one or more properties include one or more corresponding specification limits. The run data store further comprises, for each respective process run in the plurality of process runs, values for the respective set of parameterized resources corresponding to at least one of the first output of the first edge or the first input of the at least one other edge associated with a first node in the hypergraph of the respective version and their associated one or more properties.

As discussed above, versions 208 of a process 206 are related to each other. In some embodiments, each version 208 of a process 604 produces the same product. However, typically a first version and a second version in a respective plurality of versions for a process differ from each other in some way, such as in a number of nodes or edges, a process stage label of an edge, a parameterized resource in a set of parameterized resources, to name some possibilities (2808).

Referring to block 2810 of FIG. 28A, in some embodiments the set of parameterized resources for a node in the plurality of nodes of a hypergraph for a process version in the respective plurality of process versions comprises a first and second parameterized resource. The first parameterized resource specifies a first resource and is associated with a first property, and the second parameterized resource specifies a second resource and is associated with a second property. Referring to block 2812, in some such embodiments, the first property is a viscosity value, a purity value, composition value, a temperature value, a weight value, a mass value, a volume value, or a batch identifier of the first resource. In some embodiments a resource 310 is a single resource. In some embodiments, a resource is a composite resource. Examples of composite resources include, but are not limited, to mixtures of compositions (e.g., media, broth, etc.) and multi-component equipment (2814).

Referring to FIG. 28B, in some embodiments, the set of parameterized resources for a first node in the plurality of nodes of a hypergraph 302 of a process version 208 in the respective plurality of process versions comprises a first parameterized resource and this first parameterized resource specifies a process condition (2816). For example, in some embodiments, this process condition is a temperature, an exposure time, a mixing time, a concentration, a type of equipment or a batch identifier (2818).

As noted above, at least one of resource in a set of parameterized resources is associated with one or more properties, and the one or more properties includes a corresponding specification limit. In some embodiments, this corresponding specification limit comprises an upper limit and a lower limit for the corresponding parameterized resource (2820). To illustrate, an example of a property is pH of a composition. In such an example, the specification limit specifies the allowed upper limit for the pH of the composition and the allowed lower limit for the pH of the composition. In alternative embodiments, this corresponding specification limit comprises an enumerated list of allowable types (2822). To illustrate, an example of a property is a crystallographic orientation of a material. In such an example, the specification limit specifies an enumerated list of allowed crystallographic orientations for the material.

In some embodiments, the one or more processes in a hypergraph data store is, in fact, a plurality of processes. Further, a first process in the plurality of processes results in a first product and a second process in the plurality of processes results in a different second product (2824). For instance, a first process in the hypergraph data store may result in the manufacture of one type of composition and another process in the hypergraph data store may result in the manufacture of another composition.

In some embodiments, the run data store 210 further comprises a genealogical graph 420 showing a relationship between (i) versions of a single process in the plurality of versions of a process that are in the plurality of process runs or (ii) versions of two or more processes in the respective plurality of versions of two or more processes that are in the plurality of process runs (2826). For instance, in some embodiments, a first process version 404 in a process set 420 and a second process version 404 in the process set 420 have the same hypergraph but a property or specification limit to one of the nodes in the hypergraph is different. In another example, a first process version 404 in a process set 420 and a second process version 404 in the process set 420 have hypergraphs that have all but one, all but two, all but three, all but four nodes or edges, and so forth, in common. The genealogical graph provides an advantageous way of discerning the relationship between the various process versions of a given process.

Figure 28C:
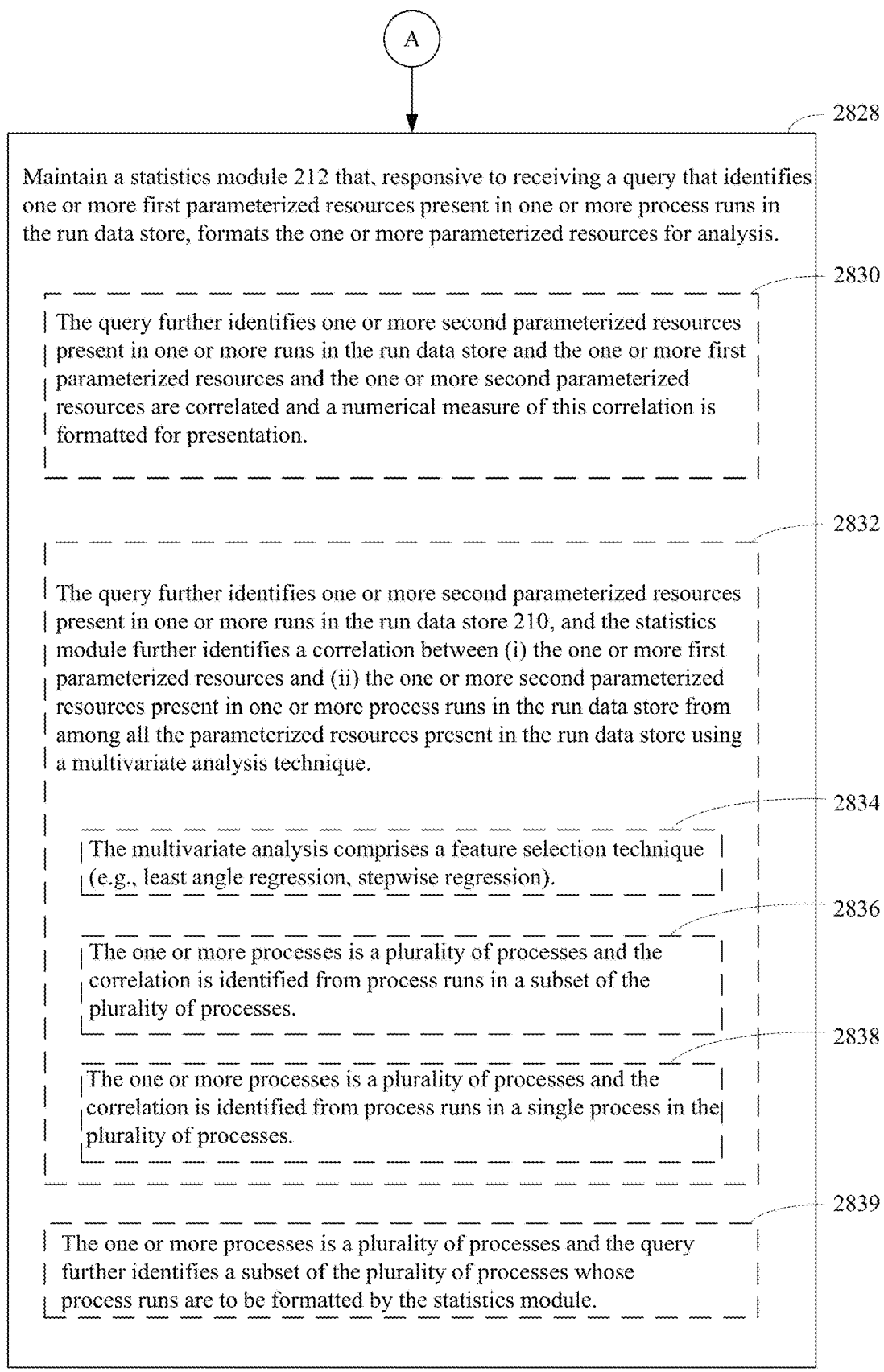

Turning to FIG. 28C, a statistics module 212 is also maintained (2828). The statistics module 212 leverages the structure of run data store 210 and hypergraph data store 204 to enable analytics of process runs. In particular, the statistics module 212 combined with the unique structure of run data store 210 and hypergraph data store 204 provides an advantageous platform for supporting statistical process control (SPC) over the many disparate components of a process 206 and thus provides powerful tools for analyzing and stabilizing such processes. SPC is a method of quality control which uses statistical methods. It is applied in order to monitor and control processes. Monitoring and controlling processes ensures that they operate at their full potential. For instance, at its full potential, a process 206 can make as much conforming product as possible with a minimization of waste. SPC can be applied to any process 206 where the "conforming product" (product meeting specifications) output can be measured. SPC makes use of control charts, a focus on continuous improvement and the design of process runs 402 (e.g., experiments). See, for example, Barlow and Irony, 1992, "Foundations of statistical quality control" in Ghosh, M. & Pathak, P. K. (eds.) *Current Issues in Statistical Inference: Essays in Honor of D. Basu*, Hayward, Calif., Institute of Mathematical Statistics, pp. 99-112, which is hereby incorporated by reference.

Advantageously, rather than having to track down the disparate data in disparate forms associated with a process or, rather the process runs that make use of the nodes of the process, in order to support SPC, the statistics module 212, responsive to receiving a query that identifies one or more first parameterized resources present in one or more process runs in the run data store, is able to easily retrieve and format the one or more resources for analysis. In some embodiments, for example, the data is formatted as one or more tab delimited files, CSV files, EXCEL spreadsheets, GOOGLE Sheets, and/or in a form suitable for relational databases. In particular, the data is structured to ensure that such data can be efficiently analyzed so that potential correlations are not overlooked in subsequent analysis. An example of such analysis that is performed as part of SPC is correlation analysis such as the root cause analysis illustrated in FIG. 26. Root cause analysis is described, for example, in Wilson et al., 1993, *Root Cause Analysis: A Tool for Total Quality Management*, Milwaukee, Wis., ASQ Quality Press. pp. 8-17, which is hereby incorporated by reference. Leading up to the root cause analysis illustrated in FIG. 26, a query identifies one or more first parameterized resources (e.g., amino acid type) present in one or more process runs in the run data store. Data for the one or more first parameterized resources is then formatted and outputted for analysis. With this formatted data, an analysis, such as the root cause analysis of FIG. 26, is conducted. In some embodiments, the query results are formatted for a third party statistical analysis package such as JMP (SAS, Buckinghamshire, England, on the Internet at jmp.com/en_dk/software.html). Analysis using such a third party statistical analysis package typically results in proposals for new process versions, in which nodes and/or edges are added or removed, or the sets of resources associated with nodes are further defined or redefined, in order to identify and remove unwanted process variability (e.g., to stabilize the process).

The query can be of any of the resources available for any combination of process versions of any combination of the one or more processes in the run data store 210 or properties of these resources. As such, in some embodiments, the query further identifies one or more second parameterized resources present in one or more runs in the run data store (or properties thereof) and the one or more first resources and the one or more second resources are correlated and a numerical measure of this correlation is formatted for presentation (2830). In some embodiments, the numerical measure of correlation is on a scale between a low number and a high number, where the low number (e.g., zero) is indicative of no correlation and the high number (e.g., one) is indicative of complete correlation across the one or more first parameterized resources and the one or more second parameterized resources.

In some embodiments, the query further identifies one or more second resources present (or their properties) in one or more runs in the run data store, and the statistics module further identifies a correlation between (i) the one or more first parameterized resources and (ii) the one or more second parameterized resources present in one or more process runs in the run data store from among all the parameterized resources present in the run data store using a multivariate analysis technique (2830).

In some embodiments, the query identifies a correlation between (i) one or more first parameterized resources and (ii) one or more second parameterized resources present in one or more process runs in the run data store from among all the parameterized resources present in the run data store using a multivariate analysis technique (2832). In some embodiments, the above processes invoke a multivariate analysis technique that comprises a feature selection technique (2834) (e.g., least angle regression, stepwise regression). Feature selection techniques are particularly advantageous in identifying, from among the multitude of variables (e.g., values for properties of resources in sets of resources associated with edges) present across sets of process runs, which variables (e.g., which properties of resources) have a significant causal effect on a property of the product of the process (e.g., which of the variables are causal for poor reproducibility, poor yield, or conversely which of the variables are causal for excellent reproducibility, higher yield). Feature selection techniques are described, for example, in Saeys et al., 2007, "A review of feature selection techniques in bioinformatics," Bioinformatics 23, 2507-2517, and Tibshirani, 1996, "Regression and Shrinkage and Selection via the Lasso," J. R. Statist. Soc B, pp. 267-288, each of which is hereby incorporated by reference.

In some embodiments, the one or more processes are a plurality of processes and the correlation is identified from process runs in a subset of the plurality of processes (2836). There is no requirement that each of the processes across which this correlation is identified make the same product in such embodiments. Such embodiments are highly advantageous because they allow for the investigation of undesirable process variability across process runs used in the manufacture of different products. For instance, some of the process runs used in a correlation analysis may manufacture biologic A and other process runs used in the same correlation analysis may manufacture biologic B. Correlation analysis that uses data from process runs for biologics A and B allows for the investigation of causes of variation that are product independent, such as, for example, a poorly defined fermentation step. For example, the sugar input into this fermentation step in the process runs for both biologics A and B may not be adequately defined to ensure process stabilization. Another example of a source of variation common to these process versions could be, for example, identified through correlation analysis across process runs for both biologics A and B, to a piece of equipment that is beginning to fail due to age. This is all possible because the disclosed systems and methods advantageously impose a consistent framework to the process runs that make different products. Thus, it is possible to aggregate process runs from across different products and perform cross-sectional filtering on any desirable set of resources and properties of resources, or specification limits thereof in these process runs, in order to, for example, discover sources of process variability that are independent (or dependent) of actual products made by such processes.

In some embodiments, the one or more processes are a plurality of processes and the correlation is identified from process runs in a single process in the plurality of processes (2838). In such embodiments, each of the processes across which this correlation is identified makes the same product or produce the same analytical information. Such embodiments are used, for example, to precisely identify key sources of variability in the manufacture of the product or production of the analytical information through the process.

In some embodiments, the one or more processes is a plurality of processes and the query further identifies a subset of the plurality of processes whose process runs are to be formatted by the statistics module (2839).

Turning to FIG. 28D, in some embodiments the statistics module 212 further provides suggested values (e.g., limits) for the one or more second parameterized resources for one or more additional process runs of a first process in the one or more processes, not present in the run data store 210, based on a prediction that the suggested values (e.g., limits) for the one or more second parameterized resources will alter a numerical attribute of the product of such process runs (2840). In some embodiments, the numerical attribute is a reduction in variance in the one or more first parameterized resources exhibited across the plurality of runs (2742). Such an embodiment is utilized, for example, to identify situations in which the resource space covered by the parameterized resources in the process runs is insufficient to find a correlation between certain process variables across the process runs previously executed with a sufficiently high degree of confidence, or any correlation at all. In these instances, suggested values for the space that is covered by the parameterized resources are provided in order to test for a correlation. Such an embodiment is utilized, in other examples, when a potential problem is identified from analysis of existing process runs. In such embodiments, proposed additions to the resource space not present in the process runs in the run data store are made that will facilitate determining whether the potential problem is real. If the potential problem is real, a new version of the process can be developed that further defines a state (property) of a resource of an existing or new edge in the process in order to attempt to remove process state ambiguity and thereby stabilize the process.

In some embodiments the query identifies one or more third parameterized resources present in runs in the run data store, and the above-described numerical attribute is a confidence in a correlation between the first resources and the third parameterized resources (2844). In some embodiments, the one or more processes is a plurality of processes and the query further identifies a single process in the plurality of processes whose process runs are to be formatted by the statistics module (2846). In such embodiments, all the process runs identified by the query make the same product or produce the same form of analytical information.

In some embodiments, the query further identifies a subset of process runs in the one or more processes (2848). In such embodiments, there is no requirement that all the process runs identified by the query make the same product or produce the same form of analytical information. In fact, some of the process runs responsive to the query may make different products or produce different types of analytical information.

In some embodiments, the statistics module further identifies a correlation between (i) a first set comprising one or more process runs in the run data store and (ii) a second set comprising one or more process runs in the run data store, where process runs in the second set are not in the first set (2850). For instance, in some embodiments, the correlation is computed across a plurality of parameterized resources present in the first and second sets (2852).

Figure 28E:
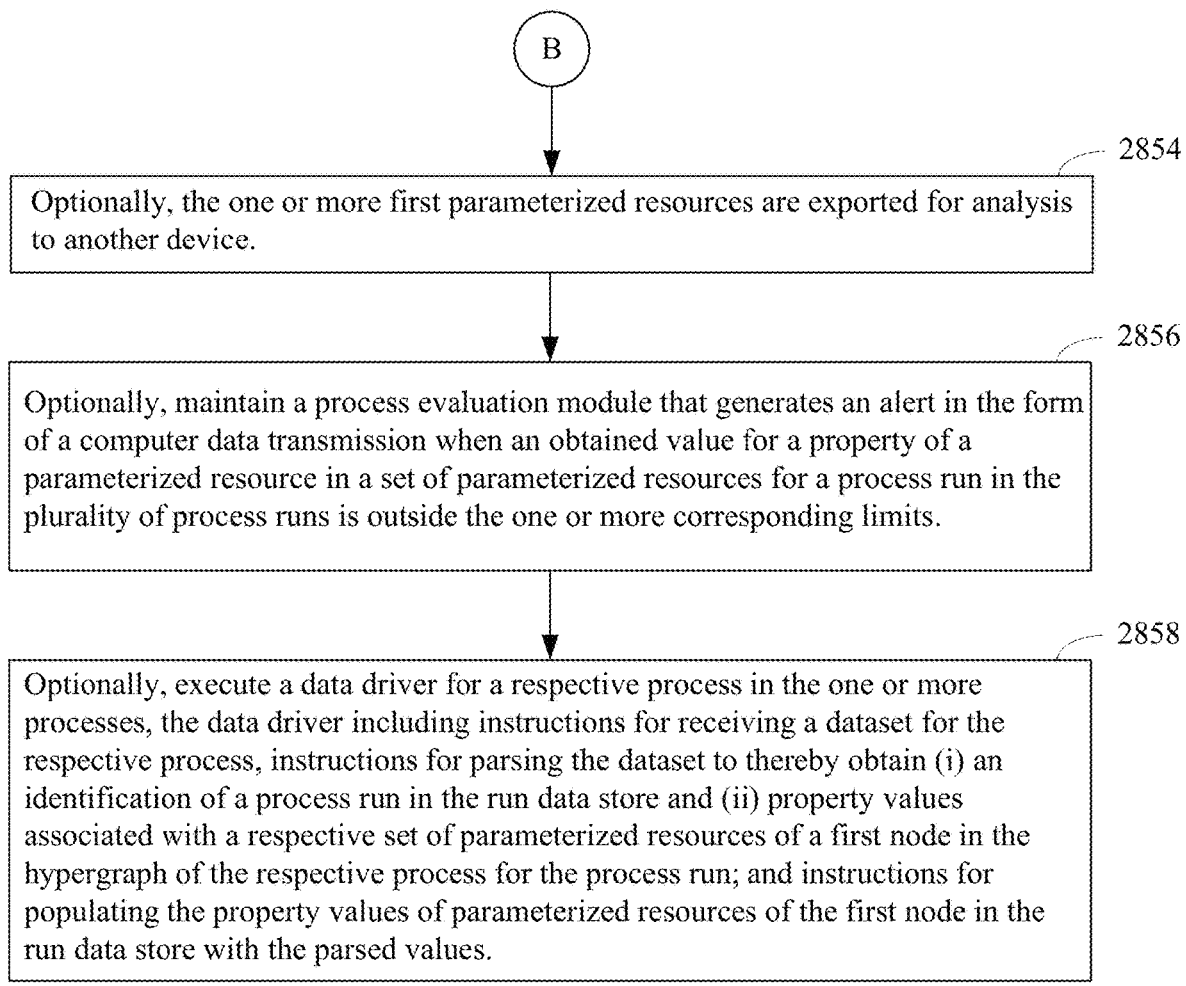

Referring to FIG. 28E, optionally, the one or more first parameterized resources are exported for analysis to another device (2754), e.g., as one or more tab delimited files, CSV files, EXCEL spreadsheets, GOOGLE Sheets, or in a form suitable for an SQL database.

Optionally, in some embodiments, as discussed above in relation to FIG. 5, in some embodiments a process evaluation module is maintained that generates an alert in the form of a computer data transmission when an obtained value for a property of a parameterized resource in a set of parameterized resources for a node in a hypergraph of a process version is outside the specification limit of the resource (2856).

Optionally, in some embodiments a data driver 218 is executed for a respective process in the one or more processes (2858). The data driver includes instructions for receiving a dataset for the respective process and further includes instructions for parsing the dataset to thereby obtain (i) an identification of a process run in the run data store and (ii) property values associated with a respective set of parameterized resources for a first node in the hypergraph of the respective process for the process run. The data driver further includes instructions for populating the property values of parameterized resources of the first node in the run data store with the parsed values. For instance, in some embodiments, a sync engine associated with the process monitors an associated synced folder. In some embodiments, the sync engine runs as a background process (like Google Drive or Dropbox Sync) on any PC attached to an instrument associated with the edge. When new instrument data files are added to the folder, the software parses and sends the data to the data driver 218. In some embodiments, association of the data sets to the correct protocol variables (parameterized resources) of process runs is done via interaction with a user who is presented with a notification containing choices of process runs to which they have access. In some embodiments, the data driver 218 already contains the associations between values in the data sets and the correct protocol variables (parameterized resources) of process runs.

REFERENCES CITED AND ALTERNATIVE EMBODIMENTS

All references cited herein are incorporated herein by reference in their entirety and for all purposes to the same extent as if each individual publication or patent or patent application was specifically and individually indicated to be incorporated by reference in its entirety for all purposes.

The present invention can be implemented as a computer program product that comprises a computer program mechanism embedded in a nontransitory computer readable storage medium. For instance, the computer program product could contain the program modules shown in any combination of FIGS. 1, 2, 3, 4, and/or 5. These program modules can be stored on a CD-ROM, DVD, magnetic disk storage product, or any other tangible computer readable data or program storage product.

Many modifications and variations of this invention can be made without departing from its spirit and scope, as will be apparent to those skilled in the art. The specific embodiments described herein are offered by way of example only. The embodiments were chosen and described in order to best explain the principles of the invention and its practical applications, to thereby enable others skilled in the art to best utilize the invention and various embodiments with various modifications as are suited to the particular use contemplated. The invention is to be limited only by the terms of the appended claims, along with the full scope of equivalents to which such claims are entitled.

What is claimed is:

1. A non-transitory computer readable storage medium for providing process design and analysis of one or more processes, each process in the one or more processes resulting in a respective product or analytical information, wherein the non-transitory computer readable storage medium stores instructions, which when executed by a first device, cause the first device to:
   (A) maintain a hypergraph data store comprising, for each respective process in the one or more processes, a respective one or more versions of the respective process, each respective version comprising:
   a hypergraph comprising a plurality of nodes connected by edges in a plurality of edges, wherein
      each respective edge in the plurality of edges represents a respective stage in the corresponding process,
      an edge in the plurality of edges is associated with
         (i) a set of parameterized resource inputs to the corresponding stage in the corresponding process, and
         (ii) a set of parameterized resource outputs to the corresponding stage in the corresponding process, and each respective node in the plurality of nodes specifies that a set of parameterized resource outputs of an edge in the plurality of edges is included in a set of parameterized resource inputs of at least one other edge in the plurality of edges;

(B) maintain a run data store, wherein the run data store comprises a plurality of process runs, each process run comprising (i) an identification of a version in the one or more versions for a process in the one or more processes, (ii) the respective set of parameterized resource inputs and outputs of the first edge in the hypergraph of the respective version, and (iii) values of at least one input or output property of a parameterized resource output in the respective set of parameterized resource outputs of the first edge in the hypergraph of the respective version; and (C) maintain a statistics module that, responsive to receiving a query that identifies one or more first parameterized resource inputs and/or parameterized resource outputs, process runs, stages, nodes, edges, input properties, output properties, input specification limits of input properties, output specification limits of output properties and/or obtained values of input or output properties present in the run data store, formats the one or more first parameterized resource inputs and/or parameterized resource outputs, process runs, stages, nodes, edges, input properties, output properties, input specification limits of input properties, output specification limits of output properties and/or obtained values of input or output properties for analysis.

2. The non-transitory computer readable storage medium of claim 1, wherein the query further identifies one or more second parameterized resource inputs and/or parameterized resource outputs present in one or more runs in the run data store, wherein the instructions, which when executed by the first device, further cause the first device to:

correlate the one or more first parameterized resource inputs and/or parameterized resource outputs and the one or more second parameterized resource inputs and/or parameterized resource outputs; and format, for presentation, a numerical measure of the correlation.

3. The non-transitory computer readable storage medium of claim 1, wherein the instructions, which when executed by the first device, further cause the first device to:

export the one or more first parameterized resource inputs and/or parameterized resource outputs, process runs, stages, nodes, edges, input properties, output properties, input specification limits of input properties, output specification limits of output properties and/or obtained values of input or output properties for analysis to a second device.

4. The non-transitory computer readable storage medium of claim 1, wherein the instructions, which when executed by the first device, further cause the first device to:

(D) maintain a process evaluation module that generates an alert in the form of a computer data transmission when an obtained value for an output property of a parameterized resource output in a set of parameterized resource outputs for a process run in the plurality of process runs is outside the output specification limit.

5. The non-transitory computer readable storage medium of claim 1, wherein a first version and a second version for a process in the one or more processes differ from each other in a number of nodes, a number of edges, a process stage label of an edge, a parameterized resource input in a set of parameterized resource inputs, or a parameterized resource output in a set of parameterized resource outputs.

6. The non-transitory computer readable storage medium of claim 1, wherein the query further identifies one or more second parameterized resource inputs and/or parameterized resource outputs present in one or more runs in the run data store, and wherein the statistics module further identifies a correlation between (i) the one or more first parameterized resource inputs and/or parameterized resource outputs and (ii) the one or more second parameterized resource inputs and/or parameterized resource outputs present in one or more process runs in the run data store from among all the parameterized resource inputs and/or parameterized resource outputs present in the run data store using a multivariate analysis technique.

7. The non-transitory computer readable storage medium of claim 6, wherein the multivariate analysis comprises a feature selection technique.

8. The non-transitory computer readable storage medium of claim 7, wherein the feature selection technique is least angle regression.

9. The non-transitory computer readable storage medium of claim 7, wherein the feature selection technique is stepwise regression.

10. The non-transitory computer readable storage medium of claim 6, wherein the one or more processes is a plurality of processes and the correlation is identified from process runs in a subset of the plurality of processes.

11. The non-transitory computer readable storage medium of claim 6, wherein the one or more processes is a plurality of processes and the correlation is identified from process runs in a single process in the plurality of processes.

12. The non-transitory computer readable storage medium of claim 1, wherein the statistics module further provides suggested values for the one or more second parameterized resource inputs for an additional process run of a first process in the one or more processes, not present in the run data store, based on a prediction that the suggested values for the one or more second parameterized resource inputs will alter a numerical attribute of the one or more process runs.

13. The non-transitory computer readable storage medium of claim 12, wherein the numerical attribute is a reduction in variance in the one or more first parameterized resource inputs.

14. The non-transitory computer readable storage medium of claim 12, wherein the query further identifies one or more third parameterized resource inputs and/or parameterized resource outputs present in one or more runs in the run data store, and wherein the numerical attribute is a confidence in a correlation between the one or more first parameterized resource inputs and/or parameterized resource outputs and the one or more third parameterized resource inputs and/or parameterized resource outputs.

15. The non-transitory computer readable storage medium of claim 1, wherein the one or more processes is a plurality of processes and the query further identifies a subset of the plurality of processes whose process runs are to be formatted by the statistics module.

16. The non-transitory computer readable storage medium of claim 1, wherein the one or more processes is a plurality of processes and the query further identifies a single process in the plurality of processes whose process runs are to be formatted by the statistics module.

17. The non-transitory computer readable storage medium of claim 1, wherein the query further identifies a subset of process runs in the one or more processes.

18. The non-transitory computer readable storage medium of claim 1, wherein the statistics module further identifies a correlation between (i) a first set comprising one or more process runs in the run data store and (ii) a second set comprising one or more process runs in the run data store, wherein process runs in the second set are not in the first set.

19. The non-transitory computer readable storage medium of claim 18, wherein the correlation is computed across a plurality of parameterized resource inputs and/or parameterized resource outputs present in the first and second sets.

20. The non-transitory computer readable storage medium of claim 1, wherein the set of parameterized resource inputs for an edge in the plurality of edges of a hypergraph for a process version in the respective one or more versions of the respective process comprises a first and second parameterized resource input, the first parameterized resource input specifying a first resource and is associated with a first input property, and the second parameterized resource input specifying a second resource and is associated with a second input property, wherein the first input property is different than the second input property.

21. The non-transitory computer readable storage medium of claim 20, wherein the first input property is a viscosity value, a purity value, composition value, a temperature value, a weight value, a mass value, a volume value, or a batch identifier of the first resource.

22. The non-transitory computer readable storage medium of claim 20, wherein the first resource is a single resource or a composite resource.

23. The non-transitory computer readable storage medium of claim 1, wherein the set of parameterized resource inputs for a first edge in the plurality of edges of a hypergraph of a process version in the respective one or more versions of the respective process comprises a first parameterized resource input, the first parameterized resource input specifying a process condition associated with the corresponding stage of the process associated with the first edge.

24. The non-transitory computer readable storage medium of claim 23, wherein the process condition comprises a temperature, an exposure time, a mixing time, a type of equipment, or a batch identifier.

25. The non-transitory computer readable storage medium of claim 1, wherein the instructions further cause the first device to:
(D) execute a data driver for a respective process in the one or more processes, the data driver including:
instructions for receiving a dataset for the respective process;
instructions for parsing the dataset to thereby obtain (i) an identification of a process run in the run data store and (ii) input and/or output property values associated with a respective set of parameterized resource inputs and/or outputs of a first edge in the hypergraph of the respective process for the process run; and
instructions for populating the input and/or output property values of parameterized resource inputs and/or outputs of the first edge in the run data store with the parsed values.

26. The non-transitory computer readable storage medium of claim 1, wherein at least one parameterized resource in the set of parameterized resources is associated with one or more properties, the one or more properties including one or more corresponding specification limits and wherein the corresponding output specification limit comprises an upper limit and a lower limit for the corresponding parameterized resource output.

27. The non-transitory computer readable storage medium of claim 1, wherein at least one parameterized resource in the set of parameterized resources is associated with one or more properties, the one or more properties including one or more corresponding specification limits and wherein the corresponding output specification limit comprises an enumerated list of allowable types.

28. The non-transitory computer readable storage medium of claim 1, wherein the one or more processes is a plurality of processes and a first process in the plurality of processes results in a first product and a second process in the plurality of processes results in a second product, wherein the first product is different than the second product.

29. The non-transitory computer readable storage medium of claim 1, wherein the non-transitory computer readable storage medium further comprises a genealogical graph showing a relationship between (i) versions of a single process in the one or more versions of a process or (ii) versions of two or more processes in the respective plurality of versions of two or more processes.

30. The non-transitory computer readable storage medium of claim 1, wherein the non-transitory computer readable storage medium further stores instructions for maintaining one or more interfaces, wherein each respective interface in the one or more interfaces acquires data for the run data store from one or more corresponding instruments.

31. The non-transitory computer readable storage medium of claim 30, wherein a respective interface in the one or more interfaces directs a corresponding instrument to acquire data for the run data store.

32. The non-transitory computer readable storage medium of claim 30, wherein a respective interface in the one or more interfaces directs a corresponding instrument to acquire values of input or output properties.

33. The non-transitory computer readable storage medium of claim 30, wherein a respective interface in the one or more interfaces acquires data for the run data store from one or more corresponding instruments across a network connection.

34. The non-transitory computer readable storage medium of claim 1, wherein the non-transitory computer readable storage medium further stores instructions for maintaining one or more interfaces for effecting process control, wherein each respective interface in the one or more interfaces controls one or more corresponding instruments associated with a process in the or more processes.

35. The non-transitory computer readable storage medium of claim 34, wherein a first interface in the one or more interfaces controls a first instrument through the specification of a process condition associated with the respective stage in the corresponding process.

36. The non-transitory computer readable storage medium of claim 1, wherein the first device is a single computer system, a plurality of networked computer systems, or a virtual machine.

37. The non-transitory computer readable storage medium of claim 1, wherein an edge in the plurality of edges is not associated with a set of parameterized resource inputs.

38. The non-transitory computer readable storage medium of claim 1, wherein an edge in the plurality of edges is not associated with a set of parameterized resource outputs.

39. The non-transitory computer readable storage medium of claim 1, wherein two or more edges in the plurality of edges are each associated with a corresponding set of parameterized resource inputs.

40. The non-transitory computer readable storage medium of claim 1, wherein two or more edges in the plurality of edges are each associated with a corresponding set of parameterized resource outputs.

41. A computer system, comprising:
one or more processors;
memory; and
one or more programs stored in the memory for execution by the one or more processors, the one or more programs comprising instructions for:
(A) maintaining a hypergraph data store comprising, for each respective process in a set of one or more processes, each process in the set of one or more processes resulting in a respective product or analytical information, a respective one or more versions of the respective process, each respective version comprising:
a hypergraph comprising a plurality of nodes connected by edges in a plurality of edges, wherein
each respective edge in the plurality of edges represents a respective stage in the corresponding process,
an edge in the plurality of edges is associated with
(i) a set of parameterized resource inputs to the corresponding stage in the corresponding process, and
(ii) a set of parameterized resource outputs to the corresponding stage in the corresponding process, and
each respective node in the plurality of nodes specifies that a set of parameterized resource outputs of an edge in the plurality of edges is included in a set of parameterized resource inputs of at least one other edge in the plurality of edges;
(B) maintaining a run data store, wherein the run data store comprises a plurality of process runs, each process run comprising (i) an identification of a version in the one or more versions for a process in the one or more processes, (ii) the respective set of parameterized resource inputs and outputs of the first edge in the hypergraph of the respective version, and (iii) values of at least one input or output property of a parameterized resource output in the respective set of parameterized resource outputs of each edge in the hypergraph of the respective version; and
(C) maintaining a statistics module that, responsive to receiving a query that identifies one or more first parameterized resource inputs and/or parameterized resource outputs, process runs, stages, nodes, edges, input properties, output properties, input specification limits of input properties, output specification limits of output properties and/or obtained values of input or output properties present in the run data store, formats the one or more first parameterized inputs and/or parameterized outputs, process runs, stages, nodes, edges, input properties, output properties, input specification limits of input properties, output specification limits of output properties and/or obtained values of input or output properties for analysis.

42. The computer system of claim 41, wherein the computer system is a single computer system, a plurality of networked computer systems, or a virtual machine.

43. A non-transitory computer readable storage medium for providing process design and analysis of one or more processes, each process in the one or more processes resulting in a respective product or analytical information, wherein the non-transitory computer readable storage medium stores instructions, which when executed by a first device, cause the first device to:
(A) maintain a hypergraph data store comprising, for each respective process in the one or more processes, a respective one or more versions of the respective process, each respective version comprising:
a hypergraph comprising a plurality of edges connected by nodes in a plurality of nodes, wherein
each respective edge in the plurality of edges represents a respective stage in the corresponding process, and
an edge in the plurality of edges is associated with one or more inputs and at least one output; and
each respective node in the plurality of nodes is associated with a corresponding set of parameterized resources and specifies that each respective parameterized resource in the corresponding set of parameterized resources is associated with at least a corresponding output of the at least one output of a first edge in the plurality of edges and also is associated with at least a corresponding input of at least one other edge in the plurality of edges;
(B) maintain a run data store, wherein the run data store comprises a plurality of process runs, each process run comprising (i) an identification of a version in the one or more versions for a process in the one or more processes, and (ii) values for the respective set of parameterized resources and their associated one or more properties corresponding to at least one node in the plurality of nodes in the hypergraph of the respective version and their associated one or more properties; and
(C) maintain a statistics module that, responsive to receiving a query that identifies one or more first parameterized resources, process runs, stages, nodes, edges, input properties, output properties, input specification limits of input properties, output specification limits of output properties and/or obtained values of input or output properties present in the run data store, formats the one or more first parameterized resources, process runs, stages, nodes, edges, input properties, output properties, input specification limits of input properties, output specification limits of output properties and/or obtained values of input or output properties for analysis.

44. The non-transitory computer readable storage medium of claim 43, wherein the query further identifies one or more second parameterized resources present in one or more runs in the run data store, wherein the instructions, which when executed by the first device, further cause the first device to:
correlate the one or more first parameterized resources and the one or more second parameterized resources; and
format, for presentation, a numerical measure of the correlation.

45. The non-transitory computer readable storage medium of claim 43, wherein the instructions, which when executed by the first device, further cause the first device to:
export the one or more first parameterized resources, process runs, stages, nodes, edges, input properties, output properties, input specification limits of input properties, output specification limits of output properties and/or obtained values of input or output properties for analysis to a second device.

46. The non-transitory computer readable storage medium of claim 43, wherein the instructions, which when executed by the first device, further cause the first device to:
(D) maintain a process evaluation module that generates an alert in the form of a computer data transmission when an obtained value for a property of a parameterized resource in a set of parameterized resources for a process run in the plurality of process runs is outside the corresponding specification limit.

47. The non-transitory computer readable storage medium of claim 43, wherein a first version and a second version in a respective plurality of versions for a process in the one or more processes differ from each other in a number of nodes, a number of edges, a process stage label of an edge, or a parameterized resource in a set of parameterized resources.

48. The non-transitory computer readable storage medium of claim 43, wherein the query further identifies one or more second parameterized resources present in one or more runs in the run data store, and wherein the statistics module further identifies a correlation between (i) the one or more first parameterized resources and (ii) the one or more second parameterized resources present in one or more process runs in the run data store from among all the parameterized resources present in the run data store using a multivariate analysis technique.

49. The non-transitory computer readable storage medium of claim 48, wherein the multivariate analysis comprises a feature selection technique.

50. The non-transitory computer readable storage medium of claim 49, wherein the feature selection technique is least angle regression.

51. The non-transitory computer readable storage medium of claim 50, wherein the correlation is computed across a plurality of parameterized resources present in the first and second sets.

52. The non-transitory computer readable storage medium of claim 49, wherein the feature selection technique is stepwise regression.

53. The non-transitory computer readable storage medium of claim 48, wherein the one or more processes is a plurality of processes and the correlation is identified from process runs in a subset of the plurality of processes.

54. The non-transitory computer readable storage medium of claim 48, wherein the one or more processes is a plurality of processes and the correlation is identified from process runs in a single process in the plurality of processes.

55. The non-transitory computer readable storage medium of claim 43, wherein the statistics module further provides suggested values for one or more second parameterized resources for an additional process run of a first process in the one or more processes, not present in the run data store, based on a prediction that the suggested values for the one or more second parameterized resources will alter a numerical attribute of the one or more process runs.

56. The non-transitory computer readable storage medium of claim 55, wherein the numerical attribute is a reduction in a variance in the one or more first parameterized resources exhibited across the one or more process runs.

57. The non-transitory computer readable storage medium of claim 55, wherein the query further identifies one or more third parameterized resources present in one or more runs in the run data store, and wherein the numerical attribute is a confidence in a correlation between the one or more first parameterized inputs resources and the one or more third parameterized resources.

58. The non-transitory computer readable storage medium of claim 43, wherein the one or more processes is a plurality of processes and the query further identifies a subset of the plurality of processes whose process runs are to be formatted by the statistics module.

59. The non-transitory computer readable storage medium of claim 43, wherein the one or more processes is a plurality of processes and the query further identifies a single process in the plurality of processes whose process runs are to be formatted by the statistics module.

60. The non-transitory computer readable storage medium of claim 43, wherein the query further identifies a subset of process runs in the one or more processes.

61. The non-transitory computer readable storage medium of claim 43, wherein the statistics module further identifies a correlation between (i) a first set comprising one or more process runs in the run data store and (ii) a second set comprising one or more process runs in the run data store, wherein process runs in the second set are not in the first set.

62. The non-transitory computer readable storage medium of claim 43, wherein the set of parameterized resources for a node in the plurality of nodes of a hypergraph for a process version in the respective one or more versions of the respective process comprises a first and second parameterized resource, the first parameterized resource specifying a first resource and is associated with a first property, and the second parameterized resource specifying a second resource and is associated with a second property, wherein the first property is different than the second property.

63. The non-transitory computer readable storage medium of claim 62, wherein the first input property is a viscosity value, a purity value, composition value, a temperature value, a weight value, a mass value, a volume value, or a batch identifier of the first resource.

64. The non-transitory computer readable storage medium of claim 62, wherein the first resource is a single resource or a composite resource.

65. The non-transitory computer readable storage medium of claim 43, wherein the set of parameterized resources for a first node in the plurality of nodes of a hypergraph of a process version in the respective one or more versions of the respective process comprises a first parameterized resource, the first parameterized resource specifying a process condition associated with the corresponding stage of the process associated with the corresponding first edge.

66. The non-transitory computer readable storage medium of claim 65, wherein the process condition comprises a temperature, an exposure time, a mixing time, a type of equipment, or a batch identifier.

67. The non-transitory computer readable storage medium of claim 43, wherein the instructions further cause the first device to:
(D) execute a data driver for a respective process in the one or more processes, the data driver including:
instructions for receiving a dataset for the respective process;
instructions for parsing the dataset to thereby obtain (i) an identification of a process run in the run data store and (ii) property values associated with the respective set of parameterized resources of a first node in the hypergraph of the respective process for the process run; and
instructions for populating the property values of parameterized resources of the corresponding first node in the run data store with the parsed values.

68. The non-transitory computer readable storage medium of claim 43, wherein at least one parameterized resource in the set of parameterized resources is associated with one or more properties, the one or more properties including one or more corresponding specification limits and wherein a corresponding specification limit in the one or more corresponding specification limits comprises an upper limit and a lower limit for the corresponding parameterized resource.

69. The non-transitory computer readable storage medium of claim 43, wherein at least one parameterized resource in the set of parameterized resources is associated with one or more properties, the one or more properties including one or more corresponding specification limits and wherein the corresponding specification limit comprises an enumerated list of allowable types.

70. The non-transitory computer readable storage medium of claim 43, wherein the one or more processes is a plurality of processes and a first process in the plurality of processes results in a first product and a second process in the plurality of processes results in a second product, wherein the first product is different than the second product.

71. The non-transitory computer readable storage medium of claim 43, wherein the non-transitory computer readable storage medium further comprises a genealogical graph showing a relationship between (i) versions of a single process in the plurality of versions of a process or (ii) versions of two or more processes in the respective plurality of versions of two or more processes.

72. The non-transitory computer readable storage medium of claim 43, wherein the non-transitory computer readable storage medium further stores instructions for maintaining one or more interfaces, wherein each respective interface in the one or more interfaces acquires data for the run data store from one or more corresponding instruments.

73. The non-transitory computer readable storage medium of claim 72, wherein a respective interface in the one or more interfaces directs a corresponding instrument to acquire data for the run data store.

74. The non-transitory computer readable storage medium of claim 72, wherein a respective interface in the one or more interfaces directs a corresponding instrument to acquire values of input or output properties.

75. The non-transitory computer readable storage medium of claim 72, wherein a respective interface in the one or more interfaces acquires data for the run data store from one or more corresponding instruments across a network connection.

76. The non-transitory computer readable storage medium of claim 43, wherein the non-transitory computer readable storage medium further stores instructions for maintaining one or more interfaces for effecting process control, wherein each respective interface in the one or more interfaces controls one or more corresponding instruments associated with a process in the or more processes.

77. The non-transitory computer readable storage medium of claim 76, wherein a first interface in the one or more interfaces controls a first instrument through the specification of a process condition associated with the respective stage in the corresponding process.

78. The non-transitory computer readable storage medium of claim 43, wherein the first device is a single computer system, a plurality of networked computer systems, or a virtual machine.

79. The non-transitory computer readable storage medium of claim 43, wherein an edge in the plurality of edges is not associated with an input.

80. The non-transitory computer readable storage medium of claim 43, wherein an edge in the plurality of edges is not associated with an output.

81. The non-transitory computer readable storage medium of claim 43, wherein two or more edges in the plurality of edges are each associated with a corresponding one or more inputs.

82. The non-transitory computer readable storage medium of claim 43, wherein two or more edges in the plurality of edges are each associated with a corresponding at least one output.

83. A computer system, comprising:
one or more processors;
memory; and
one or more programs stored in the memory for execution by the one or more processors, the one or more programs comprising instructions for:
(A) maintaining a hypergraph data store comprising, for each respective process in a set of one or more processes, each process in the set of one or more processes resulting in a respective product or analytical information, a respective one or more versions of the respective process, each respective version comprising:
a hypergraph comprising a plurality of edges connected by nodes in a plurality of nodes, wherein
each respective edge in the plurality of edges represents a respective stage in the corresponding process,
an edge in the plurality of edges is associated with one or more inputs and at least one output; and
each respective node in the plurality of nodes is associated with a corresponding set of parameterized resources and specifies that each respective parameterized resource in the corresponding set of parametrized resources is associated with at least a corresponding output of a first edge in the plurality of edges and also is associated with at least a corresponding input of the one or more inputs of at least one other edge in the plurality of edges;
(B) maintaining a run data store, wherein the run data store comprises a plurality of process runs, each process run comprising (i) an identification of a version in the plurality of versions for a process in the one or more processes, and (ii) values for the respective set of parameterized resources and their associated one or more properties corresponding to at least one node in the plurality of nodes in the hypergraph of the respective version and their associated one or more properties; and
(C) maintaining a statistics module that, responsive to receiving a query that identifies one or more first parameterized resources, process runs, stages, nodes, edges, input properties, output properties, input specification limits of input properties, output specification limits of output properties and/or obtained values of input or output properties present in the run data store, formats the one or more first parameterized resources, process runs, stages, nodes, edges, input properties, output properties, input specification limits of input properties, output specification limits of output properties and/or obtained values of input or output properties for analysis.

84. The computer system of claim 83, wherein the computer system is a single computer system, a plurality of networked computer systems, or a virtual machine.

\* \* \* \* \*